(12) United States Patent
Kim et al.

(10) Patent No.: US 12,550,531 B2
(45) Date of Patent: Feb. 10, 2026

(54) LIGHT EMITTING DISPLAY DEVICE

(71) Applicant: Samsung Display Co., LTD., Yongin-si (KR)

(72) Inventors: Hyun Joon Kim, Yongin-si (KR); Bon-Yong Koo, Yongin-si (KR); Danwon Lim, Yongin-si (KR); Jaeyong Jang, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 382 days.

(21) Appl. No.: 18/227,610

(22) Filed: Jul. 28, 2023

(65) Prior Publication Data

US 2024/0138188 A1  Apr. 25, 2024
US 2024/0237403 A9  Jul. 11, 2024

(30) Foreign Application Priority Data

Oct. 20, 2022 (KR) .................. 10-2022-0135710

(51) Int. Cl.
*H01L 29/08* (2006.01)
*H10K 59/121* (2023.01)
*H10K 59/131* (2023.01)

(52) U.S. Cl.
CPC ..... *H10K 59/1213* (2023.02); *H10K 59/1216* (2023.02); *H10K 59/131* (2023.02)

(58) Field of Classification Search
CPC ............ H10K 59/1213; H10K 59/131; H10K 59/1216
USPC ........................................................ 257/40
See application file for complete search history.

(56) References Cited

U.S. PATENT DOCUMENTS

| 2016/0322450 A1* | 11/2016 | Lee | .................. H10K 10/88 |
| 2021/0359055 A1* | 11/2021 | Lee | .................. H10K 59/131 |
| 2022/0190078 A1* | 6/2022 | You | .................. H10K 59/1213 |

FOREIGN PATENT DOCUMENTS

| KR | 20200000853 A | 1/2020 |
| KR | 20210100785 A | 8/2021 |
| KR | 102298851 B1 | 9/2021 |
| KR | 20220030416 A | 3/2022 |

* cited by examiner

*Primary Examiner* — Phuc T Dang
(74) *Attorney, Agent, or Firm* — CANTOR COLBURN LLP

(57) ABSTRACT

A light emitting display device includes: a driving transistor including a driving gate electrode, and first and second electrodes; a storage capacitor including first and second storage electrodes; a second transistor including electrodes connected to a data line and the second storage electrode, respectively; a third transistor including electrodes connected to the second electrode of the driving transistor and the driving gate electrode, respectively; a hold capacitor including first and second hold electrodes connected to a first driving voltage line and the second storage electrode, respectively; and a ninth transistor including electrodes connected to the first driving voltage line and the first electrode of the driving transistor, respectively. The second storage and hold electrodes are integrally formed, the driving gate electrode and the first storage electrode are integrally formed, and the driving gate electrode, the second storage electrode, and the first hold electrode overlap each other.

20 Claims, 42 Drawing Sheets

LIGHT EMITTING DISPLAY DEVICE

This application claims priority to Korean Patent Application No. 10-2022-0135710, filed on Oct. 20, 2022, and all the benefits accruing therefrom under 35 U.S.C. § 119, the content of which in its entirety is herein incorporated by reference.

BACKGROUND

1. Field

The disclosure relates to a light emitting display device, and more particularly, to a light emitting display device in which display quality is improved by providing an additional capacitance.

2. Description of the Related Art

A display device is a device for displaying an image, and includes a liquid crystal display (LCD), an organic light emitting diode (OLED) display, and the like. The display device is used in various electronic devices such as a mobile phone, a navigation device, a digital camera, an electronic book, a portable game machine, various terminals, and the like.

A light emitting display device such as the OLED display may have a structure in which the display device is bent or folded using a flexible substrate.

SUMMARY

Embodiments are to enable high-frequency driving (or high-speed driving) and removing crosstalk or reducing power consumption during the high-frequency driving.

In embodiments, an image is displayed substantially uniform or constant regardless of a difference in a driving voltage even if the driving voltage is not constant for each position within a panel, thereby improving display quality.

In addition, embodiments are to provide a light emitting display device having a high resolution or a high number of pixels per inch.

In embodiment, low-frequency driving (or low-speed driving) is enabled and a luminance difference that may occur in a high gray level during the low-frequency driving is reduced.

A light emitting display device according to an embodiment includes: a light emitting diode including an anode; a driving transistor including a driving gate electrode, a first electrode, and a second electrode; a storage capacitor including a first storage electrode and a second storage electrode, where the first storage electrode is connected to the driving gate electrode; a second transistor including a gate electrode, a first electrode connected to a data line, and a second electrode connected to the second storage electrode; a third transistor including a gate electrode, a first electrode connected to the second electrode of the driving transistor, and a second electrode connected to the driving gate electrode; a hold capacitor including a first hold electrode connected to a first driving voltage line and a second hold electrode connected to the second storage electrode; and a ninth transistor including a gate electrode, a first electrode connected to the first driving voltage line, and a second electrode connected to the first electrode of the driving transistor. In such an embodiment, the second storage electrode and the second hold electrode are integrally formed as a single unitary and indivisible part, the driving gate electrode and the first storage electrode are integrally formed as a single unitary and indivisible part, and the driving gate electrode, the second storage electrode, and the first hold electrode overlap each other on a plane.

In an embodiment, an opening overlapping the driving gate electrode on the plane may be defined in the second storage electrode, and a first opening overlapping the second storage electrode on the plane and a second opening overlapping the opening of the second storage electrode on the plane may be defined in the first hold electrode.

In an embodiment, the light emitting display device may further include a fourth transistor including a gate electrode, a first electrode connected to a first initialization voltage line, and a second electrode connected to the driving gate electrode.

In an embodiment, the light emitting display device may further include a fifth transistor including a gate electrode, a first electrode connected to a reference voltage line, and a second electrode connected to the second storage electrode.

In an embodiment, the light emitting display device may further include: a first connection member connected to the second storage electrode, the second electrode of the second transistor, and the second electrode of the fifth transistor through the first opening of the first hold electrode; and a second connection member connected to the driving gate electrode, the second hold electrode of the third transistor, and the second electrode of the fourth transistor through the second opening of the first hold electrode and the opening of the second storage electrode.

In an embodiment, the light emitting display device may further include: a tenth transistor including a gate electrode, a first electrode connected to the second electrode of the second transistor and the second electrode of the fifth transistor, and a second electrode connected to the second storage electrode; and an eleventh transistor including a gate electrode, a first electrode connected to the second hold electrode of the third transistor and the second electrode of the fourth transistor, and a second electrode connected to the driving gate electrode.

In an embodiment, each of the driving transistor, the second transistor, the third transistor, the fourth transistor, the fifth transistor, and the ninth transistor may be a p-type transistor, and each of the tenth transistor and the eleventh transistor may be an n-type transistor.

In an embodiment, the light emitting display device may further include: an overlapping electrode overlapping the driving transistor on the plane; a first auxiliary electrode overlapping the tenth transistor on the plane; and a second auxiliary electrode overlapping the eleventh transistor on the plane.

In an embodiment, the gate electrode of the tenth transistor and the gate electrode of the eleventh transistor may be electrically connected to each other.

In an embodiment, the light emitting display device may further include an eighth transistor including a gate electrode, a first electrode connected to a bias voltage line, and a second electrode connected to the first electrode of the driving transistor.

In an embodiment, the light emitting display device may further include a sixth transistor including a gate electrode, a first electrode connected to the second electrode of the driving transistor, and a second electrode connected to the anode.

In an embodiment, the light emitting display device may further include a seventh transistor including a gate electrode, a first electrode connected to the first initialization voltage line or a second initialization voltage line, and a second electrode connected to the anode.

A light emitting display device according to an embodiment includes: a light emitting diode including an anode; a driving transistor including a driving gate electrode, a first electrode, and a second electrode; a storage capacitor including a first storage electrode and a second storage electrode, where the first storage electrode is connected to the driving gate electrode; a second transistor including a gate electrode, a first electrode connected to a data line, and a second electrode connected to the second storage electrode; a third transistor including a gate electrode, a first electrode connected to the second electrode of the driving transistor, and a second electrode connected to the driving gate electrode; a hold capacitor including a first hold electrode connected to a first driving voltage line and a second hold electrode connected to the second storage electrode; and a fifth transistor including a gate electrode, a first electrode connected to the first driving voltage line, and a second electrode connected to the second storage electrode. In such an embodiment, the second storage electrode and the second hold electrode are integrally formed as a single unitary and indivisible part, the driving gate electrode and the first storage electrode are integrally formed as a single unitary and indivisible part, and the driving gate electrode, the second storage electrode, and the first hold electrode overlap each other on a plane.

In an embodiment, an opening overlapping the driving gate electrode on the plane may be defined the second storage electrode, an opening having a larger area than the opening of the second storage electrode may be defined in the first hold electrode, and the opening of the first hold electrode may include a portion overlapping the second storage electrode and a portion overlapping the opening of the second storage electrode.

In an embodiment, the light emitting display device may further include a fourth transistor including a gate electrode, a first electrode connected to a first initialization voltage line, and a second electrode connected to the driving gate electrode.

In an embodiment, the light emitting display device may further include: a first connection member connected to the second storage electrode, the second electrode of the second transistor, and the second electrode of the fifth transistor through the opening of the first hold electrode; and a second connection member connected to the driving gate electrode, the second hold electrode of the third transistor, and the second electrode of the fourth transistor through the opening of the first hold electrode and the opening of the second storage electrode.

In an embodiment, the light emitting display device may further include a sixth transistor including a gate electrode, a first electrode connected to the second electrode of the driving transistor, and a second electrode connected to the anode.

In an embodiment, the light emitting display device may further include a seventh transistor including a gate electrode, a first electrode connected to the first initialization voltage line or a second initialization voltage line, and a second electrode connected to the anode.

In an embodiment, the light emitting display device may further include: a first overlapping electrode overlapping the driving transistor on the plane; a second overlapping electrode overlapping the second transistor; a third overlapping electrode overlapping the third transistor or the fourth transistor on the plane; and a fourth overlapping electrode overlapping the fifth transistor on the plane.

In an embodiment, the first overlapping electrode, the second overlapping electrode, the third overlapping electrode, and the fourth overlapping electrode may be connected to each other.

According to embodiments, an additional capacitor may be further provided in a pixel and two capacitors may be provided to overlap on a plane without increasing an area of a pixel to have a target capacitance value. Thus, the pixel with a relatively small area may be formed so that the light emitting display device having the high resolution or the high number of pixels per inch is manufactured.

According to embodiments, the additional capacitor may be further provided in the pixel so that a voltage of a gate electrode of a driving transistor is maintained. Thus, the luminance difference that may occur in the high gray level during the low-frequency driving (the low-speed driving) may be reduced, and crosstalk may be removed or power consumption may be reduced during the high-frequency driving (the high-speed driving).

According to embodiments, the low-frequency driving (the low-speed driving) may be possible by including a transistor for applying a bias voltage to the pixel.

According to embodiments, by separating a compensation section in which a threshold voltage of a driving transistor of the pixel is compensated and a writing section in which a data voltage of the pixel is written, the high-speed driving is possible by ensuring that a compensation time is not insufficient, and the voltage written in the writing section may reduce influence of the driving voltage so that a constant luminance is displayed even if the driving voltage is different according to the position within the panel.

Accordingly, in such embodiments, the display quality of the light emitting display device may be improved.

DETAILED DESCRIPTION

Figure 1:
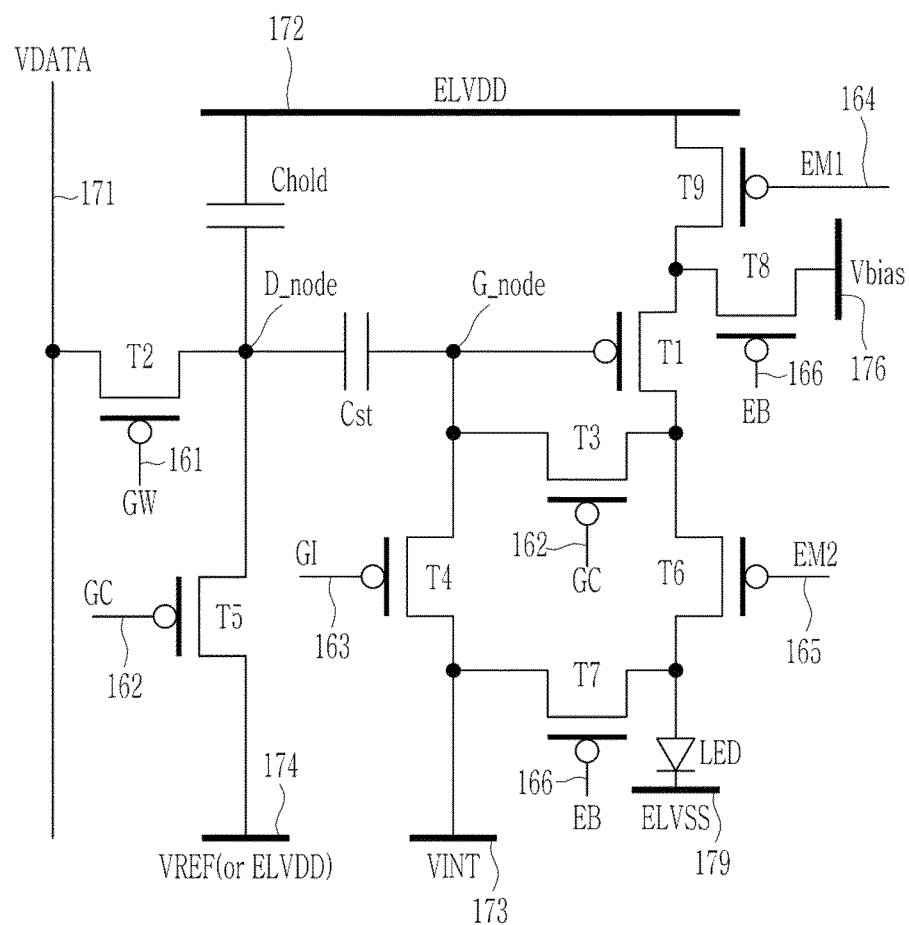
FIG. 1 is an equivalent circuit diagram of one pixel included in a light emitting display device according to an embodiment.

The invention now will be described more fully hereinafter with reference to the accompanying drawings, in which various embodiments of the disclosure are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

In order to clearly describe the present disclosure, parts or portions that are irrelevant to the description are omitted, and identical or similar constituent elements throughout the specification are denoted by the same reference numerals.

Further, in the drawings, the size and thickness of each element are arbitrarily illustrated for ease of description, and the present disclosure is not necessarily limited to those illustrated in the drawings. In the drawings, the thicknesses of layers, films, panels, regions, areas, etc., are exaggerated for clarity. In the drawings, for ease of description, the thicknesses of some layers and areas are exaggerated.

It will be understood that when an element such as a layer, film, region, area, substrate, plate, or constituent element is referred to as being "on" or "above" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Further, throughout the specification, the phrase "in a plan view" or "on a plane" means viewing a target portion from the top, and the phrase "in a cross-sectional view" or "on a cross-section" means viewing a cross-section formed by vertically cutting a target portion from the side.

In addition, throughout the specification, "connected" does not only mean when two or more elements are directly connected, but when two or more elements are indirectly connected through other elements, and when they are physically connected or electrically connected, and further, it may be referred to by different names depending on a position or function, and may also be referred to as a case in which respective parts that are substantially integrated are linked to each other.

In addition, throughout the specification, when it is said that an element such as a wire, layer, film, region, area, substrate, plate, or constituent element "is extended (or extends) in a first direction or second direction", this does not mean only a straight shape extending straight in the corresponding direction, but may mean a structure that substantially extends in the first direction or the second direction, is partially bent, has a zigzag structure, or extends while having a curved structure.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

In addition, an electronic device (for example, a mobile phone, a TV, a monitor, a laptop computer, or the like) included in a display device, a display panel, or the like described in the specification, or an electronic device included in a display device, a display panel, or the like manufactured by a manufacturing method described in the specification is not excluded from the scope of the present specification.

Hereinafter, a circuit structure of one pixel of a light emitting display device according to an embodiment will be described with reference to FIG. 1.

FIG. 1 is an equivalent circuit diagram of the one pixel included in the light emitting display device according to an embodiment.

Referring to FIG. 1, in an embodiment, the one pixel includes a light emitting diode LED and a pixel circuit portion for driving the LED, and the pixel circuit portion is disposed in a matrix form. In an embodiment, as shown in FIG. 1, the pixel circuit portion includes all elements other than the LED, and the pixel circuit portion of the pixel according to the embodiment includes a driving transistor T1, a second transistor T2, a third transistor T3, a fourth transistor T4, a fifth transistor T5, a sixth transistor T6, a seventh transistor T7, an eighth transistor T8, a ninth transistor T9, a storage capacitor Cst, and a hold capacitor Chold.

In an embodiment, a first scan line 161 to which a first scan signal GW is applied, a second scan line 162 to which a second scan signal GC is applied, a third scan line 163 to which a third scan signal GI is applied, light emitting signal lines 164 and 165 to which light emitting signals (or emission signals) EM1 and EM2 are applied, a fourth scan line 166 to which a fourth scan signal EB is applied, and a data line 171 to which a data voltage VDATA is applied may be connected to the pixel circuit portion. In addition, the pixel may be connected to a first driving voltage line 172 to which a driving voltage (hereinafter also referred to as a first driving voltage) ELVDD is applied, a second driving voltage line 179 to which a driving low voltage (hereinafter also referred to as a second driving voltage) ELVSS is applied, a first initialization voltage line 173 to which a first initialization voltage VINT is applied, a reference voltage line 174 to which a reference voltage VREF is applied, and a bias voltage line 176 to which a bias voltage Vbias is applied.

A structure of the pixel will be described below focusing on each element (e.g., the transistor, the capacitor, or the light emitting diode) included in the pixel.

The driving transistor (hereinafter also referred to as a first transistor) T1 includes a gate electrode (hereinafter also referred to as a driving gate electrode) connected to a first electrode of the storage capacitor Cst, a first electrode (or an input side electrode) connected to the driving voltage line 172 through the ninth transistor T9, and a second electrode (or an output side electrode) that output an electric current in response to a voltage of the driving gate electrode.

The driving gate electrode of the driving transistor T1 is connected to a second electrode (or an output side electrode) of the third transistor T3 and the first electrode of the storage capacitor Cst. Here, a node to which the first electrode of the storage capacitor Cst, the driving gate electrode, and the second electrode of the third transistor T3 are connected is referred to as a gate node G_node. The first electrode of the driving transistor T1 is connected to a second electrode (an output side electrode) of the ninth transistor T9 and a second electrode (an output side electrode) of the eighth transistor T8 to receive the driving voltage ELVDD and/or the bias voltage Vbias, and the second electrode of the driving transistor T1 is connected to a first electrode (an input side electrode) of the third transistor T3 and a first electrode (an input side electrode) of the sixth transistor T6. An output current (or an output electric current) of the driving transistor T1 passes through the sixth transistor T6 and is transferred to the light emitting diode LED so that the light emitting diode LED emits light. Luminance of light emitted from the light emitting diode LED is determined based on a magnitude of the output current of the driving transistor T1. On the one hand, the driving transistor T1 may further include an overlapping electrode (see BML of FIG. 28) overlapping at least a portion (e.g., a channel) of a semiconductor (e.g., a polycrystalline semiconductor) thereof.

The second transistor (hereinafter also referred to as a data input transistor) T2 includes a gate electrode connected to the first scan line 161 to which the first scan signal GW is applied, a first electrode (an input side electrode) connected to the data line 171 to which the data voltage VDATA is applied, and a second electrode (an output side electrode) connected to a second electrode of the fifth transistor T5, a second electrode of the storage capacitor Cst, and a second electrode (an output side electrode) of the hold capacitor Chold. Here, since a node to which the second electrode of the storage capacitor Cst and the second electrode of the hold capacitor Chold are connected is a node to which the data voltage VDATA is transferred, the node is also referred to as a data node D_node hereinafter. The second transistor T2 inputs the data voltage VDATA into the pixel in response to the first scan signal GW, and stores the data voltage VDATA in the second electrode of the storage capacitor Cst that is the data node D_node.

The third transistor (hereinafter also referred to as a first compensation transistor) T3 includes a gate electrode connected to the second scan line 162 to which the second scan signal GC is applied, a first electrode (an input side electrode) connected to the second electrode of the driving transistor T1 and the first electrode of the sixth transistor T6, and a second electrode (an output side electrode) connected to the gate electrode of the driving transistor T1 and the first electrode of the storage capacitor Cst. The third transistor T3 forms a compensation path that compensates for a threshold voltage of the driving transistor T1 so that the threshold voltage of the driving transistor T1 is stored in the first electrode of the storage capacitor Cst to compensate for the threshold voltage of the driving transistor T1. As a result, even if the threshold voltage of the driving transistor T1 included in each pixel is different, the driving transistor T1 may output a constant output current corresponding to an applied data voltage VDATA.

The fourth transistor (hereinafter also referred to as a first initialization transistor) T4 includes a gate electrode connected to the third scan line 163 to which the third scan signal GI is applied, a first electrode connected to the first initialization voltage line 173 that delivers (or transfers) the first initialization voltage VINT, and a second electrode connected to the second electrode of the third transistor T3, the gate electrode of the driving transistor T1, and the first electrode of the storage capacitor Cst. The fourth transistor T4 transfers the first initialization voltage VINT within the pixel to serve to initialize each of the second electrode of the third transistor T3, the gate electrode of the driving transistor T1, and the first electrode of the storage capacitor Cst with the first initialization voltage VINT.

The fifth transistor (hereinafter also referred to as a data node initialization transistor) T5 includes a gate electrode connected to the second scan line 162 to which the second scan signal GC is applied, a first electrode connected to the reference voltage line 174 that delivers (or transfers) the reference voltage VREF, and a second electrode connected to the second electrode of the second transistor T2 that is the data node D_node, the second electrode of the storage capacitor Cst, and the second electrode of the hold capacitor Chold. The fifth transistor T5 serves to initialize the second electrode of the storage capacitor Cst and the second electrode of the hold capacitor Chold by changing a voltage of each of the second electrode of the storage capacitor Cst and the second electrode of the hold capacitor Chold to the reference voltage VREF. In an alternative embodiment, the driving voltage ELVDD may be applied to the first electrode of the fifth transistor T5 instead of the reference voltage VREF.

The sixth transistor (hereinafter also referred to as a current transfer transistor) T6 includes a gate electrode connected to the second light emitting signal line 165 to which the second light emitting signal EM2 is applied, a first electrode (an input side electrode) connected to the second electrode of the driving transistor T1 and the first electrode of the third transistor T3, and a second electrode (an output side electrode) connected to an anode of the light emitting diode LED and a second electrode of the seventh transistor T7. The sixth transistor T6 serves to transmit or block the output current of the driving transistor T1 to or from the light emitting diode LED based on the second light emitting signal EM2.

The seventh transistor (hereinafter also referred to as an anode initialization transistor) T7 includes a gate electrode connected to the fourth scan line 166 to which the fourth scan signal EB is applied, a first electrode connected to the first initialization voltage line 173 that delivers (or delivers) the first initialization voltage VINT, and a second electrode connected to the anode of the light emitting diode LED and the second electrode of the sixth transistor T6. The seventh transistor T7 serves to initialize the anode of the light emitting diode LED with the first initialization voltage VINT. In an embodiment, the seventh transistor T7 may be an oxide transistor including an oxide semiconductor, and may be formed as an n-type transistor to be turned on by a high level voltage and to be turned off by a low level voltage. In addition, in an embodiment, the gate electrode of the seventh transistor T7 may be connected to a separate signal line instead of the fourth scan line 166, and for example, the separate signal line may be one of the light emitting signal lines 164 and 165 to which the light emitting signals EM1 and EM2 are applied.

The eighth transistor (hereinafter also referred to as a bias transistor) T8 includes a gate electrode connected to the fourth scan line 166 to which the fourth scan signal EB is applied, a first electrode connected to the bias voltage line 176 that transfers the bias voltage Vbias, and a second electrode connected to the first electrode of the driving transistor T1 and the second electrode of the ninth transistor T9. The eighth transistor T8 may transfer the bias voltage Vbias to the first electrode of the driving transistor T1 so that a characteristic of the driving transistor T1 is maintained constant. For example, when the bias voltage Vbias is transferred to the first electrode of the driving transistor T1, an output current may be constantly generated with a previously received data voltage VDATA even if the driving transistor T1 does not receive a separate data voltage VDATA. This operation may serve to maintain the characteristic of the driving transistor T1 during high-speed driving or low-speed driving.

The ninth transistor (hereinafter also referred to as a driving voltage transfer transistor) T9 includes a gate electrode connected to the first light emitting signal line 164 to which the first light emitting signal EM1 is applied, a first electrode (an input side electrode) connected to the first driving voltage line 172 that delivers (or delivers) the driving voltage ELVDD, and a second electrode (an output side electrode) connected to the first electrode of the driving transistor T1 and the second electrode of the eighth transistor T8. The ninth transistor T9 may transfer the driving voltage ELVDD to the first electrode of the driving transistor T1 so that the driving transistor T1 generates an electric current.

In an embodiment, as show in FIG. 1, all transistors may be formed as (or defined by) p-type transistors formed using a polycrystalline semiconductor, and the p-type transistor, which is a polycrystalline transistor, may be turned on by a low level voltage and may be turned off by a high level voltage. In an embodiment, all or some of the transistors may be formed as n-type transistors formed using an oxide semiconductor, and in an embodiment, the seventh transistor T7 may be an n-type transistor including an oxide semiconductor, and may be turned on by a high level voltage and may be turned off by a low level voltage.

The storage capacitor (hereinafter also referred to as a voltage transfer capacitor or a first capacitor) Cst includes the first electrode (hereinafter also referred to as a first storage electrode) connected to the gate electrode of the driving transistor T1 and the second electrode of the third transistor T3 that are the gate node G_node, and the second electrode (hereinafter also referred to as a second storage electrode) connected to the second electrode of the second transistor T2, the second electrode of the fifth transistor T5, and the second electrode of the hold capacitor Chold that are the data node D_node. The storage capacitor Cst receives the data voltage VDATA through the second transistor T2 or the reference voltage VREF through the fifth transistor T5 to serve to change a voltage of the gate electrode of the driving transistor T1 and to maintain the received voltage until a next voltage is transferred. In an embodiment of the pixel, the data voltage VDATA is not directly transferred to the gate electrode of the driving transistor T1 but transferred through the storage capacitor Cst. This is a method of indirectly transferring the data voltage VDATA to the gate electrode of the driving transistor T1 based on a fact that when a voltage of the second electrode of the storage capacitor Cst suddenly rises, a voltage of the first electrode of the storage capacitor, which is another electrode, also rises. According to this method, even if leakage of at least one transistor (e.g., the second transistor T2 or the like) included in the pixel occurs, a voltage of the gate electrode of the driving transistor T1 does not leak directly so that the leakage effect is small. In addition, in an embodiment, the data voltage VDATA passes through the storage capacitor Cst without passing through another electrode of the driving transistor T1 and is directly transferred to the gate electrode of the driving transistor T1 so that a voltage stored in the storage capacitor Cst is determined without being affected by a difference in the driving voltage ELVDD even if there is the difference in the driving voltage ELVDD according to a position of the pixel.

The hold capacitor Chold (hereinafter also referred to as a second capacitor) includes a first electrode (hereinafter also referred to as a first hold electrode) to which the driving voltage ELVDD is applied, and the second electrode (hereinafter also referred to as a second hold electrode) connected to the second electrode of the storage capacitor Cst, the second electrode of the second transistor T2, and the second electrode of the fifth transistor T5 that are the data node D_node, and serves to keep a voltage of the second electrode of the storage capacitor Cst that is a voltage of the data node D_node constant. That is, by the hold capacitor Chold, the voltage of the second electrode of the storage capacitor Cst that is the data node D_node does not fluctuate and has a constant voltage even when a peripheral signal fluctuates.

The light emitting diode LED includes the anode connected to the second electrode of the sixth transistor T6 and the second electrode of the seventh transistor T7, and a cathode connected to the second driving voltage line 179 to which the driving low voltage ELVSS is applied. The light emitting diode LED may be disposed between the pixel circuit portion and the driving low voltage ELVSS to emit light with luminance corresponding to a current supplied from the pixel circuit portion (e.g., the driving transistor T1). The light emitting diode LED may include a light emitting layer including at least one selected from an organic light emitting material and an inorganic light emitting material. A hole and an electron are respectively injected into the light emitting layer from the anode and the cathode, and light is emitted when an exciton that is a combination of the injected holes and electrons falls from an excited state to a ground state. The light emitting diode LED may emit light of one of primary colors or white light. Examples of the primary colors include three primary colors of red, green, and blue. Other examples of primary colors include yellow, cyan, magenta, and the like. In an embodiment, a color display characteristic may be improved by further including an additional color filter or a color conversion layer.

In the pixel according to an embodiment, as shown in FIG. 1, one transistor (the second transistor T2) and the storage capacitor Cst are disposed at a path (hereinafter also referred to as a data voltage transfer path) through which the data voltage VDATA is transferred to the driving gate electrode. In such an embodiment, the storage capacitor Cst is disposed between the driving gate electrode of the driving transistor T1 and the second transistor T2. In such an embodiment, the data voltage VDATA is not directly transferred to the driving gate electrode of the driving transistor T1, but is transferred to the second storage electrode of the storage capacitor Cst. When a voltage of the second storage electrode is changed while the data voltage VDATA is applied to the second storage electrode, the data voltage VDATA is indirectly transferred while a voltage of the first storage electrode and a voltage of the driving gate electrode are changed. In addition, in the pixel according to an embodiment, as shown in FIG. 1, one transistor (the third transistor T3) is formed or provided in the compensation path that compensates for the threshold voltage of the driving transistor T1.

The pixel according to an embodiment, as shown in FIG. 1, further includes the hold capacitor Chold in addition to the storage capacitor Cst to keep the voltage of the data node D_node that is the data voltage VDATA input to the pixel more constant. Referring to FIGS. 2 to 11 described later, the driving gate electrode of the driving transistor T1, the storage capacitor Cst, and the hold capacitor Chold may be formed to overlap each other on a plane or in a plan view in a thickness direction of the light emitting display device.

In the above description, the circuit structure of the pixel has been described.

Hereinafter, a planar structure of the pixel circuit portion of the pixel according to an embodiment will be described in detail through FIGS. 2 to 10, and a cross-sectional structure of the pixel circuit portion will also be described through FIG. 11 together with FIGS. 2 to 10.

First, while referring to FIG. 11, the planar structure of the pixel circuit portion is mainly described through FIGS. 2 to 10, and in FIGS. 2 to 10 described later, the light emitting diode LED is not shown, and a structure of the pixel circuit portion disposed at a lower portion of the light emitting diode LED is mainly shown.

Figure 9:
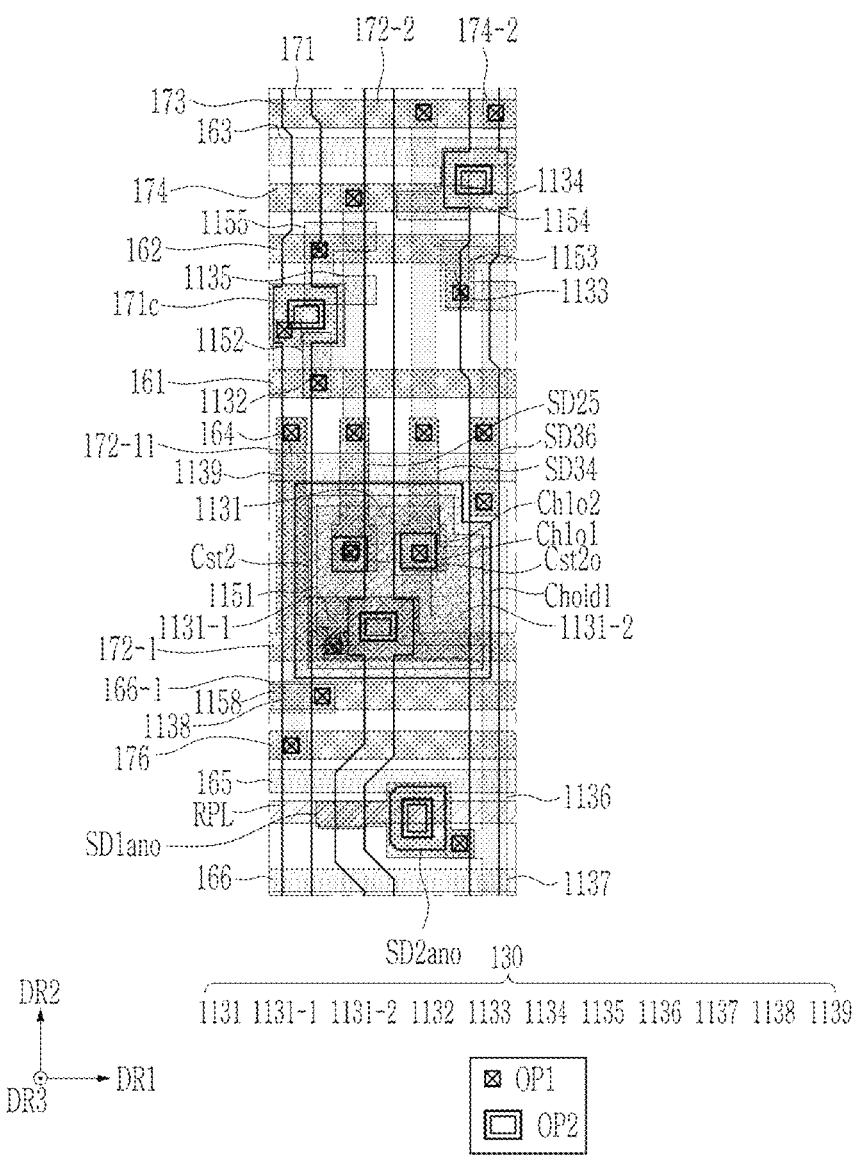
Figure 10:
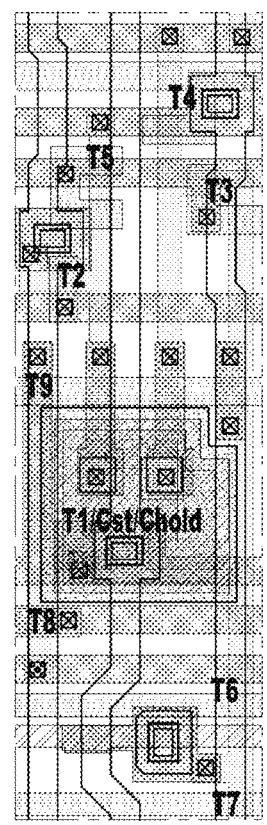
Figure 10:
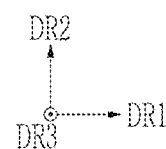
Figure 11:
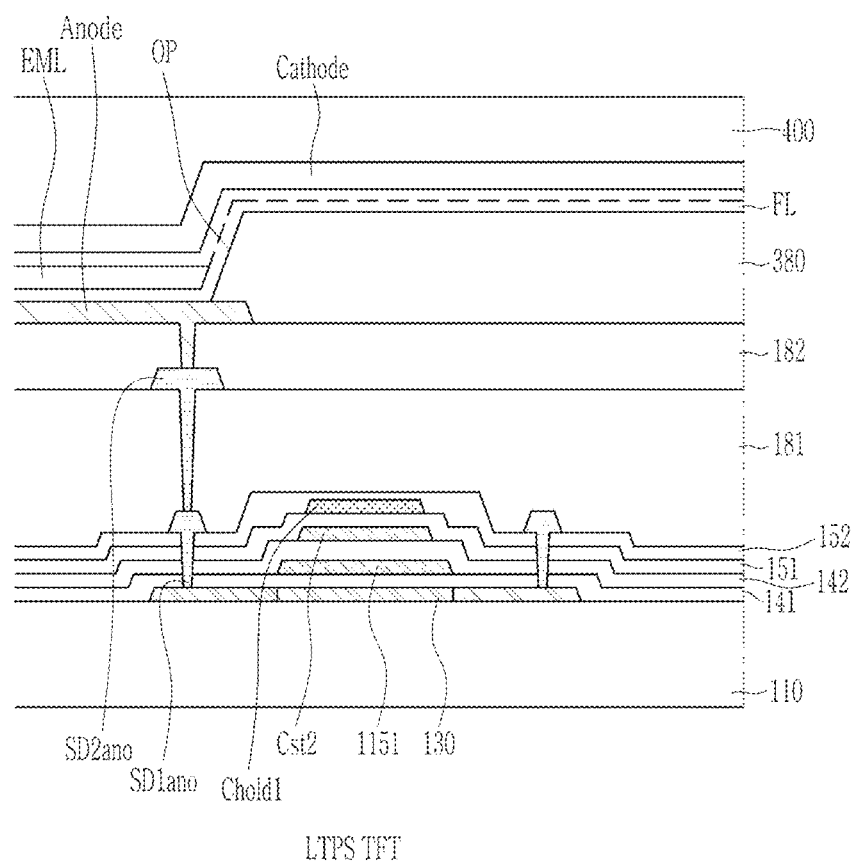
FIG. 11 is a cross-sectional view of the light emitting display device according to an embodiment.

FIGS. 2 to 10 are views illustrating, in detail, a structure of each layer according to a manufacturing order of a lower panel layer of the light emitting display device of FIG. 11.

Figure 2:
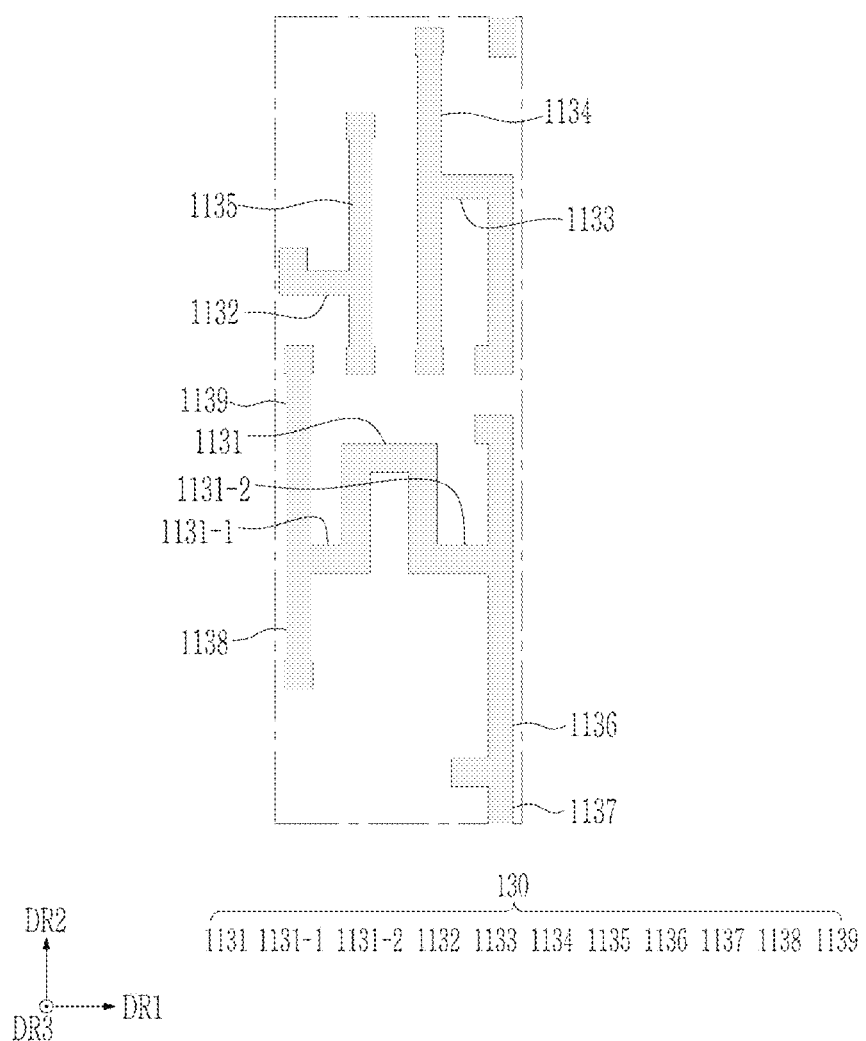
FIGS. 2 to 10 are views illustrating, in detail, a structure of each layer according to a manufacturing order of a lower panel layer of the light emitting display device of FIG. 1.

First, referring to FIG. 2, a first semiconductor layer 130 including or formed of a silicon semiconductor (e.g., a polycrystalline semiconductor) is disposed on a substrate 110 (see FIG. 11).

The substrate 110 may include a rigid material such as glass or the like that does not bend, or may include a flexible material such as plastic or polyimide that may bend. The flexible substrate may have a structure in which a double-layered structure including polyimide and a barrier layer including or formed of an inorganic insulating material on the polyimide is formed twice.

In an embodiment, a buffer layer (see 111 of FIG. 28) covering the overlapping electrode (see BML of FIG. 28) may be further disposed on the overlapping electrode between the substrate 110 and the first semiconductor layer 130.

The first semiconductor layer 130 includes a channel 1131, a first region 1131-1, and a second region 1131-2 of the driving transistor T1. In addition, the first semiconductor layer 130 includes not only the channel of the driving transistor T1 but also channels of the second transistor T2, the fifth transistor T5, the sixth transistor T6, the seventh transistor T7, the eighth transistor T8, and the ninth transistor T9, and includes portions 1132, 1133, 1134, 1135, 1136, 1137, 1138, and 1139 serving as the first and second electrodes (or regions) having a conductive layer characteristic by plasma treatment or doping at opposing sides of each channel.

The channel 1131 of the driving transistor T1 may have a shape bent in an inverted U shape on a plane or in a plan view (or when viewed) in the thickness direction of the lower panel layer of the light emitting display device. However, a shape of the channel 1131 of the driving transistor T1 is not limited thereto, and may be variously changed. For example, the channel 1131 of the driving transistor T1 may be bent in various other shapes such as an S shape and the like, or may be formed in a rod shape. The first region 1131-1 and the second region 1131-2 of the driving transistor T1 may be disposed at opposing sides of the channel 1131 of the driving transistor T1. The first region 1131-1 and the second region 1131-2 disposed at the first semiconductor layer serve as the first and second electrodes of the driving transistor T1.

A semiconductor 1139 that is disposed at a portion extending upward (in a second direction DR2) from the first region 1131-1 of the driving transistor T1 and serves as the channel, the first electrode, and the second electrode of the ninth transistor T9, and a semiconductor 1138 that is disposed at a portion extending downward (in a direction opposite to the second direction DR2) from the first region 1131-1 of the driving transistor T1 and serves as the channel, the first electrode, and the second electrode of the eighth transistor T8, is disposed at (or defined by portions of) the first semiconductor layer 130. The semiconductor 1138 of the eighth transistor T8 is disposed to extend upward from the first region 1131-1 of the driving transistor T1 and then to be bent in the direction opposite to the second direction DR2. The semiconductor 1139 of the ninth transistor T9 is disposed to pass through the semiconductor 1138 of the eighth transistor T8 while extending upward from the first region 1131-1 of the driving transistor T1. Here, a third direction DR3 which perpendicular to the first direction DR1 and the second direction DR2 may be the thickness direction of the lower panel layer of the light emitting display device, or a thickness direction of the substrate 110.

At the first semiconductor layer 130, a portion extending upward (in the second direction DR2) from the second region 1131-2 of the driving transistor T1 and a portion extending downward (in the direction opposite to the second direction DR2) from the second region 1131-2 of the driving transistor T1 are connected to each other.

At the first semiconductor layer 130, the semiconductor 1136 of the sixth transistor T6 is disposed at a portion extending downward (in the direction opposite to the second direction DR2) from the second region 1131-2 of the driving transistor T1, and the semiconductor 1137 of the seventh transistor T7 is disposed at the portion extending downward from the second region 1131-2 of the driving transistor T1.

The portion extending upward (in the second direction DR2) from the second region 1131-2 of the driving transistor T1 in the first semiconductor layer 130 is formed to protrude to be connected to the semiconductor 1133 of the third transistor T3 through a subsequent process.

In an embodiment, the first semiconductor layer 130 further includes two separate semiconductors, where the semiconductor 1132 of the second transistor T2 and the semiconductor 1135 of the fifth transistor T5 are disposed at one semiconductor of the two separate semiconductors, and the semiconductor 1133 of the third transistor T3 and the semiconductor 1134 of the fourth transistor are disposed at the other semiconductor of the two separate semiconductors.

The semiconductor 1132 of the second transistor T2 and the semiconductor 1135 of the fifth transistor T5 may be disposed upward (in the second direction DR2) from the semiconductor 1139 of the ninth transistor T9, and the semiconductor 1133 of the third transistor T3 and the semiconductor 1134 of the fourth transistor may be disposed at a portion extending upward (in the second direction DR2) from the second region 1131-2 of the driving transistor T1.

Referring to FIG. 11, a first gate insulating film 141 may be disposed on the first semiconductor layer 130 including the channel 1131, the first region 1131-1, the second region 1131-2, and the like of the driving transistor T1.

In an embodiment, the first gate insulating film 141 may be disposed on entire surfaces of the first semiconductor layer 130 and the substrate 110. In an alternative embodiment, the first gate insulating film 141 may not be disposed on the entire surfaces of the first semiconductor layer 130 and the substrate 110, but may be disposed only on a partial area of the entire surfaces of the first semiconductor layer 130 and the substrate 110. In such an embodiment, for example, the first gate insulating film 141 may overlap the channel of each transistor of the first semiconductor layer 130, but may have a structure that does not overlap the first region and the second region disposed at opposing sides of the channel.

The first gate insulating film 141 may be an inorganic insulating film including a silicon oxide ($SiO_x$), a silicon nitride ($SiN_x$), a silicon oxynitride ($SiO_xN_y$), or the like.

Figure 3:
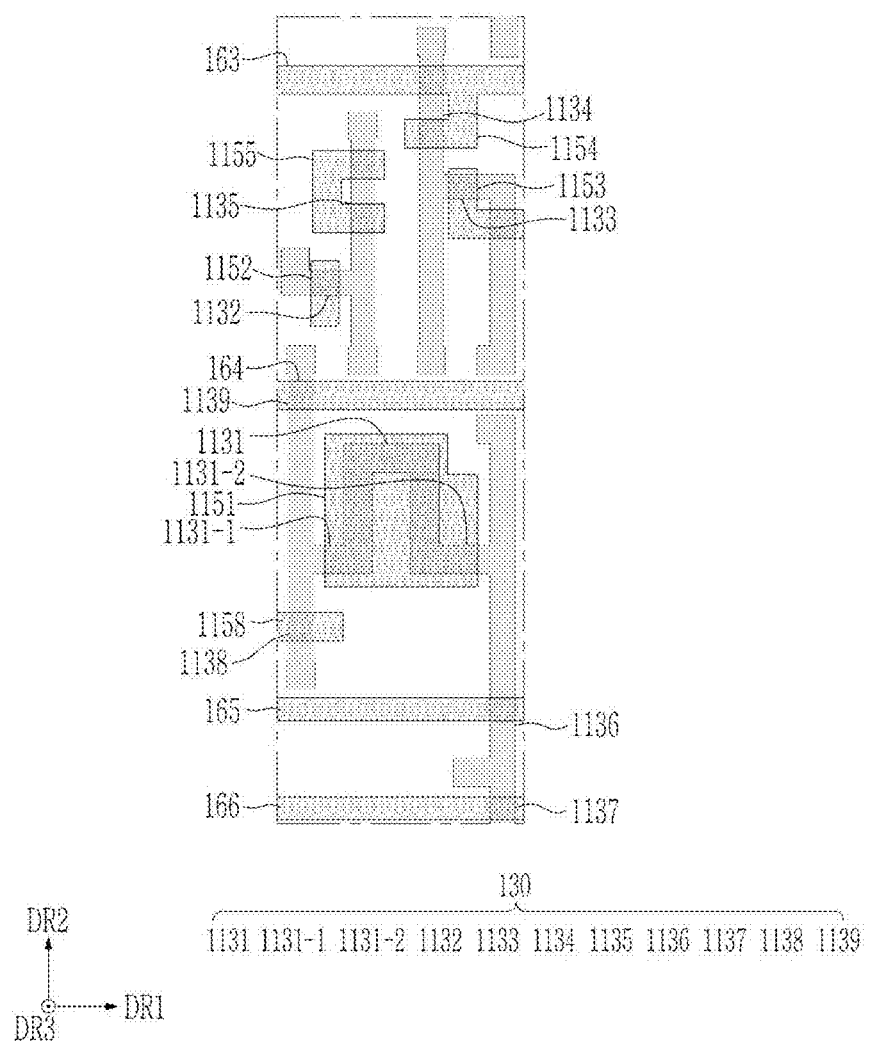

Referring to FIG. 3, a first gate conductive layer including the driving gate electrode 1151 of the driving transistor T1 may be disposed above or on the first gate insulating film 141. The first gate conductive layer may include not only the driving gate electrode 1151 of the driving transistor T1, but also the third scan line 163 to which the third scan signal GI is applied, the light emitting signal lines 164 and 165 to which the light emitting signals EM1 and EM2 are applied, the fourth scan line 166 to which the fourth scan signal EB is applied, a gate electrode 1152 of the second transistor T2, a gate electrode 1153 of the third transistor T3, a gate electrode 1155 of the fifth transistor T5, and a gate electrode 1158 of the eighth transistor T8. Here, the third scan line 163 may include a protrusion, and the protrusion may constitute a gate electrode 1154 of the fourth transistor T4.

Referring to FIG. 3, each of the driving gate electrode 1151 of the driving transistor T1, the gate electrode 1152 of the second transistor T2, the gate electrode 1153 of the third transistor T3, the gate electrode 1155 of the fifth transistor T5, and the gate electrode 1158 of the eighth transistor T8 is formed in an island structure, and a portion of each of the driving gate electrode 1151 of the driving transistor T1, the gate electrode 1152 of the second transistor T2, the gate electrode 1153 of the third transistor T3, the gate electrode 1155 of the fifth transistor T5, and the gate electrode 1158 of the eighth transistor T8 overlapping a corresponding (or respective) one of the semiconductors 1131, 1132, 1133, 1135, and 1138 of the first semiconductor layer 130 constitutes the gate electrode of a corresponding one of the transistors T1, T2, T3, T5, and T8.

In addition, a portion of each of the third scan line 163, the light emitting signal lines 164 and 165, and the fourth scan line 166 extending in a first direction DR1 in the first gate conductive layer overlapping a corresponding one of the semiconductors 1134, 1136, 1137, and 1139 constitutes the gate electrode of a corresponding one of the transistors T4, T6, T7, and T9.

The first gate conductive layer may include a metal such as copper (Cu), molybdenum (Mo), aluminum (Al), titanium (Ti), or the like, or a metal alloy, and may include (be formed as or defined by) a single layer or multiple layers.

After the first gate conductive layer is formed, a plasma treatment or doping process may be performed on the formed first gate conductive layer to make a portion of the first semiconductor layer 130 that is not covered with the first gate conductive layer conductive. That is, the first semiconductor layer 130 covered by the first gate conductive layer may not be conductive, and the portion of the first semiconductor layer 130 not covered by the first gate conductive layer may have the same characteristic as that of a conductive layer.

Referring to FIG. 11, a second gate insulating film 142 may be disposed on the first gate conductive layer and the first gate insulating film 141. The second gate insulating film 142 may be an inorganic insulating film including a silicon oxide ($SiO_x$), a silicon nitride ($SiN_x$), a silicon oxynitride ($SiO_xN_y$), or the like.

Figure 4:
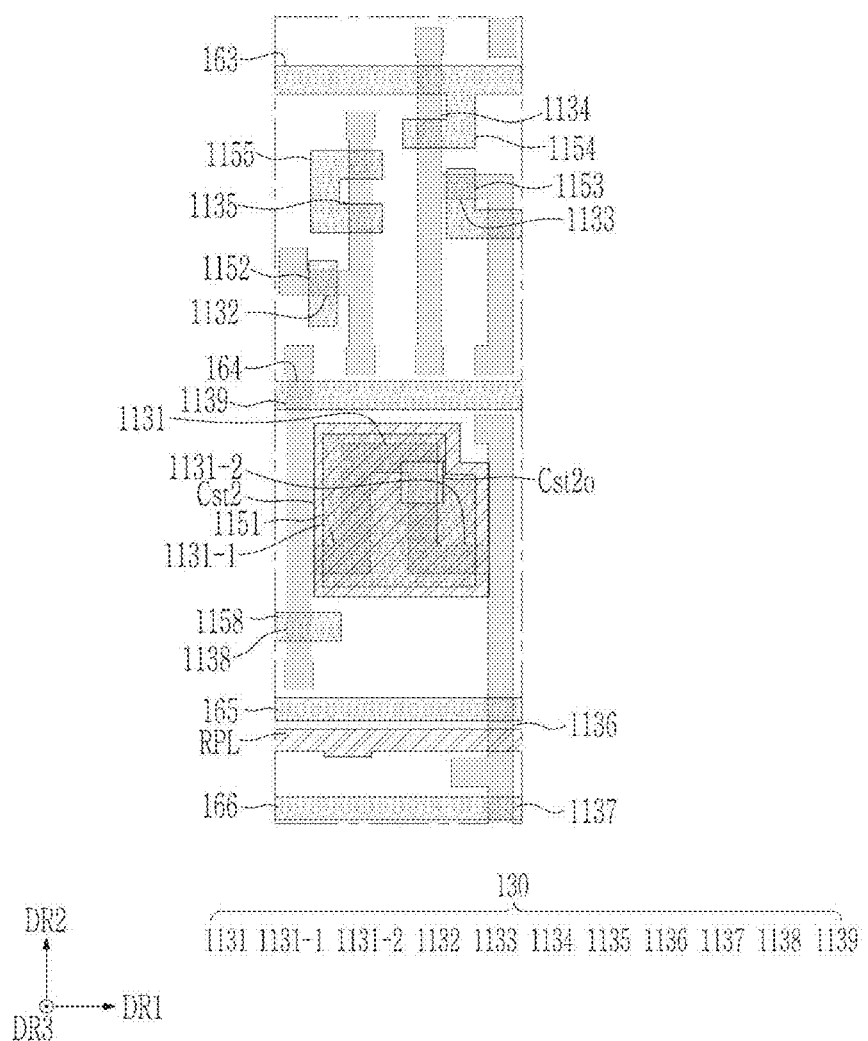

Referring to FIG. 4, a second gate conductive layer may be formed above or on the second gate insulating film 142. The second gate conductive layer includes a second storage electrode Cst2 of the storage capacitor Cst and a repair line RPL.

The second storage electrode Cst2 of the storage capacitor Cst has the same or similar shape as that of the driving gate electrode 1151 of the driving transistor T1. The second storage electrode Cst2 of the storage capacitor Cst includes an opening Cst2o overlapping a portion of the driving gate electrode 1151 of the driving transistor T1. The second gate insulating film 142 disposed between a cross-section of the second storage electrode Cst2 and a cross-section of the driving gate electrode 1151 of the driving transistor T1 is also formed with an opening at a portion corresponding to the opening Cst2o of the second storage electrode Cst2 so that the driving gate electrode 1151 of the driving transistor T1 may be exposed upward to be connected to an upper conductive layer. Here, the opening formed at the second gate insulating film 142 may be the same as an opening OP1 shown in FIG. 6, and may be formed in a process of forming the opening OP1 shown in FIG. 6. The driving gate electrode 1151 of the driving transistor T1 overlapping the second storage electrode Cst2 and the second gate insulating film 142 disposed between the driving gate electrode 1151 and the second storage electrode Cst2 form the storage capacitor Cst, and in this case, the driving gate electrode 1151 is the gate electrode of the driving transistor T1, and is also the first storage electrode of the storage capacitor Cst.

In addition, the repair line RPL extending in the first direction DR1 may also be formed, and the repair line RPL may be floating, but when a pixel is desired to be repaired, the repair line RPL may serve to transfer an electric current to an anode of the pixel subject to repair through a short circuit.

The second gate conductive layer may include a metal such as copper (Cu), molybdenum (Mo), aluminum (Al), titanium (Ti), or the like, or a metal alloy, and may include or be defined by a single layer or multiple layers.

Referring to FIG. 11, a first interlayer insulating film 151 may be disposed above or on the second gate conductive layer. The first interlayer insulating film 151 may include an inorganic insulating film (or an inorganic insulating material) including a silicon oxide ($SiO_x$), a silicon nitride ($SiN_x$), a silicon oxynitride ($SiO_xN_y$), or the like, and in an embodiment, the inorganic insulating film may be thickly formed. In an embodiment, the first interlayer insulating film 151 may include an organic material.

Figure 5:
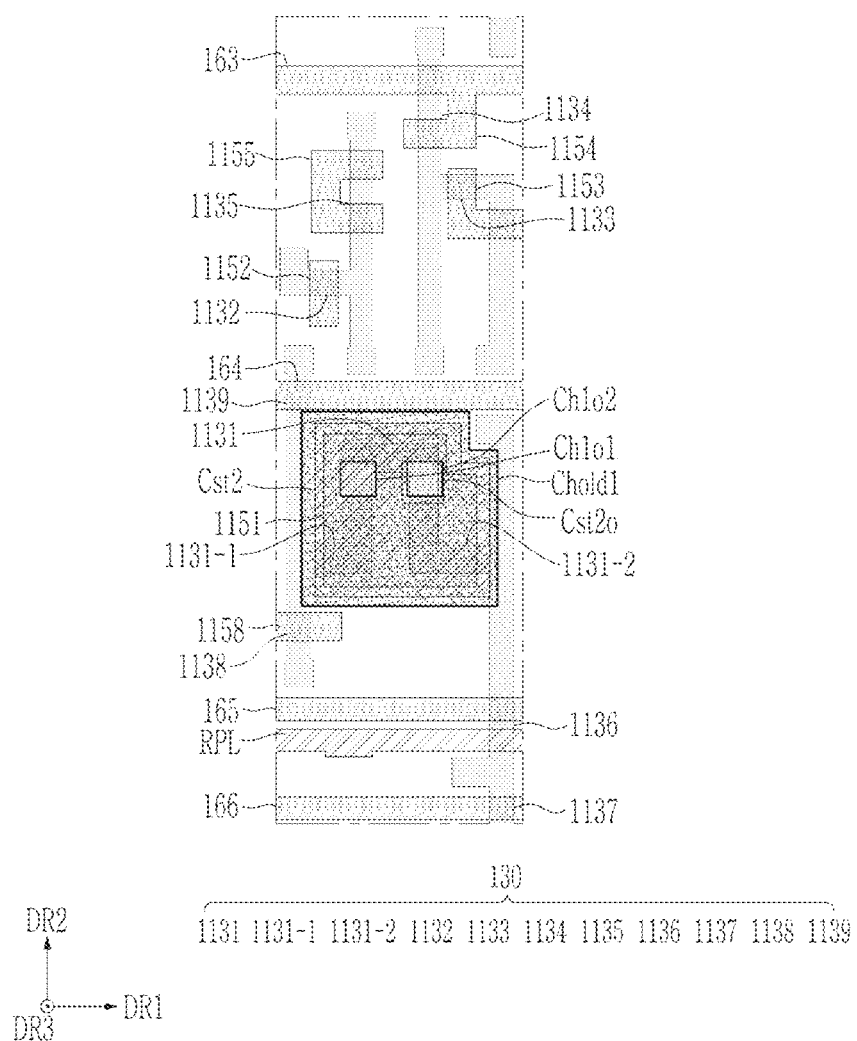

Referring to FIG. 5, an auxiliary conductive layer is formed above or on the first interlayer insulating film 151.

The auxiliary conductive layer includes a first hold electrode Chold1 of the hold capacitor Chold.

The first hold electrode Chold1 of the hold capacitor Chold overlaps the driving gate electrode 1151 of the driving transistor T1 and the second storage electrode Cst2 on a plane. In addition, the first hold electrode Chold1 may have the same or similar shape as that of the driving gate electrode 1151 of the driving transistor T1 and that of the second storage electrode Cst2.

In addition, the first hold electrode Chold1 is provided with two openings Ch1o1 and Ch1o2 defined or formed therein.

The first opening Ch1o1 overlaps a portion of the second storage electrode Cst2 so that the second storage electrode Cst2 may be exposed. The first interlayer insulating film 151 disposed between a cross-section of the first hold electrode Chold1 and a cross-section of the second storage electrode Cst2 is also formed with an opening at a portion corresponding to the first opening Ch1o1 of the first hold electrode Chold1 so that the second storage electrode Cst2 is exposed upward to be connected to an upper conductive layer. Here, the opening formed at the first interlayer insulating film 151 may be the same as the opening OP1 shown in FIG. 6, and may be formed in the process of forming the opening OP1 shown in FIG. 6.

The second opening Ch1o2 overlaps a portion of the driving gate electrode 1151 of the driving transistor T1 and the opening Cst2o of the second storage electrode Cst2. The first interlayer insulating film 151 disposed between a cross-section of the first hold electrode Chold1 and a cross-section of the second storage electrode Cst2 is also provided with an opening at a portion corresponding to the second opening Ch1o2 of the first hold electrode Chold1, so that along with the opening Cst2o of the second storage electrode Cst2 and the opening formed at the second gate insulating film 142, the driving gate electrode 1151 of the driving transistor T1 is exposed upward to be connected to an upper conductive layer. Here, the opening formed at the second gate insulating film 142 and the opening formed at the first interlayer insulating film 151 may be the same as the opening OP1 shown in FIG. 6, and may be formed in the process of forming the opening OP1 shown in FIG. 6.

In an embodiment, the second storage electrode Cst2 overlapping the first hold electrode Chold1 and the first interlayer insulating film 151 disposed between the second storage electrode Cst2 and the first hold electrode Chold1 form (or collectively define) the hold capacitor Chold, and in such an embodiment, the second storage electrode Cst2 is the second electrode of the storage capacitor Cst, and is also the second hold electrode of the hold capacitor Chold.

The auxiliary conductive layer may include a metal such as copper (Cu), molybdenum (Mo), aluminum (Al), titanium (Ti), or the like, or a metal alloy, and may include or be defined by a single layer or multiple layers.

Referring to FIG. 11, a second interlayer insulating film 152 may be disposed above or on the auxiliary conductive layer. The second interlayer insulating film 152 may include an inorganic insulating film (or an inorganic insulating material) including a silicon oxide ($SiO_x$), a silicon nitride ($SiN_x$), a silicon oxynitride ($SiO_xN_y$), or the like, and in an embodiment, the inorganic insulating film may be thickly formed. In an embodiment, the second interlayer insulating film 152 may include an organic material.

Figure 6:
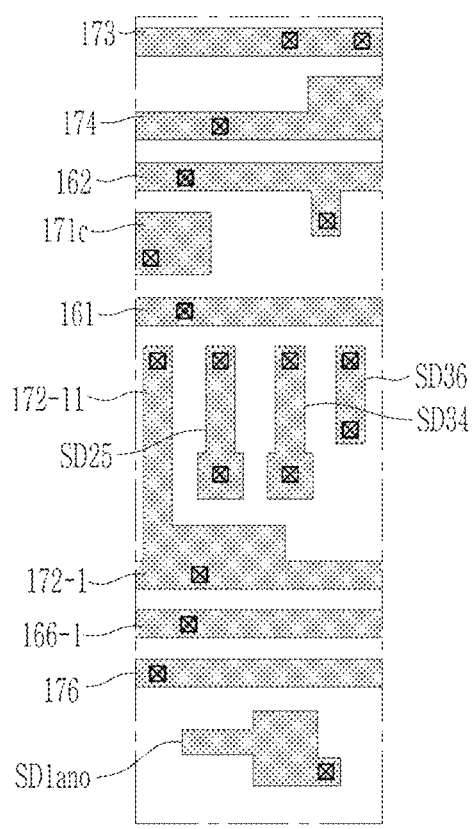
Figure 6:
Figure 7:
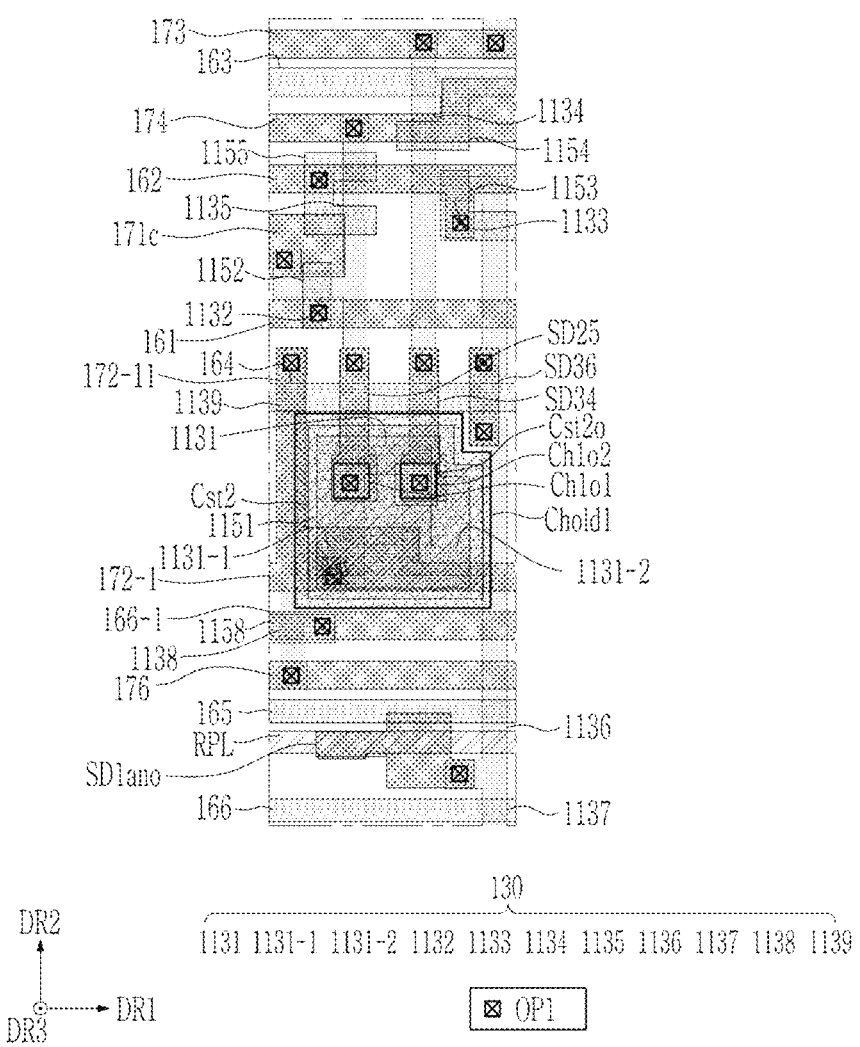

Referring to FIG. 6, after the second interlayer insulating film 152 is stacked, a process of forming a plurality of openings is performed. The opening OP1 formed at the second interlayer insulating film 152 and an insulating film below the second interlayer insulating film 152 and a first data conductive layer stacked after the formed opening OP1 are shown in FIG. 6. In FIG. 7, in addition to FIG. 5, the opening OP1 and the first data conductive layer of FIG. 6 are shown together. That is, FIG. 6 is a plan view illustrating only the first data conductive layer and the opening OP1 among layers in FIG. 7 because it may be difficult to easily recognize the first data conductive layer, and FIG. 7 is a plan view illustrating all layers below the first data conductive layer.

The plurality of openings OP1 are defined or formed at the second interlayer insulating film 152 and the insulating films (i.e., the first gate insulating film 141, the second gate insulating film 142, and the first interlayer insulating film 151) disposed below the second interlayer insulating film 152. Here, the plurality of openings OP1 may be simultaneously formed using one mask.

The opening OP1 may be formed at at least one insulating film among the second interlayer insulating film 152, the first interlayer insulating film 151, the second gate insulating film 142, and the first gate insulating film 141 so that the first semiconductor layer 130, the first gate conductive layer, the second gate conductive layer, or the auxiliary conductive layer is exposed.

The first data conductive layer is formed above or on the second interlayer insulating film 152 at which the plurality of openings OP1 are formed.

Referring to FIGS. 6 and 7, the first data conductive layer may include a voltage line to which a constant voltage is applied, a signal line to which a signal (e.g., the scan signal or the light emitting signal) that changes every frame may be input, and a connection member.

The voltage line of the first data conductive layer of FIGS. 6 and 7 to which the constant voltage is applied includes a first driving voltage line 172-1, the first initialization voltage line 173, the reference voltage line 174, and the bias voltage line 176.

The signal line of the first data conductive layer of FIGS. 6 and 7 to which the scan signal may be input for each frame may include the first scan line 161 to which the first scan signal GW is applied, the second scan line 162 to which the second scan signal GC is applied, and an additional fourth scan line 166-1 to which the fourth scan signal EB is applied.

In addition, the connection member of the first data conductive layer of FIGS. 6 and 7 may include various connection members 171*c*, SD25, SD36, SD34, and SD1*ano*.

First, the voltage line of the first data conductive layer will be described.

The first driving voltage line 172-1 extends in the first direction DR1, and transfers the driving voltage ELVDD in the first direction. The first driving voltage line 172-1 includes a protrusion 172-11 protruding in the second direction DR2. Here, the protrusion 172-11 is electrically connected to the semiconductor 1139 of the first semiconductor layer 130 through the opening OP1 so that the driving voltage ELVDD is transferred to the semiconductor 1139 of the first semiconductor layer 130.

The first initialization voltage line 173 extends in the first direction DR1, and is connected to the semiconductors 1134 and 1137 through the opening OP1 to transfer the first initialization voltage VINT to the fourth transistor T4 and the seventh transistor T7. The first initialization voltage line 173 serves to transfer the first initialization voltage VINT in the first direction DR1.

The reference voltage line 174 extends in the first direction DR1, and is connected to the semiconductor 1135 through the opening OP1 to transfer the reference voltage VREF to the fifth transistor T5. The reference voltage line 174 serves to transfer the reference voltage VREF in the first direction DR1.

The bias voltage line 176 extends in the first direction DR1, and is connected to the semiconductor 1138 through the opening OP1 to transfer the bias voltage Vbias to the eighth transistor T8.

Hereinafter, the signal line of the first data conductive layer will be described.

The first scan line 161 to which the first scan signal GW is applied extends in the first direction DR1, and is connected to the gate electrode 1152 of the second transistor T2 that is a second gate electrode through the opening OP1 to transfer the first scan signal GW to the gate electrode of the second transistor T2.

The second scan line 162 to which the second scan signal GC is applied extends in the first direction DR1, and is connected to the gate electrode 1153 of the third transistor T3 that is a third gate electrode and the gate electrode 1155 of the fifth transistor T5 that is a fifth gate electrode disposed at the first gate conductive layer through the opening OP1.

The additional fourth scan line 166-1 to which the fourth scan signal EB is applied extends in the first direction DR1 and is connected to the gate electrode 1158 of the eighth transistor T8 that is an eighth gate electrode integrally formed through the opening OP1.

Hereinafter, the connection member of the first data conductive layer is described.

The connection member 171*c* is connected to the semiconductor 1132 of the first semiconductor layer 130 through the opening OP1.

The connection member (hereinafter also referred to as a first connection member) SD25 connects the semiconductor 1132 of the second transistor T2 and the semiconductor 1135 of the fifth transistor T5 of the first semiconductor layer 130 to the second storage electrode Cst2 of the second gate conductive layer, and in this case, the connection member SD25 is connected to the second storage electrode Cst2 through the first opening Ch1*o*1 of the first hold electrode Chold1. As a result, the second transistor T2 and the fifth transistor T5 are connected to the second storage electrode Cst2 of the storage capacitor Cst.

The connection member (hereinafter also referred to as a second connection member) SD34 connects the semiconductor 1133 of the third transistor T3 and the semiconductor 1134 of the fourth transistor of the first semiconductor layer 130 to the driving gate electrode 1151 of the driving transistor T1 of the first gate conductive layer, and in this case, the connection member SD34 is connected to the driving gate electrode 1151 through the second opening Ch1*o*2 of the first hold electrode Chold1 and the opening Cst2*o* of the second storage electrode Cst2. As a result, the third transistor T3 and the fourth transistor T4 are connected to the gate electrode of the driving transistor T1.

The connection member SD36 is connected to the semiconductor 1133 of the third transistor T3 of the first semiconductor layer 130 and a portion extending from the second region 1131-2 of the driving transistor T1 to an upper side (the second direction DR2) at the first semiconductor layer 130. As a result, the third transistor T3 and the second electrode of the driving transistor T1 are connected.

The connection member SD1*ano* is connected to the semiconductor 1136 of the first semiconductor layer 130 through the opening OP1. An output current of the driving transistor T1 transferred through the sixth transistor T6 is applied to the connection member SD1*ano*.

The first data conductive layer may include a metal such as aluminum (Al), copper (Cu), molybdenum (Mo), titanium (Ti), or the like, or a metal alloy, and may include or be defined by a single layer or multiple layers.

Referring to FIG. 11, a first organic film 181 is disposed above or on the first data conductive layer. The first organic film 181 may be an organic insulating film including an organic material, and the organic material may include at least one material selected from polyimide, polyamide, acrylic resin, benzocyclobutene, and phenol resin.

Figure 8:
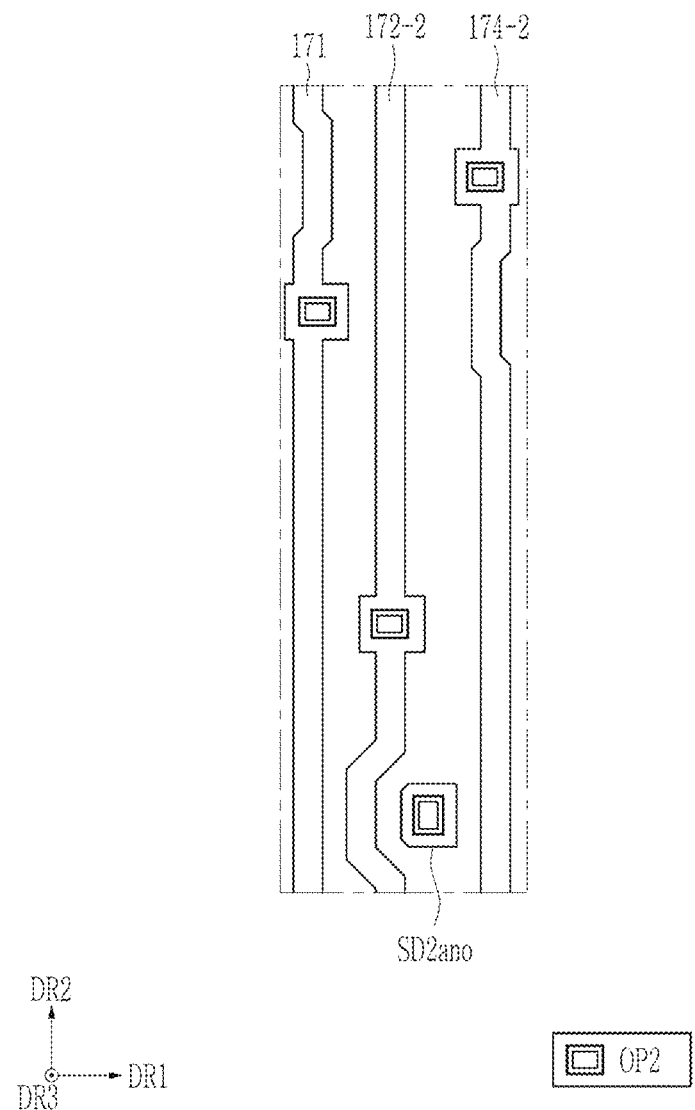

Referring to FIG. 8, an opening OP2 is formed or defined at the first organic film 181. The opening OP2 exposes the first data conductive layer, and allows the exposed first data conductive layer to be connected to a second data conductive layer.

Referring to FIGS. 8 and 9, the second data conductive layer is disposed above or on the first organic film 181.

In FIG. 8, only the opening OP2 of the first organic film 181 and the second data conductive layer stacked above or on the opening OP2 of the first organic film 181 are illustrated, and FIG. 8 shows only the second data conductive layer because it may be difficult to easily recognize the second data conductive layer in FIG. 9. FIG. 9 shows all layers below the second data conductive layer.

The second data conductive layer may include the data line 171 to which the data voltage VDATA is applied, an additional driving voltage line 172-2 to which the driving voltage ELVDD is transferred, a second reference voltage line 174-2 to which the reference voltage VREF is transferred, and an anode connection member SD2*ano*.

Since the data line 171 extends in the second direction DR2, and is connected to the connection member 171*c* through an opening OP4, and the connection member 171*c* is connected to the semiconductor 1132 of the first semiconductor layer 130 through the opening OP1, the data voltage VDATA is transferred to a first electrode of the second transistor T2 through the connection member 171*c*.

Since the additional driving voltage line 172-2 extends in the second direction DR2, and is connected to the first driving voltage line 172-1 through the opening OP2, the driving voltage ELVDD is also transferred in the first direction DR1 through the first driving voltage line 172-1 while the driving voltage ELVDD is transferred in the second direction DR2 through the additional driving voltage line 172-2. Due to the driving voltage line 172 having such a mesh structure, the driving voltage ELVDD may have a constant voltage value throughout the light emitting display device. In addition, the first driving voltage line 172-1 is connected to the semiconductor 1139 of the first semiconductor layer 130 through the opening OP1 so that the driving voltage ELVDD is transferred to the ninth transistor T9.

In an embodiment, the second reference voltage line 174-2 extends in the second direction DR2, and is connected to the reference voltage line 174 through the opening OP2, and the reference voltage line 174 is connected to the semiconductor 1135 of the fifth transistor T5 through the opening OP1. In such an embodiment, the reference voltage VREF is also transferred in the first direction through the reference voltage line 174 while the reference voltage VREF is transferred in the second direction through the second reference voltage line 174-2. Due to the reference voltage line 174 having such a mesh structure, the reference voltage VREF may have a constant voltage value throughout the light emitting display device.

In an alternative embodiment, an additional initialization voltage line (not shown) extending in the second direction DR2 may be disposed instead of the second reference voltage line 174-2 at a portion where the second reference voltage line 174-2 is disposed. The additional initialization voltage line may be connected to the first initialization voltage line 173 through the opening OP2. In such an embodiment, the first initialization voltage VINT is also transferred in the first direction through the first initialization voltage line 173 while the first initialization voltage VINT is transferred in the second direction through the additional initialization voltage line. Due to the first initialization voltage line having such a mesh structure, the first initialization voltage VINT may have a constant voltage value throughout the light emitting display device.

The anode connection member SD2ano is connected to the connection member SD1ano through the opening OP2, and is connected to the semiconductor 1136 of the first semiconductor layer 130 through the opening OP1. As a result, an output current of the driving transistor T1 transferred through the sixth transistor T6 is transferred to the anode of the light emitting diode LED through the connection member SD1ano and the anode connection member SD2ano.

The second data conductive layer may include a metal such as aluminum (Al), copper (Cu), molybdenum (Mo), titanium (Ti), or the like, or a metal alloy, and may include or be defined by a single layer or multiple layers.

In FIG. 10, to more clearly identify a portion where each element (e.g., the transistor or the capacitor) is disposed in the pixel, each element is shown in a bold letter.

Referring to FIG. 11, a second organic film 182 is disposed above or on the second data conductive layer. The second organic film 182 may be an organic insulating film including an organic material, and the organic material may include at least one material selected from polyimide, polyamide, acrylic resin, benzocyclobutene, and phenol resin.

A detailed stacked structure of an upper portion of the second organic film 182 will be described in detail with reference to FIG. 11.

FIG. 11 is a cross-sectional view of the light emitting display device according to an embodiment.

Referring to FIG. 11, the first semiconductor layer 130 including or formed of a silicon semiconductor (e.g., a polycrystalline semiconductor) is disposed on the substrate 110. The first semiconductor layer 130 includes a channel of a polycrystalline transistor LTPS TFT including the driving transistor T1 and first and second regions disposed at both sides of the channel. Here, the polycrystalline transistor LTPS TFT includes not only the driving transistor T1 but also the second transistor T2, the third transistor T3, the fourth transistor T4, the fifth transistor T5, the sixth transistor T6, the seventh transistor T7, the eighth transistor T8, and the ninth transistor T9. In addition, the polycrystalline transistor LTPS TFT may include regions having a conductive layer characteristic by plasma treatment or doping at opposing sides of each channel that serve as the first and second electrodes of the transistor.

In an embodiment, the overlapping electrode and the buffer layer covering the overlapping electrode may be further disposed between the substrate 110 and the first semiconductor layer 130.

The first gate insulating film 141 may be disposed on the first semiconductor layer 130. The first gate insulating film 141 may be an inorganic insulating film including a silicon oxide ($SiO_x$), a silicon nitride ($SiN_x$), a silicon oxynitride ($SiO_xN_y$), or the like.

In an embodiment, the first gate conductive layer including a gate electrode of the polycrystalline transistor LTPS TFT may be disposed above or on the first gate insulating film 141. The first gate conductive layer includes the driving gate electrode 1151 of the driving transistor T1. Here, the driving gate electrode 1151 may also serve as the first storage electrode of the storage capacitor Cst. The first gate conductive layer may include a metal such as copper (Cu), molybdenum (Mo), aluminum (Al), titanium (Ti), or the like, or a metal alloy, and may include or be defined by a single layer or multiple layers.

After the first gate conductive layer is formed, the plasma treatment or doping process may be performed on the formed first gate conductive layer to make an exposed region of the first semiconductor layer 130 conductive. That is, the first semiconductor layer 130 covered by the first gate conductive layer may not be conductive, and the portion of the first semiconductor layer 130 not covered by the first gate conductive layer may have the same characteristic as that of the conductive layer.

The second gate insulating film 142 may be disposed on the first gate conductive layer and the first gate insulating film 141. The second gate insulating film 142 may be an inorganic insulating film including a silicon oxide ($SiO_x$), a silicon nitride ($SiN_x$), a silicon oxynitride ($SiO_xN_y$), or the like.

The second gate conductive layer including the second storage electrode Cst2 of the storage capacitor Cst may be disposed on the second gate insulating film 142. The second storage electrode Cst2 of the storage capacitor Cst overlaps the driving gate electrode 1151 of the driving transistor T1 to form the storage capacitor Cst. In addition, the second storage electrode Cst2 may also serve as the second hold electrode of the hold capacitor Chold. The second gate conductive layer may include a metal such as copper (Cu), molybdenum (Mo), aluminum (Al), titanium (Ti), or the like, or a metal alloy, and may include or be defined by a single layer or multiple layers.

The first interlayer insulating film 151 may be disposed above or on the second gate conductive layer. The first interlayer insulating film 151 may include an inorganic insulating film (or an inorganic insulating material) including a silicon oxide ($SiO_x$), a silicon nitride ($SiN_x$), a silicon oxynitride ($SiO_xN_y$), or the like, and in an embodiment, the inorganic insulating film may be thickly formed.

The auxiliary conductive layer including the first hold electrode Chold1 of the hold capacitor Chold is disposed on the first interlayer insulating film 151. The first hold electrode Chold1 of the hold capacitor Chold overlaps the second storage electrode Cst2 to form the hold capacitor Chold. The auxiliary conductive layer may include a metal such as copper (Cu), molybdenum (Mo), aluminum (Al), titanium (Ti), or the like, or a metal alloy, and may include or be defined by a single layer or multiple layers.

The second interlayer insulating film 152 may be disposed above or on the auxiliary conductive layer. The second interlayer insulating film 152 may include an inorganic insulating film (or an inorganic insulating material) including a silicon oxide ($SiO_x$), a silicon nitride ($SiN_x$), a silicon oxynitride ($SiO_xN_y$), or the like, and in an embodiment, the inorganic insulating film may be thickly formed.

The first data conductive layer including the plurality of connection members may be disposed above or on the second interlayer insulating film 152. The connection member SD1*ano* among the plurality of connection members disposed at the first data conductive layer is illustrated in FIG. 11. The first data conductive layer may include a metal such as aluminum (Al), copper (Cu), molybdenum (Mo), titanium (Ti), or the like, or a metal alloy, and may include or be defined by a single layer or multiple layers.

The first organic film 181 may be disposed above or on the first data conductive layer. The first organic film 181 may be an organic insulating film including an organic material, and the organic material may include at least one material selected from polyimide, polyamide, acrylic resin, benzocyclobutene, and phenol resin.

The second data conductive layer including the anode connection member SD2*ano* may be disposed on the first organic film 181. The second data conductive layer may also include a data line or a driving voltage line. The second data conductive layer may include a metal such as aluminum (Al), copper (Cu), molybdenum (Mo), titanium (Ti), or the like, or a metal alloy, and may include or be defined by a single layer or multiple layers.

The second organic film 182 is disposed above or on the second data conductive layer, and an opening is formed at the second organic film 182 to electrically connect the anode connection member SD2*ano* and the anode Anode. The second organic film 182 may include at least one material selected from polyimide, polyamide, acrylic resin, benzocyclobutene, and phenol resin.

The anode Anode constituting the light emitting diode is disposed on the second organic film 182. The anode Anode may be formed of (or defined by) a single layer including a transparent conductive oxide film or a metal material, or multiple layers, each layer therein including the transparent conductive oxide film or the metal material. The transparent conductive oxide film may include indium tin oxide (ITO), poly-ITO, indium zinc oxide (IZO), indium gallium zinc oxide (IGZO), indium tin zinc oxide (ITZO), or the like. The metal material may include silver (Ag), molybdenum (Mo), copper (Cu), gold (Au), aluminum (Al), or the like.

A pixel defining film 380 that covers at least a portion of the anode Anode and is provided with an opening OP exposing the anode Anode may be disposed on the anode Anode. The pixel defining film 380 may be a black pixel defining film including or formed of an organic material having a black color so that light applied from the outside is not reflected back to the outside, and may include or be formed of a transparent organic material in an embodiment.

A spacer (not shown) may be disposed above or on the pixel defining film 380, and the spacer may also include or be formed of the same material as the pixel defining film 380.

A functional layer FL and a cathode Cathode are sequentially formed on the anode Anode and the pixel defining film 380, and in a display area, the functional layer FL and the cathode Cathode may be disposed at an entire area. A light emitting layer (or an emission layer) EML is disposed between the functional layers FL, and the light emitting layer EML may be disposed only within the opening OP of the pixel defining film 380. Hereinafter, the functional layer FL and the light emitting layer EML may be collectively referred to as an intermediate layer. The functional layer FL may include at least one selected from an auxiliary layer such as an electron injection layer, an electron transfer layer, a hole transfer layer, and a hole injection layer, the hole injection layer and the hole transfer layer may be disposed at an lower portion of the light emitting layer EML, and the electron transfer layer and the electron injection layer may be disposed at an upper portion of the light emitting layer EML.

The encapsulation layer 400 is disposed on the cathode Cathode. The encapsulation layer 400 includes at least one inorganic film and at least one organic film, and may have a triple layer structure including a first inorganic encapsulation layer, an organic encapsulation layer, and a second inorganic encapsulation layer in an embodiment. The encapsulation layer 400 may protect the light emitting layer EML from moisture, oxygen, or the like that may be introduced from the outside. According to an embodiment, the encapsulation layer 400 may include a structure in which an inorganic layer and an organic layer are sequentially stacked one on another.

Although not shown in the drawings, according to an embodiment, a sensing insulating layer and a plurality of sensing electrodes for touch sensing may be disposed above or on the encapsulation layer 400.

In addition, a light blocking member and a color filter layer may also be disposed above or on the encapsulation layer 400. In an embodiment, a color conversion layer may be formed instead of the color filter layer. The color conversion layer may include a quantum dot.

In the above description, an overall structure of the light emitting display device and the pixel has been described in detail.

Hereinafter, a circuit structure of one pixel of a light emitting display device according to an alternative embodiment will be described with reference to FIG. 12.

Figure 12:
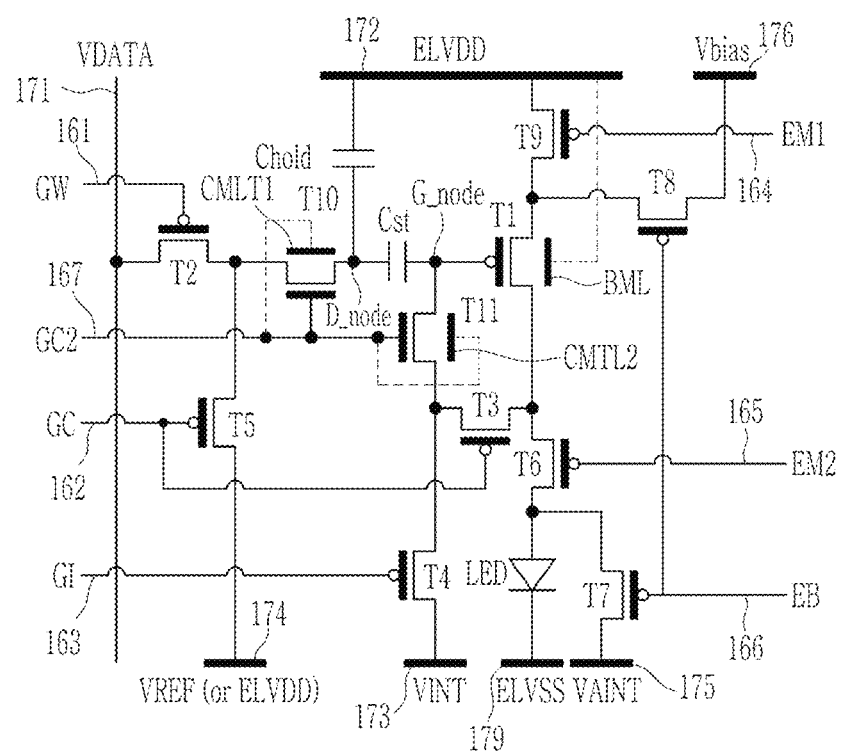
FIG. 12 is an equivalent circuit diagram of one pixel included in a light emitting display device according to an alternative embodiment.

FIG. 12 is an equivalent circuit diagram of the one pixel included in the light emitting display device according to an alternative embodiment.

Referring to FIG. 12, the one pixel includes a light emitting diode LED and a pixel circuit portion driving the LED, and the pixel circuit portion is disposed in a matrix form. The pixel circuit portion includes all elements other than the LED of FIG. 12, and the pixel circuit portion of the pixel according to the embodiment of FIG. 12 includes a driving transistor T1, a second transistor T2, a third transistor T3, a fourth transistor T4, a fifth transistor T5, a sixth transistor T6, a seventh transistor T7, an eighth transistor T8, a ninth transistor T9, a tenth transistor T10, an eleventh transistor T11, a storage capacitor Cst, and a hold capacitor Chold.

In addition, a first scan line 161 to which a first scan signal GW is applied, a second scan line 162 to which a second scan signal GC is applied, an additional second scan line (hereinafter, will be referred to as (2-1)-th scan line) 167 to which an additional second scan signal (hereinafter, will be referred to as (2-1)-th scan signal) GC2 corresponding to the second scan signal GC is applied, a third scan line 163 to which a third scan signal GI is applied, light emitting signal lines 164 and 165 to which light emitting signals (or emission signals) EM1 and EM2 are applied, a fourth scan line 166 to which a fourth scan signal EB is applied, and a data line 171 to which a data voltage VDATA is applied may be connected to the pixel circuit portion. In addition, the pixel may be connected to a first driving voltage line 172 to which a driving voltage (hereinafter also referred to as a first driving voltage) ELVDD is applied, a second driving voltage line 179 to which a driving low voltage (hereinafter also referred to as a second driving voltage) ELVSS is applied, a first initialization voltage line 173 to which a first initialization voltage VINT is applied, a second initialization voltage line 175 to which a second initialization voltage VAINT is applied, a reference voltage line 174 to which a reference voltage VREF is applied, and a bias voltage line 176 to which a bias voltage Vbias is applied.

A structure of the pixel will be described below focusing on each element (e.g., the transistor, the capacitor, or the light emitting diode) included in the pixel.

The driving transistor (hereinafter also referred to as a first transistor) T1 includes a gate electrode (hereinafter also referred to as a driving gate electrode) connected to a first electrode of the storage capacitor Cst, a first electrode (or an input side electrode) connected to the driving voltage line 172 through the ninth transistor T9, and a second electrode (or an output side electrode) that outputs an electric current according to a voltage of the driving gate electrode.

The driving gate electrode of the driving transistor T1 is connected to a second electrode (or an output side electrode) of the eleventh transistor T11 and the first electrode of the storage capacitor Cst. The first electrode of the driving transistor T1 is connected to a second electrode (an output side electrode) of the ninth transistor T9 and a second electrode (an output side electrode) of the eighth transistor T8 to receive the driving voltage ELVDD and/or the bias voltage Vbias, and the second electrode of the driving transistor T1 is connected to a first electrode (an input side electrode) of the third transistor T3 and a first electrode (an input side electrode) of the sixth transistor T6. An output current of the driving transistor T1 passes through the sixth transistor T6 and is transferred to the light emitting diode LED so that the light emitting diode LED emits light. Luminance of light emitted from the light emitting diode LED is determined based on a magnitude of the output current of the driving transistor T1. In an embodiment, the driving transistor T1 may further include an overlapping electrode BML overlapping at least a portion (e.g., a channel) of a semiconductor (e.g., a polycrystalline semiconductor) of the driving transistor. In FIG. 12, the overlapping electrode BML is shown as being connected to the driving voltage line 172 to which the driving voltage ELVDD is applied by a dotted line, but this indicates that the overlapping electrode BML may not be connected to the driving voltage line 172, but may be connected to another portion (e.g., the first electrode or the second electrode of the driving transistor T1, or another voltage line).

The second transistor (hereinafter also referred to as a data input transistor) T2 includes a gate electrode connected to the first scan line 161 to which the first scan signal GW is applied, a first electrode (an input side electrode) connected to the data line 171 to which the data voltage VDATA is applied, and a second electrode (an output side electrode) connected to a second electrode of the fifth transistor T5 and a first electrode of the tenth transistor T10. The second transistor T2 inputs the data voltage VDATA into the pixel in response to the first scan signal GW, and stores the data voltage VDATA in a second electrode of the storage capacitor Cst after the data voltage VDATA passes through the tenth transistor T10.

The third transistor (hereinafter also referred to as a first compensation transistor) T3 includes a gate electrode connected to the second scan line 162 to which the second scan signal GC is applied, a first electrode (an input side electrode) connected to the second electrode of the driving transistor T1 and the first electrode of the sixth transistor T6, and a second electrode (an output side electrode) connected to a first electrode of the eleventh transistor T11 and a second electrode of the fourth transistor T4. The third transistor T3 forms a compensation path that compensates for a threshold voltage of the driving transistor T1 together with the eleventh transistor T11 (hereinafter also referred to as the second compensation transistor) so that the threshold voltage of the driving transistor T1 is stored in the first electrode of the storage capacitor Cst to compensate for the threshold voltage of the driving transistor T1. As a result, even if the threshold voltage of the driving transistor T1 included in each pixel is different, the driving transistor T1 may output a constant output current corresponding to an applied data voltage VDATA.

The fourth transistor (hereinafter also referred to as a first initialization transistor) T4 includes a gate electrode connected to the third scan line 163 to which the third scan signal GI is applied, a first electrode connected to the first initialization voltage line 173 that delivers (or transfers) the first initialization voltage VINT, and a second electrode connected to the second electrode of the third transistor T3 and the first electrode of the eleventh transistor T11. The fourth transistor T4 transfers the first initialization voltage VINT within the pixel to serve to initialize each of the second electrode of the third transistor T3 and the first electrode of the eleventh transistor T11 with the first initialization voltage VINT, and a turned-on eleventh transistor T11 initializes the gate electrode of the driving transistor T1 and the first electrode of the storage capacitor Cst that are a gate node G_node and are connected to the eleventh transistor T11.

The fifth transistor (hereinafter also referred to as a data node initialization transistor) T5 includes a gate electrode connected to the second scan line 162 to which the second scan signal GC is applied, a first electrode connected to the reference voltage line 174 that delivers (or transfers) the reference voltage VREF, and a second electrode connected to the first electrode of the tenth transistor T10 and the second electrode of the second transistor T2. The fifth transistor T5 serves to initialize the second electrode of the storage capacitor Cst and a second electrode of the hold capacitor Chold by changing a voltage of each of the second electrode of the storage capacitor Cst and the second electrode of the hold capacitor Chold to the reference voltage VREF after the reference voltage VREF passes through the tenth transistor T10. In an alternative embodiment, the driving voltage ELVDD may be applied to the first electrode of the fifth transistor T5 instead of the reference voltage VREF.

The sixth transistor (hereinafter also referred to as a current transfer transistor) T6 includes a gate electrode connected to the second light emitting signal line 165 to which the second light emitting signal EM2 is applied, a first electrode (an input side electrode) connected to the second electrode of the driving transistor T1 and the first electrode of the third transistor T3, and a second electrode (an output side electrode) connected to an anode of the light emitting diode LED and a second electrode of the seventh transistor T7. The sixth transistor T6 serves to transmit or block the output current of the driving transistor T1 to or from the light emitting diode LED based on the second light emitting signal EM2.

The seventh transistor (hereinafter also referred to as an anode initialization transistor) T7 includes a gate electrode connected to the fourth scan line 166 to which the fourth scan signal EB is applied, a first electrode connected to the second initialization voltage line 175 that delivers (or transfers) the second initialization voltage VAINT, and a second electrode connected to the anode of the light emitting diode LED and the second electrode of the sixth transistor T6. The seventh transistor T7 serves to initialize the anode of the light emitting diode LED with the second initialization voltage VAINT. In an embodiment, the seventh transistor T7 may be an oxide transistor including an oxide semiconductor, and may be formed as an n-type transistor to be turned on by a high level voltage and to be turned off by a low level voltage. In addition, in an embodiment, the gate electrode of the seventh transistor T7 may be connected to a separate signal line instead of the fourth scan line 166, and for example, the separate signal line may be one of the light emitting signal lines 164 and 165 to which the light emitting signals EM1 and EM2 are applied.

The eighth transistor (hereinafter also referred to as a bias transistor) T8 includes a gate electrode connected to the fourth scan line 166 to which the fourth scan signal EB is applied, a first electrode connected to the bias voltage line 176 that transfers the bias voltage Vbias, and a second electrode connected to the first electrode of the driving transistor T1 and the second electrode of the ninth transistor T9. The eighth transistor T8 may transfer the bias voltage Vbias to the first electrode of the driving transistor T1 so that a characteristic of the driving transistor T1 is maintained constant. In an embodiment, for example, when the bias voltage Vbias is transferred to the first electrode of the driving transistor T1, an output current may be constantly generated with a previously received data voltage VDATA even if the driving transistor T1 does not receive a separate data voltage VDATA. This operation may serve to maintain the characteristic of the driving transistor T1 during high-speed driving or low-speed driving.

The ninth transistor (hereinafter also referred to as a driving voltage transfer transistor) T9 includes a gate electrode connected to the first light emitting signal line 164 to which the first light emitting signal EM1 is applied, a first electrode (an input side electrode) connected to the first driving voltage line 172 that delivers (or transfers) the driving voltage ELVDD, and a second electrode (an output side electrode) connected to the first electrode of the driving transistor T1 and the second electrode of the eighth transistor T8. The ninth transistor T9 may transfer the driving voltage ELVDD to the first electrode of the driving transistor T1 so that the driving transistor T1 generates an electric current.

The tenth transistor (hereinafter also referred to as a data voltage transfer transistor) T10 includes a gate electrode connected to the (2-1)-th scan line (hereinafter also referred to as a scan line for an oxide transistor) 167 to which the (2-1)-th scan signal GC2 is applied, a first electrode connected to the second electrode of the second transistor T2 and the second electrode of the fifth transistor T5, and a second electrode connected to the second electrode of the storage capacitor Cst and the second electrode of the hold capacitor Chold. The tenth transistor T10 transfers the data voltage VDATA to the second electrode of the storage capacitor Cst to serve to change a voltage of the gate electrode of the driving transistor T1, and also transfers the reference voltage VREF to the second electrode of the storage capacitor Cst according to a time. Here, since a node to which the second electrode of the storage capacitor Cst and the second electrode of the hold capacitor Chold are connected is a node to which the data voltage VDATA is transmitted, the node is also referred to as a data node D_node hereinafter. In an embodiment, the tenth transistor T10 may further include a first auxiliary electrode CMTL1 overlapping at least a portion (e.g., a channel) of a semiconductor (e.g., an oxide semiconductor) of the tenth transistor T10. In FIG. 12, the first auxiliary electrode CMTL1 is illustrated as being connected to the (2-1)-th scan line 167 by a dotted line, and this indicates that the first auxiliary electrode CMTL1 may not be connected to a main portion of the (2-1)-th scan line 167, but may be connected to another portion (e.g., any one voltage line or a front or rear end of the (2-1)-th scan line 167).

The eleventh transistor T11 includes a gate electrode connected to the (2-1)-th scan line 167 to which the (2-1)-th scan signal GC2 is applied, a first electrode connected to the second electrode of the third transistor T3 and the second electrode of the fourth transistor T4, and a second electrode connected to the gate electrode of the driving transistor T1 and the first electrode of the storage capacitor Cst. The eleventh transistor T11 forms the compensation path that compensates for the threshold voltage of the driving transistor T1 together with the third transistor T3 so that the threshold voltage of the driving transistor T1 is stored in the first electrode of the storage capacitor Cst to compensate for the threshold voltage of the driving transistor T1. As a result, even if the threshold voltage of the driving transistor T1 included in each pixel is different, the driving transistor T1 may output a constant output current corresponding to an applied data voltage VDATA. In an embodiment, the eleventh transistor T11 may further include a second auxiliary electrode CMTL2 overlapping at least a portion (e.g., a channel) of a semiconductor (e.g., an oxide semiconductor) of the eleventh transistor T11. In FIG. 12, the second auxiliary electrode CMTL2 is illustrated as being connected to the (2-1)-th scan line 167 and/or the gate electrode of the eleventh transistor T11 by a dotted line (hereinafter, being connected to the (2-1)-th scan line 167 and/or the gate electrode of the eleventh transistor T11 is also referred to as a gate sink), and this indicates that the second auxiliary electrode CMTL2 may not be connected to a main portion of the (2-1)-th scan line 167, but may be connected to another portion (e.g., any one voltage line or a front or rear end of the (2-1)-th scan line 167).

In an embodiment, as show in FIG. 12, all transistors may be divided into a p-type transistor formed using a polycrystalline semiconductor and an n-type transistor formed using an oxide semiconductor. Referring to FIG. 12, the driving transistor T1, the second transistor T2, the third transistor T3, the fourth transistor T4, the fifth transistor T5, the sixth transistor T6, the seventh transistor T7, the eighth transistor T8, and the ninth transistor T9 are p-type transistors including polycrystalline semiconductors, and the tenth transistor T10 and the eleventh transistor T11 are n-type transistors including oxide semiconductors. In addition, in the embodiment of FIG. 12, the p-type transistor, which is a polycrystalline transistor, and may be turned on by a low level voltage and may be turned off by a high level voltage, and the n-type transistor, which is an oxide transistor, may be turned on by a low level voltage and may be turned off by a high level voltage. In an embodiment, the seventh transistor T7 may be the n-type transistor including the oxide semiconductor, and may be turned on by a high level voltage and may be turned off by a low level voltage.

The storage capacitor (hereinafter also referred to as a voltage transfer capacitor or a first capacitor) Cst includes the first electrode (hereinafter also referred to as a first storage electrode) connected to the gate electrode of the driving transistor T1 and the second electrode of the eleventh transistor T11 that are the gate node G_node, and the second electrode (hereinafter also referred to as a second storage electrode) connected to a second electrode of the tenth transistor T10 and the second electrode of the hold capacitor Chold that are the data node D_node. The storage capacitor Cst receives the data voltage VDATA through the second transistor T2 and the tenth transistor T10 or receives the reference voltage VREF through the fifth transistor T5 and the tenth transistor T10 to serve to change a voltage of the gate electrode of the driving transistor T1 and to maintain the received voltage until a next voltage is transferred. In the pixel according to an embodiment, the data voltage VDATA is not directly transferred to the gate electrode of the driving transistor T1 but is transferred through the storage capacitor Cst. This is a method of indirectly transferring the data voltage VDATA to the gate electrode of the driving transistor T1 based on a fact that when a voltage of the second electrode of the storage capacitor Cst suddenly rises, a voltage of the first electrode of the storage capacitor, which is another electrode, also rises. According to this method, even if leakage of at least one transistor (e.g., the second transistor T2 or the like) included in the pixel occurs, a voltage of the gate electrode of the driving transistor T1 does not leak directly so that the leakage effect is small. In addition, in such an embodiment, the data voltage VDATA passes through the storage capacitor Cst without passing through another electrode of the driving transistor T1 and is directly transferred to the gate electrode of the driving transistor T1 so that a voltage stored in the storage capacitor Cst is determined without being affected by a difference in the driving voltage ELVDD even if there is the difference in the driving voltage ELVDD according to a position of the pixel.

The hold capacitor Chold (hereinafter also referred to as a second capacitor) includes a first electrode (hereinafter also referred to as a first hold electrode) to which the driving voltage ELVDD is applied, and the second electrode (hereinafter also referred to as a second hold electrode) connected to the second electrode of the storage capacitor Cst and the second electrode of the tenth transistor T10 that is the data node D_node, and serves to keep a voltage of the second electrode of the storage capacitor Cst that is a voltage of the data node D_node constant. That is, by the hold capacitor Chold, the voltage of the second electrode of the storage capacitor Cst that is the data node D_node does not fluctuate and has a constant voltage even when a peripheral signal fluctuates.

The light emitting diode LED includes the anode connected to the second electrode of the sixth transistor T6 and the second electrode of the seventh transistor T7, and a cathode connected to the second driving voltage line 179 to which the driving low voltage ELVSS is applied. The light emitting diode LED may be disposed between the pixel circuit portion and the driving low voltage ELVSS to emit light with luminance corresponding to a current supplied from the pixel circuit portion (e.g., the driving transistor T1). The light emitting diode LED may include a light emitting layer including at least one of an organic light emitting material and an inorganic light emitting material. A hole and an electron are respectively injected into the light emitting layer from the anode and the cathode, and light is emitted when an exciton that is a combination of the injected holes and electrons falls from an excited state to a ground state. The light emitting diode LED may emit light of one of primary colors or white light. Examples of the primary colors include three primary colors of red, green, and blue. Other examples of primary colors include yellow, cyan, magenta, and the like. In an embodiment, a color display characteristic may be improved by further including an additional color filter or a color conversion layer.

In the pixel according to an embodiment, as shown in FIG. 12, two transistors (the second transistor T2 and the tenth transistor T10) and the storage capacitor Cst are disposed at a path (hereinafter also referred to as a data voltage transfer path) through which the data voltage VDATA is transferred to the driving gate electrode. That is, the storage capacitor Cst and the tenth transistor T10 are disposed between the driving gate electrode of the driving transistor T1 and the second transistor T2. In such an embodiment, the data voltage VDATA is not directly transferred to the driving gate electrode of the driving transistor T1, but is transferred to the second storage electrode of the storage capacitor Cst. When a voltage of the second storage electrode is changed while the data voltage VDATA is applied to the second storage electrode, the data voltage VDATA is indirectly transferred while a voltage of the first storage electrode and a voltage of the driving gate electrode are changed. To transfer the data voltage VDATA, two transistors (the second transistor T2 and the tenth transistor T10) are turned on together. In addition, the tenth transistor T10 has a different characteristic from that of the driving transistor T1 and that of the second transistor T2, and the two transistors included in the data voltage transfer path have different characteristics. That is, each of the driving transistor T1 and the second transistor T2 is formed of (or defined by) a p-type polycrystalline transistor, but the tenth transistor T10 is formed of an n-type oxide transistor. In addition, the tenth transistor T10 may adjust a voltage applied to the first auxiliary electrode CMTL, and may adjust a characteristic of the tenth transistor T10 so that the data voltage VDATA is sufficiently charged in the storage capacitor Cst even for a short time. Thus, it is possible to improve display quality of the light emitting display device even during the high-speed driving.

The pixel according to an embodiment, as shown in FIG. 12, further includes the hold capacitor Chold in addition to the storage capacitor Cst to keep the voltage of the data node D_node that is the data voltage VDATA input to the pixel more constant. Referring to FIGS. 13 to 28 described later, the driving gate electrode of the driving transistor T1, the storage capacitor Cst, and the hold capacitor Chold may be formed to overlap each other on a plane.

In the pixel according to an embodiment, as show in FIG. 12, two transistors (the third transistor T3 and the eleventh transistor T11) are formed at the compensation path that compensates for the threshold voltage of the driving transistor T1, and the two transistors (the third transistor T3 and the eleventh transistor T11) have to be turned on together to compensate for the threshold voltage of the driving transistor T1. In addition, the eleventh transistor T11 has a different characteristic from that of the driving transistor T1 and that of the third transistor T3, and the two transistors included in the compensation path have different characteristics from each other. That is, each of the driving transistor T1 and the third transistor T3 is formed of a p-type polycrystalline transistor, but the eleventh transistor T11 is formed of an n-type oxide transistor. In addition, the eleventh transistor T11 may adjust a voltage applied to the second auxiliary electrode CMTL2, and may adjust a characteristic of the eleventh transistor T11 so that a compensation operation is possible even for a short time. Thus, it is possible to improve display quality of the light emitting display device even during the high-speed driving.

In the above description, the circuit structure of the pixel has been described.

Hereinafter, a planar structure of the pixel circuit portion of the pixel according to an embodiment will be described in detail through FIGS. 13 to 27, and a cross-sectional structure of the pixel circuit portion will also be described through FIG. 28 together with FIGS. 13 to 27.

First, while referring to FIG. 28, the planar structure of the pixel circuit portion is mainly described through FIGS. 13 to 27, and in FIGS. 13 to 27 described later, the light emitting diode LED is not shown, and a structure of the pixel circuit portion disposed at a lower portion of the light emitting diode LED is mainly shown.

FIGS. 13 to 27 are views illustrating in detail a structure of each layer according to a manufacturing order of a lower panel layer of the light emitting display device of FIG. 12.

Figure 13:
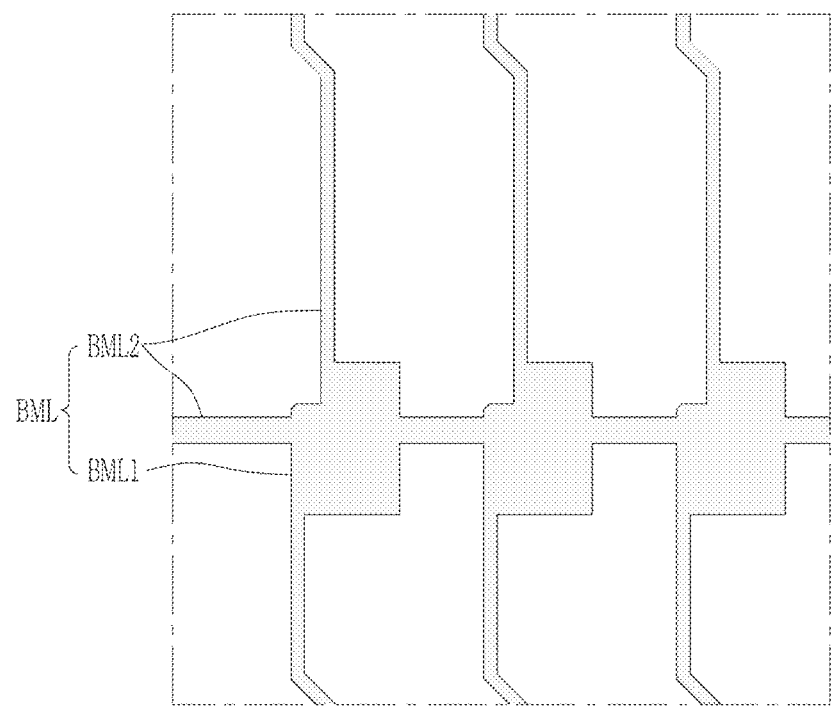
FIGS. 13 to 27 are views illustrating, in detail, a structure of each layer according to a manufacturing order of a lower panel layer of the light emitting display device of FIG. 12.
Figure 13:
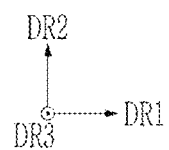
Figure 28:
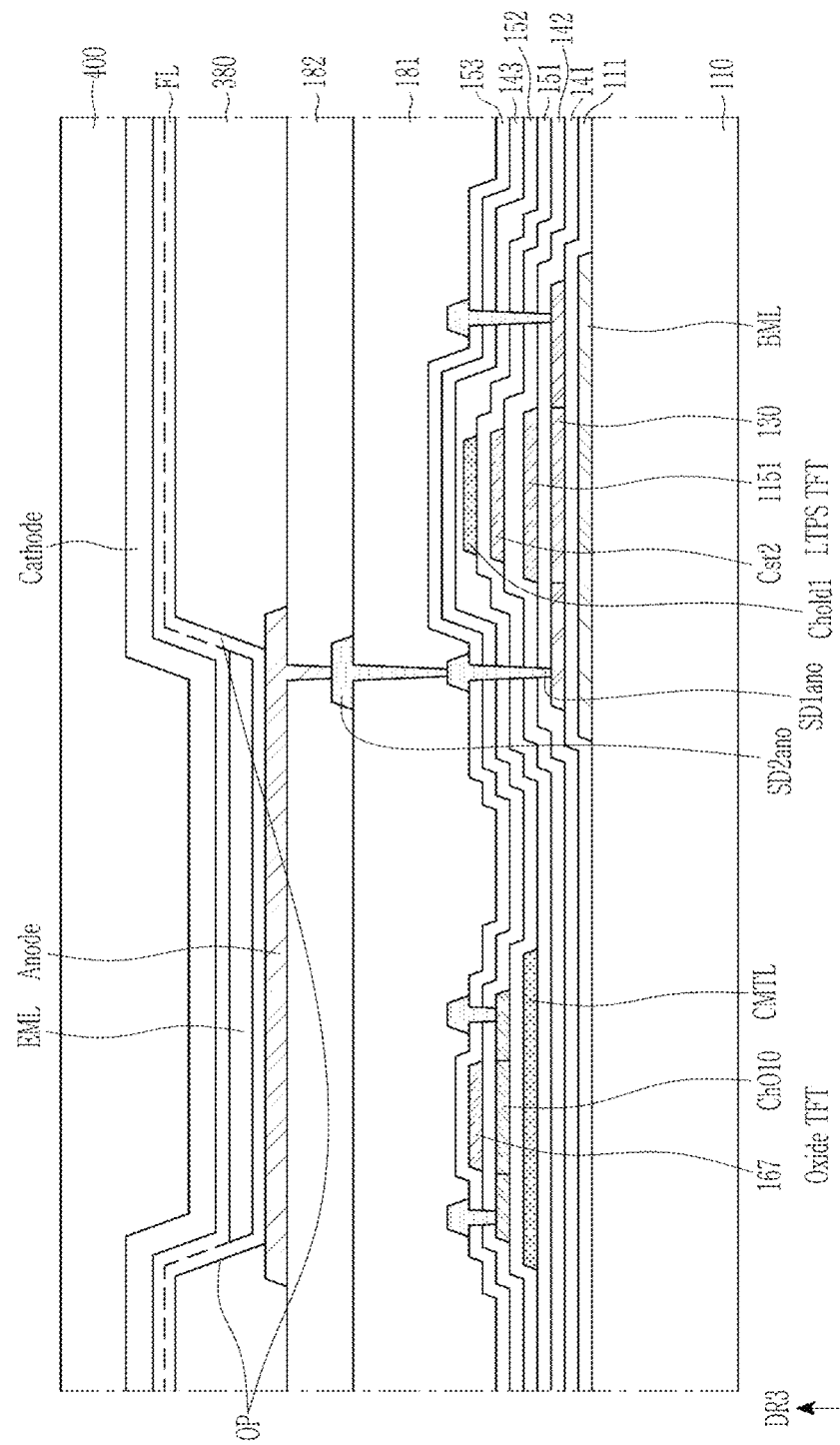
FIG. 28 is a cross-sectional view of a light emitting display device according to an alternative embodiment.

First, referring to FIG. 13, the overlapping electrode BML is disposed on a substrate 110 of FIG. 28.

The substrate 110 may include a rigid material such as glass or the like that does not bend, or may include a flexible material such as plastic or polyimide that may bend. The flexible substrate may have a structure in which a double-layered structure including polyimide and a barrier layer including or formed of an inorganic insulating material on the polyimide is formed twice.

The overlapping electrode BML includes a connection portion BML2 connecting a plurality of expansion portions BML1 to the plurality of expansion portions BML1 to each other. The extension portion BML1 of the overlapping electrode BML may be formed at a position overlapping a channel (see 1131 in FIG. 14) of the driving transistor T1 in a subsequent first semiconductor layer on a plane. The overlapping electrode BML is also referred to as a lower shielding layer, may include a metal such as copper (Cu), molybdenum (Mo), aluminum (Al), titanium (Ti), or the like, or a metal alloy, may additionally include an amorphous silicon, and may include or be defined by a single layer or multiple layers.

Referring to FIG. 28, the buffer layer 111 covering the substrate 110 and the overlapping electrode BML is disposed on the substrate 110 and the overlapping electrode BML. The buffer layer 111 serves to block penetration of an impurity element into the first semiconductor layer 130, and may be an inorganic insulating film including a silicon oxide ($SiO_x$), a silicon nitride ($SiN_x$), a silicon oxynitride ($SiO_xN_y$), or the like.

Figure 14:
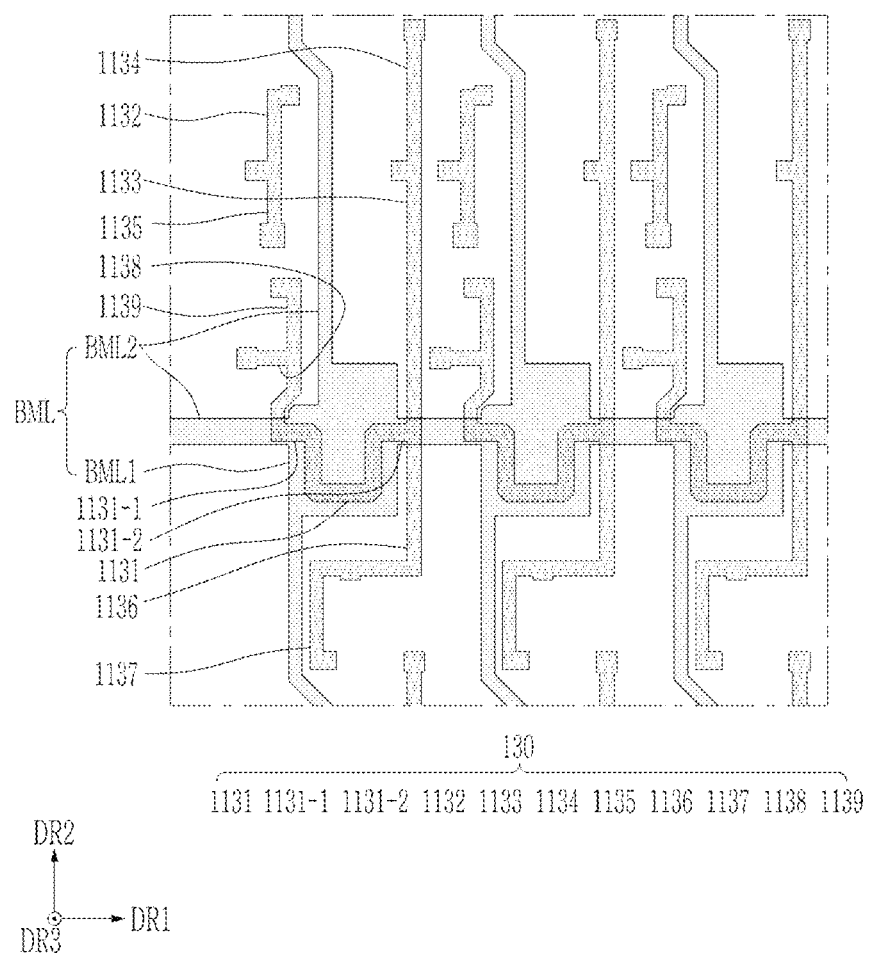

As illustrated in FIG. 14, the first semiconductor layer 130 including or formed of a silicon semiconductor (e.g., a polycrystalline semiconductor) is disposed above or on the buffer layer 111. The first semiconductor layer 130 includes a channel 1131, a first region 1131-1, and a second region 1131-2 of the driving transistor T1. In addition, the first semiconductor layer 130 includes not only the channel of the driving transistor T1 but also channels of the second transistor T2, the fifth transistor T5, the sixth transistor T6, the seventh transistor T7, the eighth transistor T8, and the ninth transistor T9, and includes portions 1132, 1133, 1134, 1135, 1136, 1137, 1138, and 1139 serving as the first and second electrodes (or regions) having a conductive layer characteristic by plasma treatment or doping at both sides of each channel.

The channel 1131 of the driving transistor T1 may be bent in a U shape on a plane. However, a shape of the channel 1131 of the driving transistor T1 is not limited thereto, and may be variously changed. For example, the channel 1131 of the driving transistor T1 may be bent in various other shapes such as an S shape and the like, or may be formed in a rod shape. The first region 1131-1 and the second region 1131-2 of the driving transistor T1 may be disposed at both sides of the channel 1131 of the driving transistor T1. The first region 1131-1 and the second region 1131-2 disposed at the first semiconductor layer serve as the first and second electrodes of the driving transistor T1.

The semiconductors 1138 and 1139 including a portion serving as channels, first electrodes, and second electrodes of the eighth transistor T8 and the ninth transistor T9 are disposed at a portion extending upward (in a second direction DR2) from the first region 1131-1 of the driving transistor T1 at the first semiconductor layer 130. The semiconductor 1138 of the eighth transistor T8 is disposed to extend upward from the first region 1131-1 of the driving transistor T1 and then to be bent in a direction opposite to a first direction DR1. The semiconductor 1139 of the ninth transistor T9 is disposed to pass through the semiconductor 1138 of the eighth transistor T8 while extending upward from the first region 1131-1 of the driving transistor T1.

At the first semiconductor layer 130, a portion extending upward (in the second direction DR2) from the second region 1131-2 of the driving transistor T1 and a portion extending downward (in the direction opposite to the second direction DR2) from the second region 1131-2 of the driving transistor T1 are connected to each other.

At the first semiconductor layer 130, the semiconductor 1136 of the sixth transistor T6 is disposed at a portion extending downward (in the direction opposite to the second direction DR2) from the second region 1131-2 of the driving transistor T1, and after the semiconductor 1137 of the seventh transistor T7 passes through the portion extending downward from the second region 1131-2 of the driving transistor T1, the semiconductor 1137 of the seventh transistor T7 is bent in the direction opposite to the first direction DR1, and then is disposed to extend again in the direction opposite to the second direction DR2.

At the first semiconductor layer 130, the semiconductor 1133 of the third transistor T3 and the semiconductor 1134 of the fourth transistor are sequentially disposed at the portion extending upward (in the second direction DR2) from the second region 1131-2 of the driving transistor T1.

In an embodiment, the first semiconductor layer 130 further includes a separate semiconductor layer, and the semiconductor 1132 of the second transistor T2 and the semiconductor 1135 of the fifth transistor T5 are disposed at the separate semiconductor layer. The separate semiconductor layer is spaced apart in the second direction DR2 from a portion extending upward (in the second direction DR2) from the first region 1131-1 of the driving transistor T1.

Referring to FIG. 28, a first gate insulating film 141 may be disposed on the first semiconductor layer 130 including the channel 1131, the first region 1131-1, the second region 1131-2, and the like of the driving transistor T1.

In an embodiment, the first gate insulating film 141 may be disposed on entire surfaces of the first semiconductor layer 130 and the buffer layer 111. In an alternative embodiment, the first gate insulating film 141 may not be disposed on the entire surfaces of the first semiconductor layer 130 and the buffer layer 111, but may be disposed only on a partial area of the entire surfaces of the first semiconductor layer 130 and the buffer layer 111. In such an embodiment, for example, the first gate insulating film 141 may overlap the channel of each transistor of the first semiconductor layer 130, but may have a structure that does not overlap the first region and the second region disposed at both sides of the channel.

The first gate insulating film 141 may be an inorganic insulating film including a silicon oxide ($SiO_x$), a silicon nitride ($SiN_x$), a silicon oxynitride ($SiO_xN_y$), or the like.

Figure 15:
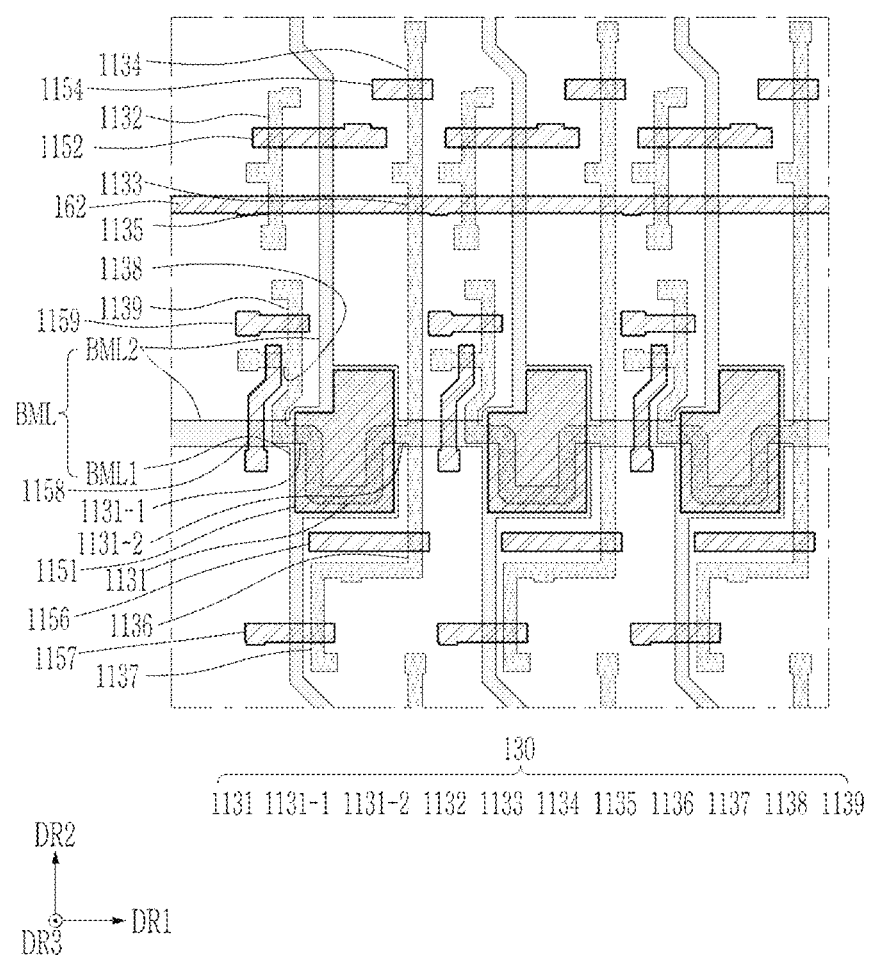

Referring to FIG. 15, a first gate conductive layer including the driving gate electrode 1151 of the driving transistor T1 and the second scan line 162 may be disposed above or on the first gate insulating film 141. The first gate conductive layer includes not only the driving gate electrode 1151 of the driving transistor T1 but also the gate electrodes 1152, 1154, 1156, 1157, 1158, and 1159 of the second to ninth transistors T2 to T9.

Referring to FIG. 15, the gate electrode 1152 of the second transistor T2, that is, a second gate electrode, and the gate electrode of the third transistor T3 are integrally formed with each other as a single unitary and indivisible part, so that a portion of the second gate electrode 1152 overlapping the semiconductor 1132 constitutes the gate electrode of the second transistor T2 and a portion of the second gate electrode 1152 overlapping the semiconductor 1133 constitutes the gate electrode of the third transistor T3. The gate electrode of the fourth transistor T4 is disposed at a portion overlapping the gate electrode 1154 and the semiconductor 1134, and the gate electrode of the fifth transistor T5 is disposed at a portion overlapping the semiconductor 1135 and the second scan line 162. The gate electrode 1156 of the sixth transistor T6 is disposed at a portion overlapping the gate electrode 1156 and the semiconductor 1136, and the gate electrode 1157 of the seventh transistor T7 is disposed at a portion overlapping the gate electrode 1157 and the semiconductor 1137. The gate electrode 1158 of the eighth transistor T8 is disposed at a portion overlapping the gate electrode 1158 and the semiconductor 1138, and the gate electrode 1159 of the ninth transistor T9 is disposed at a portion overlapping the gate electrode 1159 and the semiconductor 1139.

The first gate conductive layer may include a metal such as copper (Cu), molybdenum (Mo), aluminum (Al), titanium (Ti), or the like, or a metal alloy, and may include or be defined by a single layer or multiple layers.

After the first gate conductive layer is formed, a plasma treatment or doping process may be performed on the formed first gate conductive layer to make a portion of the first semiconductor layer 130 that is not covered with the first gate conductive layer conductive. That is, the first semiconductor layer 130 covered by the first gate conductive layer may not be conductive, and the portion of the first semiconductor layer 130 not covered by the first gate conductive layer may have the same characteristic as that of a conductive layer.

Referring to FIG. 28, a second gate insulating film 142 may be disposed on the first gate conductive layer and the first gate insulating film 141. The second gate insulating film 142 may be an inorganic insulating film including a silicon oxide ($SiO_x$), a silicon nitride ($SiN_x$), a silicon oxynitride ($SiO_xN_y$), or the like.

Figure 16:
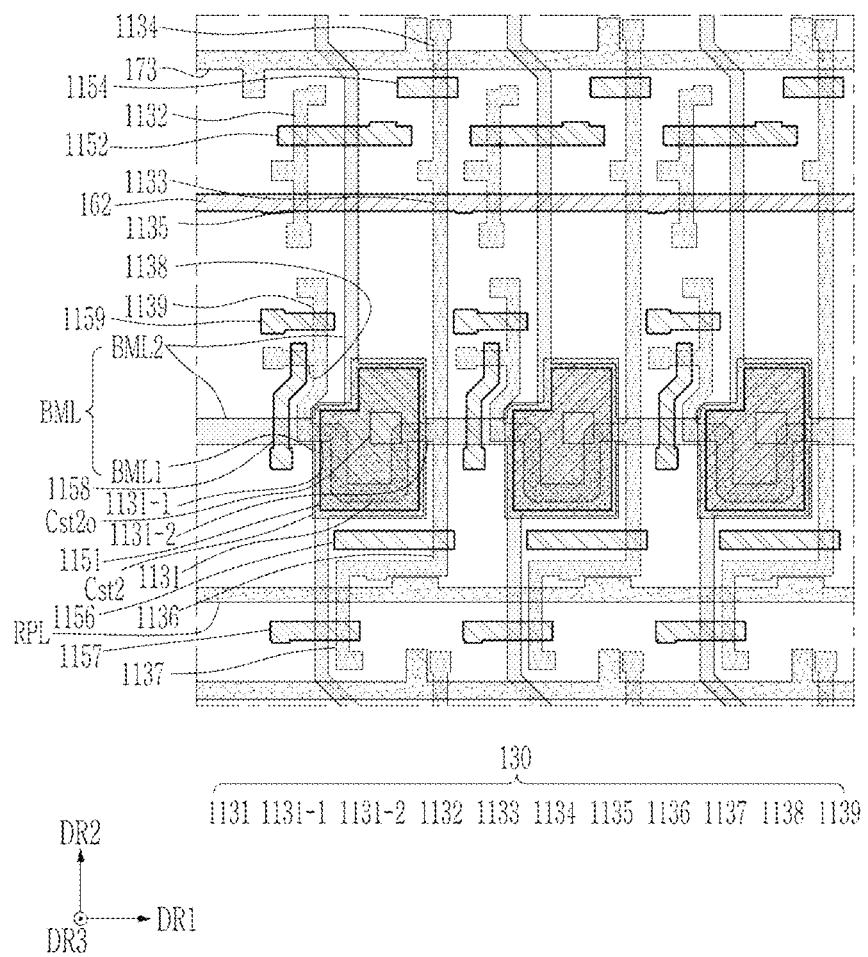

Referring to FIG. 16, a second gate conductive layer may be formed above or on the second gate insulating film 142. The second gate conductive layer includes a second storage electrode Cst2 of the storage capacitor Cst, the first initialization voltage line 173, and a repair line RPL.

The second storage electrode Cst2 of the storage capacitor Cst has the same or similar shape as that of the driving gate electrode 1151 of the driving transistor T1. The second storage electrode Cst2 of the storage capacitor Cst includes an opening Cst2o overlapping a portion of the driving gate electrode 1151 of the driving transistor T1. The second gate insulating film 142 disposed between a cross-section of the second storage electrode Cst2 and a cross-section of the driving gate electrode 1151 of the driving transistor T1 is also formed to have an opening at a portion corresponding to the opening Cst2o of the second storage electrode Cst2 so that the driving gate electrode 1151 of the driving transistor T1 may be exposed upward to be connected to an upper conductive layer. Here, the opening formed at the second gate insulating film 142 may be the same as an opening OP1 shown in FIG. 20, and may be formed in a process of forming the opening OP1 shown in FIG. 20. The driving gate electrode 1151 of the driving transistor T1 overlapping the second storage electrode Cst2 and the second gate insulating film 142 disposed between the driving gate electrode 1151 and the second storage electrode Cst2 form the storage capacitor Cst, and in this case, the driving gate electrode 1151 is the gate electrode of the driving transistor T1, and is also the first storage electrode of the storage capacitor Cst.

The first initialization voltage line 173 has a structure extending in the first direction DR1, and transfers the first initialization voltage VINT. The first initialization voltage line 173 has a plurality of protrusions, at least one of the protrusions is connected to the fourth transistor T4, and the other of the protrusions may have a structure connected to an additional initialization voltage line extending in the second direction DR2 to a conductive layer (e.g., a second data conductive layer) formed in a subsequent process.

In addition, the repair line RPL extending in the first direction DR1 may also be formed, and the repair line RPL may be normally floating, but when a pixel is desired to be repaired, the repair line RPL may serve to transfer an electric current to an anode of the pixel subject to repair through a short circuit.

The second gate conductive layer may include a metal such as copper (Cu), molybdenum (Mo), aluminum (Al), titanium (Ti), or the like, or a metal alloy, and may include or be defined by a single layer or multiple layers.

Referring to FIG. 28, a first interlayer insulating film 151 may be disposed above or on the second gate conductive layer. The first interlayer insulating film 151 may include an inorganic insulating film (or an inorganic insulating material) including a silicon oxide $SiO_x$, a silicon nitride ($SiN_x$), a silicon oxynitride ($SiO_xN_y$), or the like, and in an embodiment, the inorganic insulating film may be thickly formed. In an embodiment, the first interlayer insulating film 151 may include an organic material.

Figure 17:
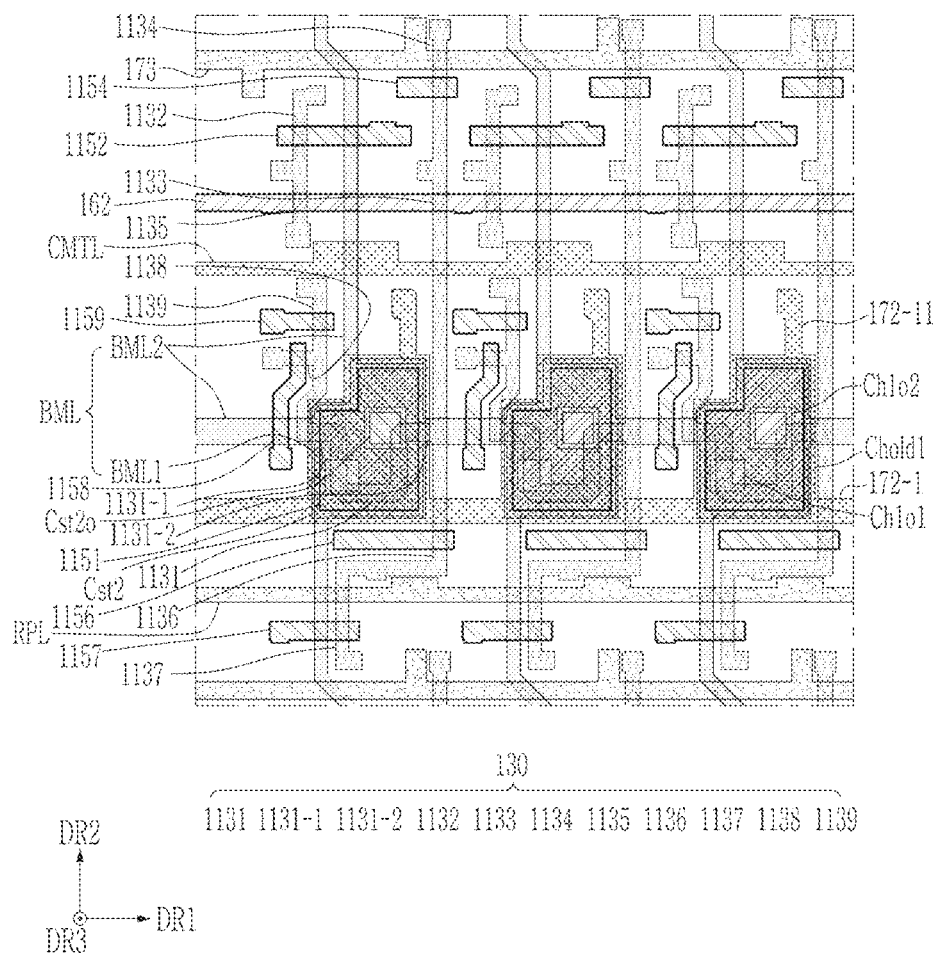

Referring to FIG. 17, an auxiliary conductive layer is formed above or on the first interlayer insulating film 151.

The auxiliary conductive layer includes a first driving voltage line 172-1 including a first hold electrode Chold1 of the hold capacitor Chold and an auxiliary electrode line CMTL.

The first hold electrode Chold1 of the hold capacitor Chold overlaps the driving gate electrode 1151 of the driving transistor T1 and the second storage electrode Cst2 on a plane. In addition, the first hold electrode Chold1 has a portion having the same or similar shape as that of the driving gate electrode 1151 of the driving transistor T1 and that of the second storage electrode Cst2 and the protrusion 172-11 protruding in the second direction DR2. The protrusion 172-11 is connected to the ninth transistor T9 through a subsequent process.

In addition, the first hold electrode Chold1 is provided with two openings Ch1o1 and Ch1o2.

The first opening Ch1o1 overlaps a portion of the second storage electrode Cst2 so that the second storage electrode Cst2 may be exposed. The first interlayer insulating film 151 disposed between a cross-section of the first hold electrode Chold1 and a cross-section of the second storage electrode Cst2 is also formed with an opening at a portion corresponding to the first opening Ch1o1 of the first hold electrode Chold1 so that the second storage electrode Cst2 is exposed upward to be connected to an upper conductive layer. Here, the opening formed at the first interlayer insulating film 151 may be the same as an opening OP2 shown in FIG. 20, and may be formed in the process of forming the opening OP2 shown in FIG. 20.

The second opening Ch1o2 overlaps a portion of the driving gate electrode 1151 of the driving transistor T1 and the opening Cst2o of the second storage electrode Cst2. The first interlayer insulating film 151 disposed between a cross-section of the first hold electrode Chold1 and a cross-section of the second storage electrode Cst2 is also provided with an opening at a portion corresponding to the second opening Ch1o2 of the first hold electrode Chold1 so that along with the opening Cst2o of the second storage electrode Cst2 and the opening formed at the second gate insulating film 142, the driving gate electrode 1151 of the driving transistor T1 is exposed upward to be connected to an upper conductive layer. Here, the opening formed at the second gate insulating film 142 and the opening formed at the first interlayer insulating film 151 may be the same as the opening OP1 shown in FIG. 20, and may be formed in the process of forming the opening OP1 shown in FIG. 20.

The second storage electrode Cst2 overlapping the first hold electrode Chold1 and the first interlayer insulating film 151 disposed between the second storage electrode Cst2 and the first hold electrode Chold1 form the hold capacitor Chold, and in this case, the second storage electrode Cst2 is the second electrode of the storage capacitor Cst, and is also the second hold electrode of the hold capacitor Chold.

Referring to FIG. 17, the first hold electrode Chold1 has a structure connected to a first hold electrode Chold1 adjacent to the first hold electrode Chold1 in the first direction DR1, and the wiring structure connected in the first direction DR1 constitutes the first driving voltage line 172-1. The driving voltage ELVDD is applied to the first driving voltage line 172-1, and the first driving voltage line 172-1 serves to transfer the driving voltage ELVDD in the first direction DR1.

The auxiliary electrode line CMTL may have a structure extending in the first direction DR1, and a voltage with a predetermined voltage level may be applied to the auxiliary electrode line CMTL or a voltage with a changed voltage level may be applied to the auxiliary electrode line CMTL. The auxiliary electrode line CMTL may overlap at least a portion of an oxide semiconductor layer of oxide transistors (the tenth transistor T10 and the eleventh transistor T11) formed in a subsequent process, and may also serve as a lower shielding layer. A characteristic of the oxide transistor may be changed based on the voltage applied to the auxiliary electrode line CMTL.

The auxiliary conductive layer may include a metal such as copper (Cu), molybdenum (Mo), aluminum (Al), titanium (Ti), or the like, or a metal alloy, and may include or be defined by a single layer or multiple layers.

Referring to FIG. 28, a second interlayer insulating film 152 may be disposed above or on the auxiliary conductive layer. The second interlayer insulating film 152 may include an inorganic insulating film (or an inorganic insulating material) including a silicon oxide ($SiO_x$), a silicon nitride ($SiN_x$), a silicon oxynitride ($SiO_xN_y$), or the like, and in an embodiment, the inorganic insulating film may be thickly formed. In an embodiment, the second interlayer insulating film 152 may include an organic material.

Figure 18:
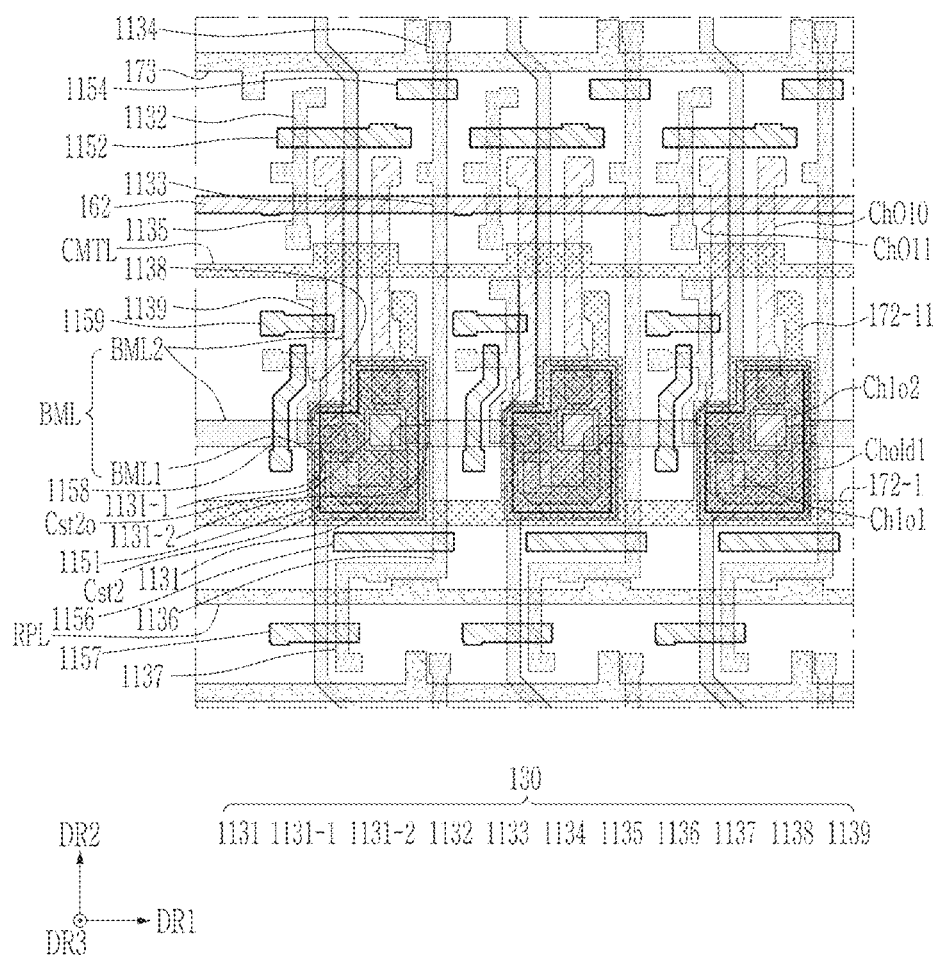

Referring to FIG. 18, an oxide semiconductor layer including a first oxide semiconductor ChO10 including a channel of the tenth transistor T10 and a second oxide semiconductor ChO11 including a channel of the eleventh transistor T11 is disposed above or on the second interlayer insulating film 152.

The first oxide semiconductor ChO10 may include a first region and a second region serving as the first and second electrodes of the tenth transistor T10 as well as the channel of the tenth transistor T10, and the second oxide semiconductor ChO11 may include first and second regions serving as the first and second electrodes of the eleventh transistor T11 as well as the channel of the eleventh transistor T11.

The first oxide semiconductor ChO10 and the second oxide semiconductor ChO11 are separated from each other, and each of the first oxide semiconductor ChO10 and the second oxide semiconductor ChO11 has a structure extending in the second direction DR2. In addition, the first oxide semiconductor ChO10 and the second oxide semiconductor ChO11 have a structure in which the first oxide semiconductor ChO10 and the second oxide semiconductor ChO11 cross and partially overlap the auxiliary electrode line CMTL disposed below the first oxide semiconductor ChO10 and the second oxide semiconductor ChO11 on a plane.

Opposing ends of the first oxide semiconductor ChO10 are connected to the second transistor T2 and the second storage electrode Cst2 through a subsequent process, and opposing ends of the second oxide semiconductor ChO11 are connected to the third transistor T3 and the driving gate electrode 1151 through a subsequent process.

Referring to FIG. 28, a third gate insulating film 143 is disposed above or on the oxide semiconductor layer.

In an embodiment, the third gate insulating film 143 may be disposed on entire surfaces of the oxide semiconductor layer and the second interlayer insulating film 152. In an alternative embodiment, the third gate insulating film 143 may not be disposed on the entire surfaces of the oxide semiconductor layer and the second interlayer insulating film 152, but may be disposed only on a partial area of the entire surfaces of the oxide semiconductor layer and the second interlayer insulating film 152. In such an embodiment, for example, the third gate insulating film 143 may have a structure that overlaps a channel of the oxide semiconductor layer but does not overlap a first region and a second region disposed at both sides of the channel.

The third gate insulating film 143 may include an inorganic insulating film (or an inorganic insulating material) including a silicon oxide ($SiO_x$), a silicon nitride ($SiN_x$), a silicon oxynitride ($SiO_xN_y$), or the like.

Figure 19:
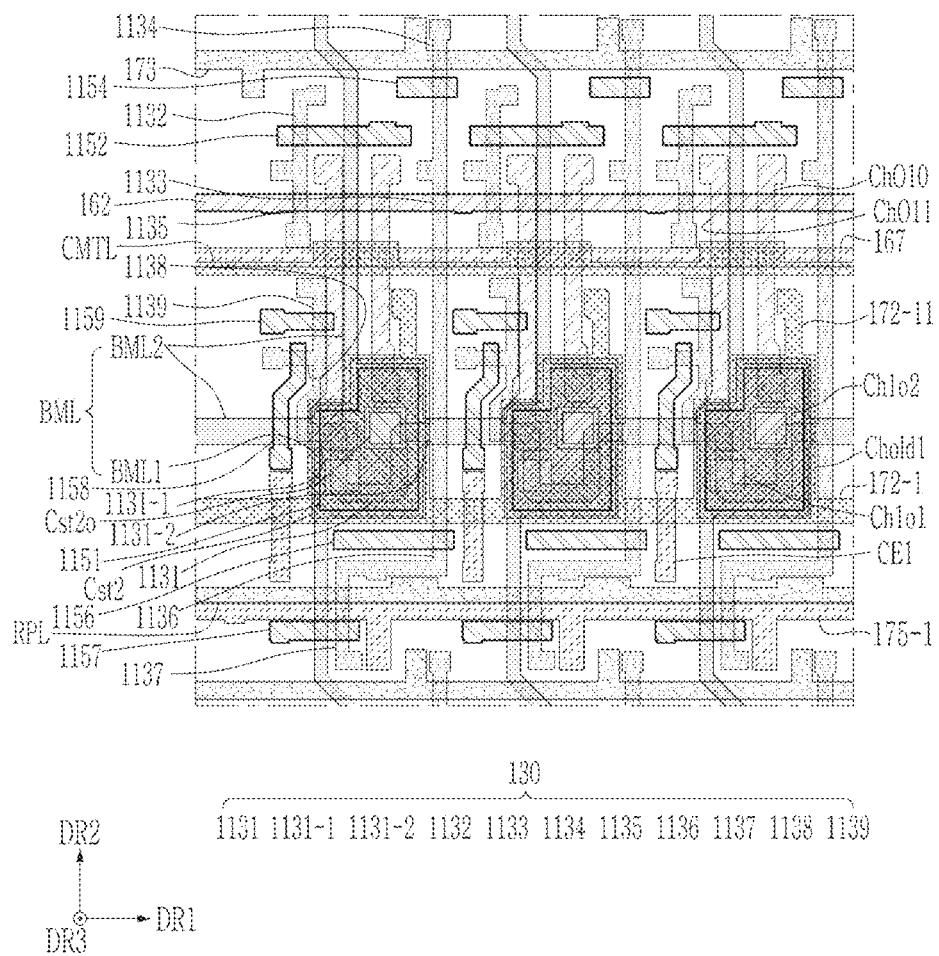

Referring to FIG. 19, a third gate conductive layer is disposed above or on the third gate insulating film 143.

The third gate conductive layer includes the (2-1)-th scan line 167 including a gate electrode of the tenth transistor T10 and the gate electrode of the eleventh transistor T11, a first second initialization voltage line (hereinafter, will be referred to as (2-1)-th initialization voltage line) 175-1 that transfers the second initialization voltage VAINT, and a connection member CE1.

The (2-1)-th scan line 167 extends in the first direction DR1, and has a structure in which the (2-1)-th scan line 167 crosses and overlaps the oxide semiconductor layer (the first oxide semiconductor ChO10 and the second oxide semiconductor ChO11) on a plane. A portion of the first oxide semiconductor ChO10 overlapping the (2-1)-th scan line 167 on a plane constitutes the channel of the tenth transistor T10, and a portion of the second oxide semiconductor ChO11 overlapping the (2-1)-th scan line 167 on a plane constitutes the channel of the eleventh transistor T11.

The (2-1)-th initialization voltage line 175-1 extends in the first direction DR1, and serves to transfer the second initialization voltage VAINT in the first direction DR1. The (2-1)-th initialization voltage line 175-1 has a plurality of protrusions, and the protrusion is connected to the seventh transistor T7 through a subsequent process.

The connection member CE1 extends in the second direction DR2, and electrically connects an eighth gate electrode that is the gate electrode 1158 of the eighth transistor T8 to the fourth scan line 166, which are adjacent each other, through a subsequent process.

The third gate conductive layer may include a metal such as copper (Cu), molybdenum (Mo), aluminum (Al), titanium (Ti), or the like, or a metal alloy, and may include or be defined by a single layer or multiple layers.

After the third gate conductive layer is formed, a portion of the oxide semiconductor layer covered by the third gate conductive layer is formed as a channel through a plasma treatment or doping process, and a portion of the oxide semiconductor layer not covered by the third gate conductive layer is conductive. As a result, a portion of the first oxide semiconductor ChO10 overlapping the (2-1)-th scan line 167 on a plane constitutes the channel of the tenth transistor T10, and opposing sides of the channel of the first oxide semiconductor ChO10 constitute a first region and a second region so that the first region and the second region respectively serve as the first electrode and the second electrode of the tenth transistor T10. In addition, a portion of the second oxide semiconductor ChO11 overlapping the (2-1)-th scan line 167 on a plane constitutes the channel of the eleventh transistor T11, and opposing sides of the channel of the second oxide semiconductor ChO11 constitute a first region and a second region so that the first region and the second region respectively serve as the first electrode and the second electrode of the eleventh transistor T11.

Referring to FIG. 28, a third interlayer insulating film 153 is disposed above or on the third gate conductive layer. The third interlayer insulating film 153 may have a single-layer or multi-layer structure. The third interlayer insulating film 153 may include an inorganic insulating material such as a silicon nitride ($SiO_x$), a silicon nitride ($SiN_x$), a silicon oxynitride ($SiO_xN_y$), or the like, or an organic material.

Figure 20:
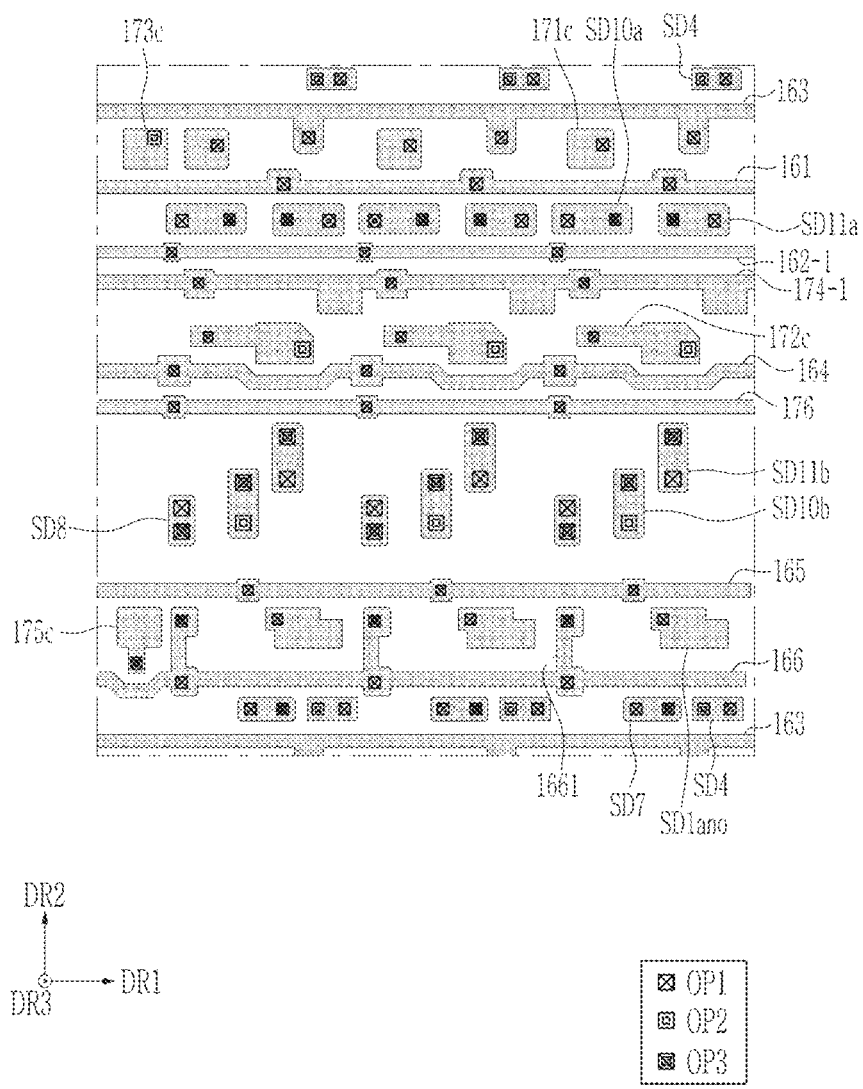
Figure 21:
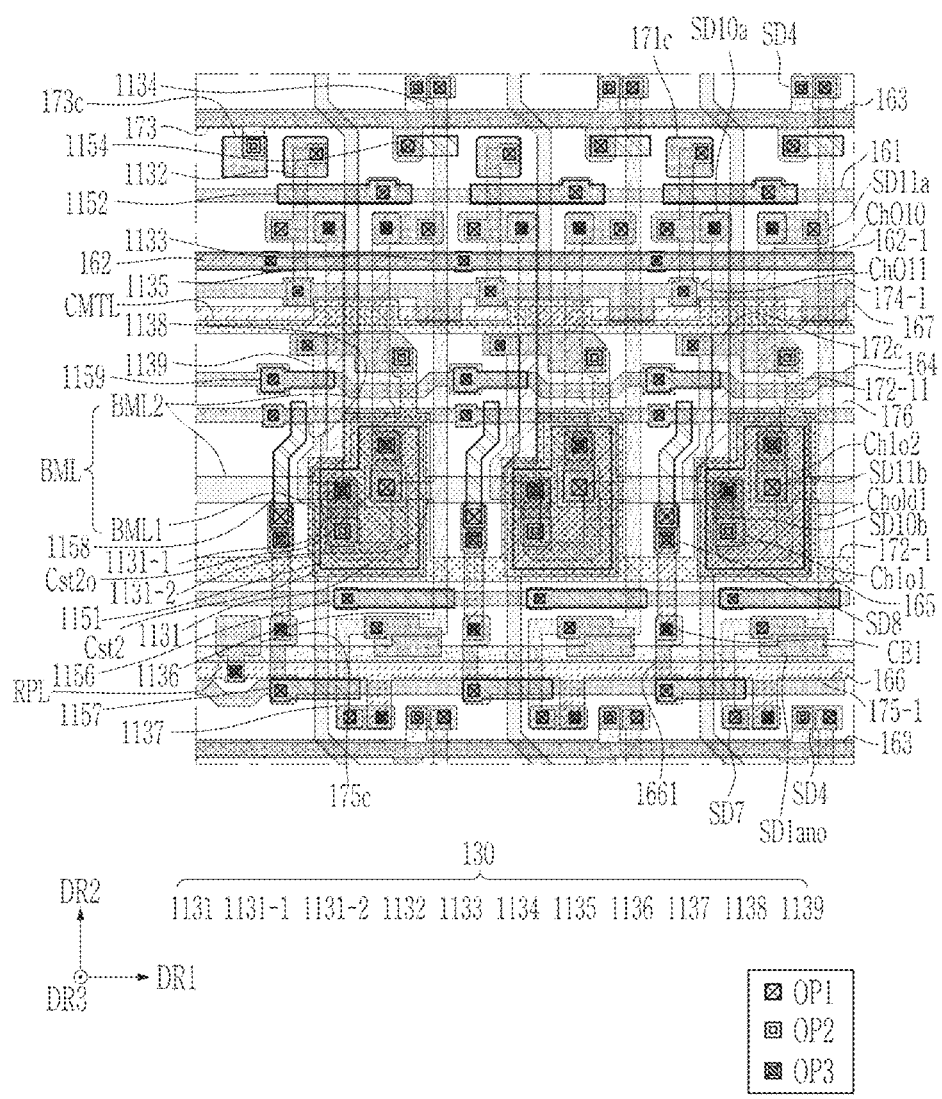

After the third interlayer insulating film 153 is stacked, a process of forming a plurality of openings is performed. Referring to FIG. 20, openings OP1, OP2, and OP3 formed at the third interlayer insulating film 153 and an insulating film below the third interlayer insulating film 153 and a first data conductive layer stacked after the formed openings OP1, OP2, and OP3 are illustrated. In FIG. 21, in addition to FIG. 19, the openings OP1, OP2, and OP3 and the first data conductive layer of FIG. 20 are shown together. That is, FIG. 20 is a plan view illustrating only the first data conductive layer and the openings OP1, OP2, and OP3 extracted from FIG. 21 because it may be difficult to easily recognize the first data conductive layer, and FIG. 21 is a plan view illustrating all layers below the first data conductive layer.

The plurality of openings OP1, OP2, and OP3 are formed at the third interlayer insulating film 153 and the insulating films (i.e., the first gate insulating film 141, the second gate insulating film 142, the first interlayer insulating film 151, the second interlayer insulating film 152, and the third gate insulating film 143) disposed below the third interlayer insulating film 153. Here, the plurality of openings OP1, OP2, and OP3 may be formed using different masks.

The opening OP1 may be formed at the third interlayer insulating film 153, the third gate insulating film 143, the second interlayer insulating film 152, the first interlayer insulating film 151, and the second gate insulating film 142, and may be additionally formed at the first gate insulating film 141 according to the opening OP1. As a result, the opening OP1 may expose the first gate conductive layer or the first semiconductor layer 130.

The opening OP2 may be formed at the third interlayer insulating film 153, the third gate insulating film 143, and the second interlayer insulating film 152, and may be additionally formed at the first interlayer insulating film 151. As a result, the opening OP2 may expose the second gate conductive layer or the auxiliary conductive layer.

The opening OP3 may be formed at the third interlayer insulating film 153, and may be additionally formed at the third gate insulating film 143. As a result, the opening OP3 may expose the oxide semiconductor layer or the third gate conductive layer.

The first data conductive layer is formed above or on the third interlayer insulating film 153 at which the plurality of openings OP1, OP2, and OP3 are formed.

Referring to FIGS. 20 and 21, the first data conductive layer may include a voltage line to which a constant voltage is applied, a signal line to which a signal (e.g., the scan signal or the light emitting signal) that changes every frame may be input, and a connection member.

The voltage line of the first data conductive layer of FIGS. 20 and 21 to which the constant voltage is applied includes a first reference voltage line 174-1 and the bias voltage line 176.

The signal line of the first data conductive layer of FIGS. 20 and 21 to which the scan signal may be input for each frame may include the first scan line 161 to which the first scan signal GW is applied, an additional second scan line 162-1 to which the second scan signal GC is additionally applied, the third scan line 163 to which the third scan signal GI is applied, the first light emitting signal line 164 to which the first light emitting signal EM1 is applied, the second light emitting signal line 165 to which the second light emitting signal EM2 is applied, and the fourth scan line 166 to which the fourth scan signal EB is applied.

The connection member of the first data conductive layer of FIGS. 20 and 21 may include various connection members 171c, 172c, 173c, 175c, SD4, SD7, SD8, SD10a, SD10b, SD11a, SD11b, and SD1ano.

First, the voltage line of the first data conductive layer will be described.

The first reference voltage line 174-1 extends in the first direction DR1, and is connected to the semiconductor 1135 through the opening OP1 to transfer the reference voltage VREF to the fifth transistor T5. The first reference voltage line 174-1 serves to transfer the reference voltage VREF in the first direction DR1.

The bias voltage line 176 extends in the first direction DR1, and is connected to the semiconductor 1138 through the opening OP1 to transfer the bias voltage Vbias to the eighth transistor T8.

Hereinafter, the signal line of the first data conductive layer will be described.

The first scan line 161 to which the first scan signal GW is applied extends in the first direction DR1, and is connected to the gate electrode 1152 of the second transistor T2 that is the second gate electrode through the opening OP1 to transfer the first scan signal GW to the gate electrode of the second transistor T2.

The additional second scan line 162-1 to which the second scan signal GC is additionally applied extends in the first direction DR1, and is connected to the second scan line 162 disposed at the first gate conductive layer through the opening OP1.

The third scan line 163 to which the third scan signal GI is applied extends in the first direction DR1, and is connected to the gate electrode 1154 of the fourth transistor that is a fourth gate electrode through the opening OP1.

The first light emitting signal line 164 to which the first light emitting signal EM1 is applied extends in the first direction DR1, and is connected to the gate electrode 1159 of the ninth transistor that is a ninth gate electrode through the opening OP1. The second light emitting signal line 165 to which the second light emitting signal EM2 is applied extends in the first direction, and is connected to the gate electrode 1156 of the sixth transistor that is a sixth gate electrode through the opening OP1.

The fourth scan line 166 to which the fourth scan signal EB is applied extends in the first direction DR1, and is connected to the gate electrode 1157 of the seventh transistor that is a seventh gate electrode integrally formed through the opening OP1. In addition, the fourth scan line 166 includes a protrusion 1661 that protrudes in the second direction DR2, and the protrusion 1661 is connected to the eighth gate electrode 1158 through the opening OP3 so that the fourth scan signal EB is applied to the gate electrode of the eighth transistor T8.

Hereinafter, the connection member of the first data conductive layer is described.

The connection member 171c is connected to the semiconductor 1132 of the first semiconductor layer 130 through the opening OP1.

The connection member 172c is electrically connected to the semiconductor 1139 of the first semiconductor layer 130 through the opening OP1, and is electrically connected to the protrusion 172-11 of the first hold electrode Chold1 through the opening OP2. As a result, the driving voltage ELVDD is transferred to the semiconductor 1139 of the first semiconductor layer 130.

The connection member 173c is electrically connected to the first initialization voltage line 173 through the opening OP2.

The connection member 175c is electrically connected to the (2-1)-th initialization voltage line 175-1 through the opening OP3.

The connection member SD4 is electrically connected to the semiconductor 1134 of the first semiconductor layer 130 through the opening OP1, and is electrically connected to the first initialization voltage line 173 through the opening OP2. As a result, the first initialization voltage VINT is transferred to the fourth transistor T4.

The connection member SD7 is electrically connected to the semiconductor 1137 of the first semiconductor layer 130 through the opening OP1, and is electrically connected to the (2-1)-th initialization voltage line 175-1 through the opening OP3. As a result, the second initialization voltage VAINT is transferred to the seventh transistor T7.

The connection member SD8 is electrically connected to the eighth gate electrode 1158 through the opening OP1, and is electrically connected to the connection member CE1 through the opening OP3. As a result, the connection member SD8 serves to electrically connect the eighth gate electrode 1158 to the fourth scan line 166.

The connection member SD10a is connected to the first oxide semiconductor ChO10 through the opening OP3, and is connected to the semiconductor 1132 of the first semiconductor layer 130 through the opening OP1. As a result, the tenth transistor T10 and the second transistor T2 are electrically connected to each other.

The connection member SD10b connects the opening OP3 to the first oxide semiconductor ChO10, and is connected to the second storage electrode Cst2 through the opening OP2 and the first opening Ch1o1 of the first hold electrode Chold1. As a result, the tenth transistor T10 and the second storage electrode Cst2 are electrically connected to each other.

The connection member SD11a is connected to the second oxide semiconductor ChO11 through the opening OP3, and is connected to the semiconductor 1133 of the first semiconductor layer 130 through the opening OP1. As a result, the eleventh transistor T11 and the third transistor T3 are electrically connected to each other.

The connection member SD11b connects the opening OP3 to the second oxide semiconductor ChO11, and is connected to the driving gate electrode 1151 through the opening OP1, the opening Cst2o of the second storage electrode Cst2, and the second opening Ch1o2 of the first hold electrode Chold1. As a result, the tenth transistor T10 and the driving gate electrode 1151 are electrically connected to each other.

The connection member SD1ano is connected to the semiconductor 1136 of the first semiconductor layer 130 through the opening OP1. An output current (or an output electric current) of the driving transistor T1 transferred through the sixth transistor T6 is applied to the connection member SD1ano.

The first data conductive layer may include a metal such as aluminum (Al), copper (Cu), molybdenum (Mo), titanium (Ti), or the like, or a metal alloy, and may include or be defined by a single layer or multiple layers.

Referring to FIG. 28, a first organic film 181 is disposed above or on the first data conductive layer. The first organic film 181 may be an organic insulating film including an organic material, and the organic material may include at least one material selected from polyimide, polyamide, acrylic resin, benzocyclobutene, and phenol resin.

Figure 22:
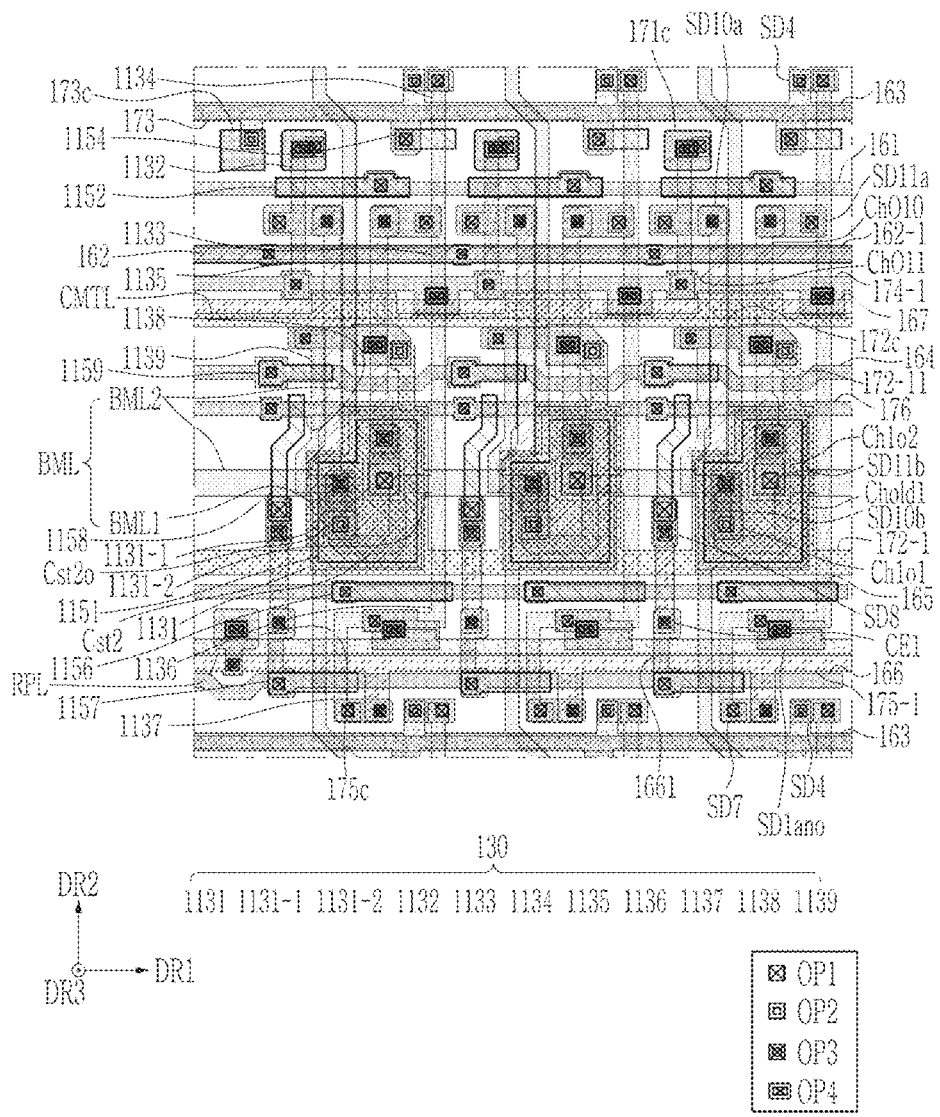

Referring to FIG. 22, an opening OP4 is formed or defined at the first organic film 181. The opening OP4 exposes the first data conductive layer, and allows the exposed first data conductive layer to be connected to the second data conductive layer.

Figure 23:
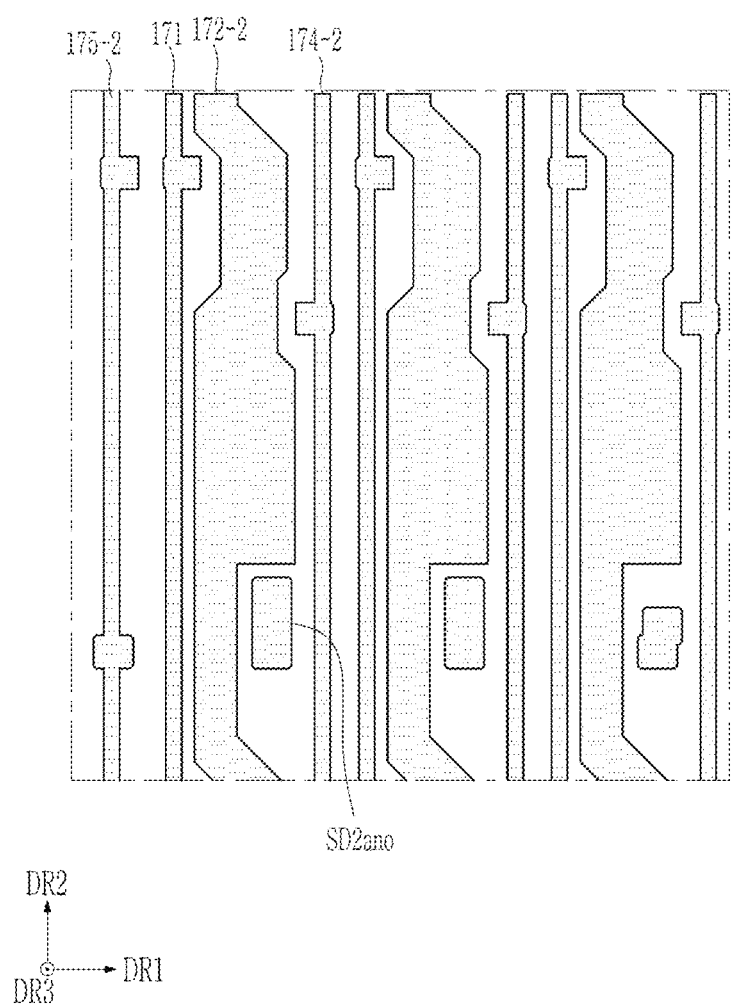
Figure 24:
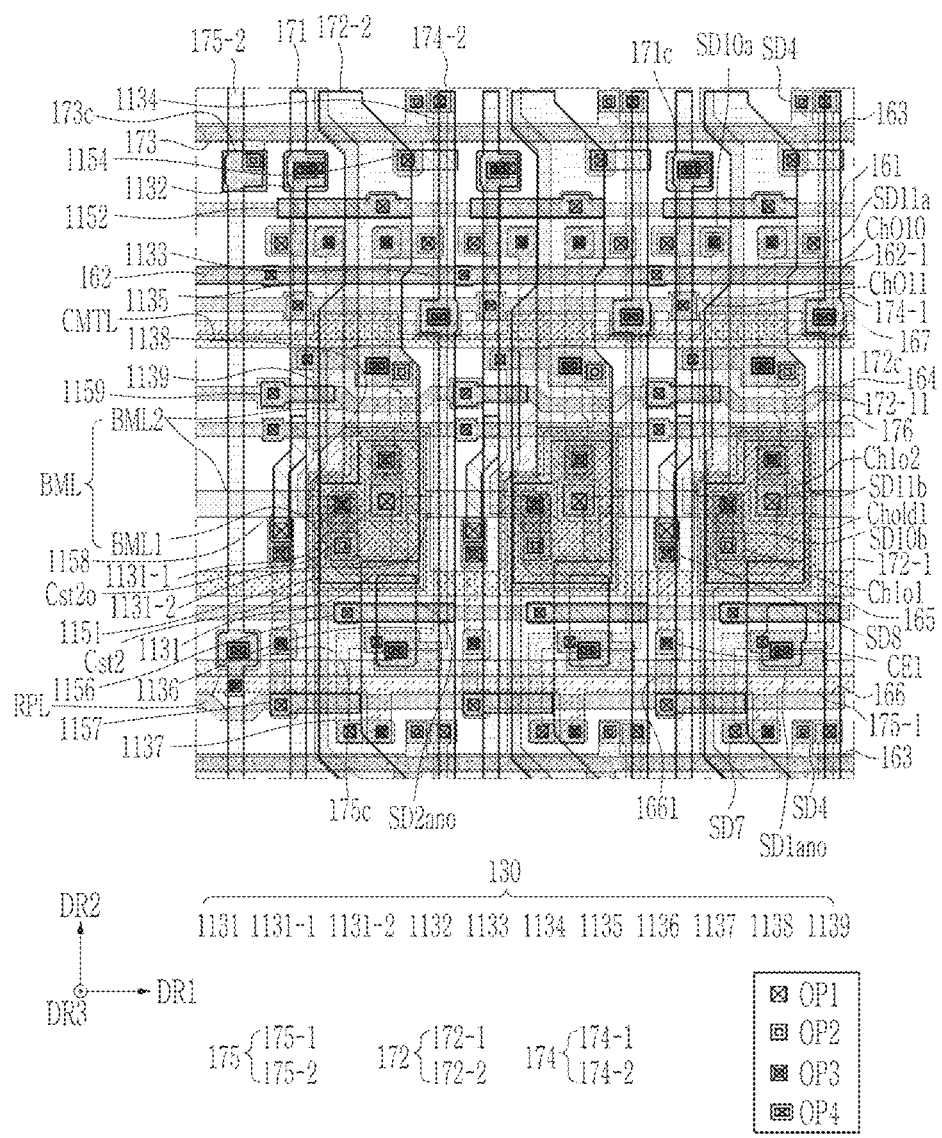

Referring to FIGS. 23 and 24, the second data conductive layer is disposed above or on the first organic film 181.

In FIG. 23, only the second data conductive layer stacked above or on the first organic film 181 are illustrated, and FIG. 23 shows only the second data conductive layer because it may be difficult to easily recognize the second data conductive layer in FIG. 24. FIG. 24 shows all layers below the second data conductive layer.

The second data conductive layer may include the data line 171 to which the data voltage VDATA is applied, an additional driving voltage line 172-2 to which the driving voltage ELVDD is transferred, a second reference voltage line 174-2 to which the reference voltage VREF is transferred, a second second initialization voltage line (hereinafter, will be referred to as (2-2)-th initialization voltage line) 175-2, and an anode connection member SD2ano.

Since the data line 171 extends in the second direction DR2, and is connected to the connection member 171c through the opening OP4, and the connection member 171c is connected to the semiconductor 1132 of the first semiconductor layer 130 through the opening OP1, the data voltage VDATA is transferred to a first electrode of the second transistor T2 through the connection member 171c.

The additional driving voltage line 172-2 extends in the second direction DR2, and is connected to the connection member 172c through the opening OP4. In addition, since the connection member 172c is connected to the semiconductor 1139 of the first semiconductor layer 130 and the protrusion 172-11 of the first hold electrode Chold1 through the openings OP1 and OP2, the connection member 172c transfers the driving voltage ELVDD in the second direction DR2 through the additional driving voltage line 172-2, and also transfers the driving voltage ELVDD in the first direction DR1 through the first driving voltage line 172-1. Due to the driving voltage line 172 having such a mesh structure, the driving voltage ELVDD may have a constant voltage value throughout the light emitting display device.

The second reference voltage line 174-2 extends in the second direction DR2, and is connected to the first reference voltage line 174-1 through the opening OP4, and the first reference voltage line 174-1 is connected to the semiconductor 1135 of the fifth transistor T5 through the opening OP1. In such an embodiment, the reference voltage VREF is transferred in the second direction through the second reference voltage line 174-2, and is also transferred in the first direction through the first reference voltage line 174-1. Due to the reference voltage line 174 having such a mesh structure, the reference voltage VREF may have a constant voltage value throughout the light emitting display device.

The (2-2)-th initialization voltage line 175-2 extends in the second direction DR2, and is connected to the connection member 175c through the opening OP4, and the connection member 175c is connected to the (2-1)-th initialization voltage line 175-1 through the opening OP3. In such an embodiment, the second initialization voltage VAINT is transferred in the second direction through the (2-2)-th initialization voltage line 175-2, and is also transferred in the first direction through the (2-1)-th initialization voltage line 175-1. Due to the second initialization voltage line 175 having such a mesh structure, the second initialization voltage VAINT may have a constant voltage value throughout the light emitting display device.

In an embodiment, an additional initialization voltage line (not shown) extending in the second direction DR2 instead of the (2-2)-th initialization voltage line 175-2 may be disposed at a portion where the (2-2)-th initialization voltage line 175-2 is disposed. The additional initialization voltage line may be connected to the connection member 173c through the opening OP4, and the connection member 173c may be connected to the first initialization voltage line 173 through the opening OP2. In such an embodiment, the first initialization voltage VINT is also transferred in the first direction through the first initialization voltage line 173 while the first initialization voltage VINT is transferred in the second direction through the additional initialization voltage line. Due to the first initialization voltage line having the mesh structure, the first initialization voltage VINT may have a constant voltage value throughout the light emitting display device.

The anode connection member SD2ano is connected to the connection member SD1ano through the opening OP4, and is connected to the semiconductor 1136 of the first semiconductor layer 130 through the opening OP1. As a result, an output current of the driving transistor T1 transferred through the sixth transistor T6 is transferred to the anode of the light emitting diode LED through the connection member SD1ano and the anode connection member SD2ano.

The second data conductive layer may include a metal such as aluminum (Al), copper (Cu), molybdenum (Mo), titanium (Ti), or the like, or a metal alloy, and may include or be defined by a single layer or multiple layers.

Figure 25:
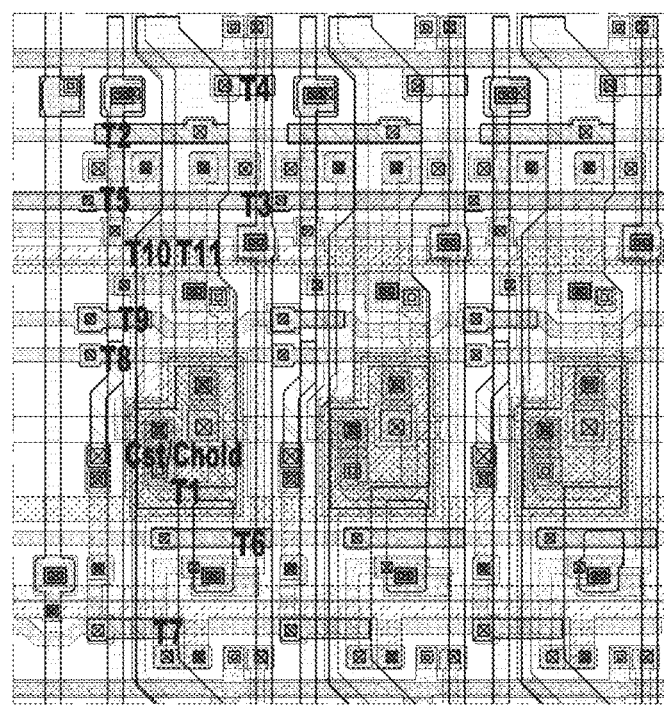
Figure 25:
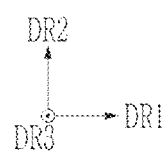

In FIG. 25, to more clearly identify a portion where each element (e.g., the transistor or the capacitor) is disposed in the pixel, each element is shown in a bold letter.

Referring to FIG. 28, a second organic film 182 is disposed above or on the second data conductive layer. The second organic film 182 may be an organic insulating film including an organic material, and the organic material may include at least one material selected from polyimide, polyamide, acrylic resin, benzocyclobutene, and phenol resin.

Figure 26:
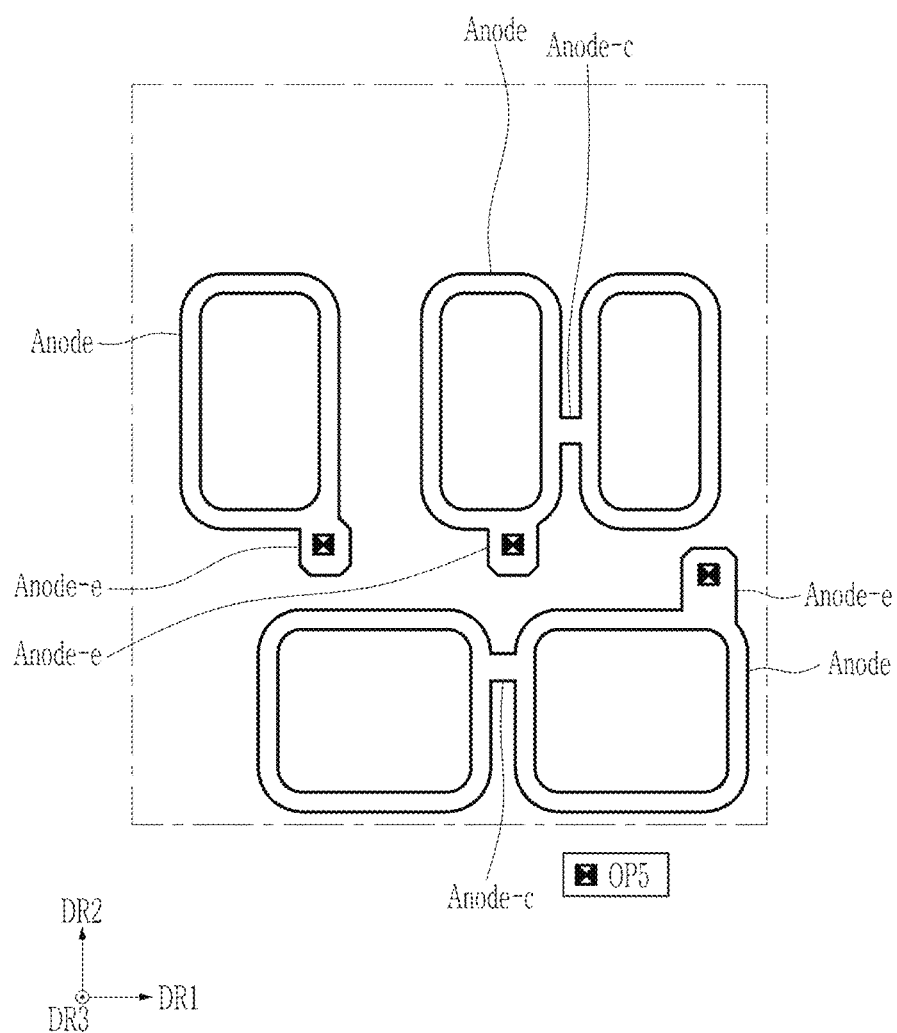
Figure 27:
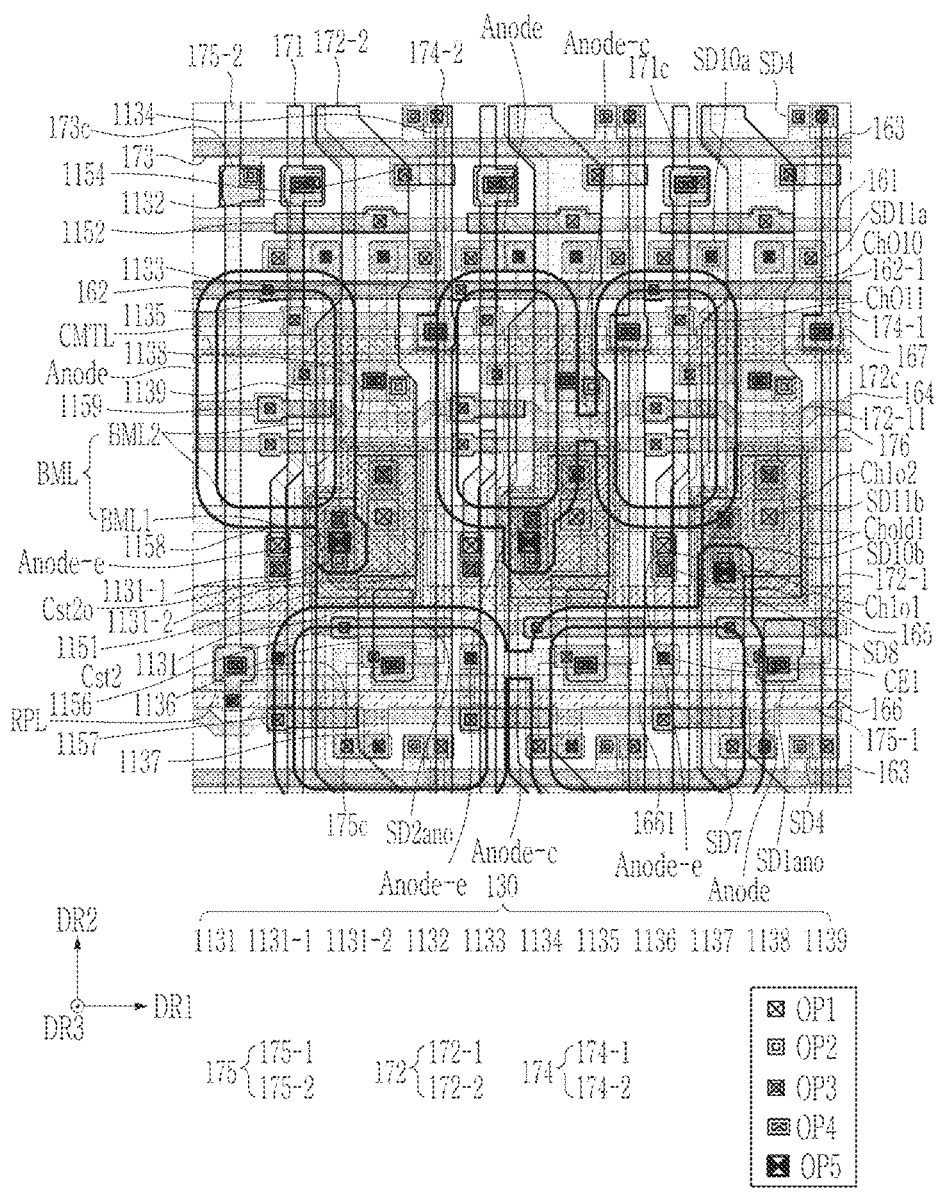

Referring to FIGS. 26 and 27, a plurality of anodes Anode are disposed above or on the second organic film 182.

In FIG. 26, only an opening OP5 formed at the second organic film 182 and the anode Anode stacked on the second organic film 182 are illustrated, and FIG. 26 shows only the anode Anode because it may be difficult to easily recognize the anode Anode in FIG. 27. FIG. 27 shows all layers below the anode Anode.

In FIGS. 26 and 27, three anodes Anode are illustrated.

The three anodes Anode may have different shapes from each other, and may be elements of red, green, and blue light emitting diodes (LEDs). In addition, two of the anodes Anode shown in FIGS. 26 and 27 are formed in a structure in which the two anodes are connected to each other by a connection portion Anode-c. The anode Anode of the structure connected as described above has an effect of reducing power consumption. In an embodiment, some or all of the anodes Anode may have a structure in which two or more anodes are connected to each other. In addition, in an embodiment, all anodes Anode may also have a structure that is not divided into two portions. In addition, each anode Anode may include an extension portion Anode-e to receive an electric current of the driving transistor T1 through the extension portion Anode-e.

Each anode Anode is connected to the anode connection member SD2ano through the opening OP5, is connected to the connection member SD1ano through the opening OP4, and is connected to the semiconductor 1136 of the first semiconductor layer 130 through the opening OP1. As a result, an output current of the driving transistor T1 transferred through the sixth transistor T6 is transferred to the anode Anode of the light emitting diode LED through the connection member SD1ano and the anode connection member SD2ano.

Although the planar structure of the pixel circuit portion and the anode Anode is illustrated in FIGS. 13 to 27, referring to FIG. 28, a pixel defining film 380, a functional layer FL, a cathode Cathode, and an encapsulation layer 400 are disposed on the anode Anode.

A detailed stack structure up to the encapsulation layer 400 will be described in detail with reference to FIG. 28.

FIG. 28 is a cross-sectional view of the light emitting display device according to an alternative embodiment.

Referring to FIG. 28, the overlapping electrode BML is disposed on the substrate 110.

The substrate 110 may include a rigid material such as glass or the like that does not bend, or may include a flexible material such as plastic or polyimide that may bend. The flexible substrate may have a structure in which a double-layered structure including polyimide and a barrier layer including or formed of an inorganic insulating material on the polyimide is formed twice.

The overlapping electrode BML may be formed at a position overlapping the channel of the driving transistor T1 of a subsequent first semiconductor layer 130 on a plane, and is also referred to as the lower shielding layer. The overlapping electrode BML may also overlap another portion of the first semiconductor layer 130. The overlapping electrode BML may include a metal such as copper (Cu), molybdenum (Mo), aluminum (Al), titanium (Ti), or the like, or a metal alloy.

The buffer layer 111 covering the substrate 110 and the overlapping electrode BML is disposed on the substrate 110 and the overlapping electrode BML. The buffer layer 111 serves to block penetration of an impurity element into the first semiconductor layer 130, and may be an inorganic insulating film including a silicon oxide ($SiO_x$), a silicon nitride ($SiN_x$), a silicon oxynitride ($SiO_xN_y$), or the like.

The first semiconductor layer 130 including or formed of a silicon semiconductor (e.g., a polycrystalline semiconductor) is disposed on the buffer layer 111. The first semiconductor layer 130 includes a channel of a polycrystalline transistor LTPS TFT including the driving transistor T1 and first and second regions disposed at opposing sides of the channel. Here, the polycrystalline transistor LTPS TFT includes not only the driving transistor T1 but also the second transistor T2, the third transistor T3, the fourth transistor T4, the fifth transistor T5, the sixth transistor T6, the seventh transistor T7, the eighth transistor T8, and the ninth transistor T9. In addition, the polycrystalline transistor LTPS TFT may include regions having a conductive layer characteristic by plasma treatment or doping at opposing sides of each channel that serve as the first and second electrodes of the transistor.

The first gate insulating film 141 may be disposed on the first semiconductor layer 130. The first gate insulating film 141 may be an inorganic insulating film including a silicon oxide ($SiO_x$), a silicon nitride ($SiN_x$), a silicon oxynitride ($SiO_xN_y$), or the like.

In an embodiment, the first gate conductive layer including a gate electrode of the polycrystalline transistor LTPS TFT may be disposed above or on the first gate insulating film 141. The first gate conductive layer includes the driving gate electrode 1151 of the driving transistor T1. Here, the driving gate electrode 1151 may also serve as the first storage electrode of the storage capacitor Cst. The first gate conductive layer may include a metal such as copper (Cu), molybdenum (Mo), aluminum (Al), titanium (Ti), or the like, or a metal alloy, and may include or be defined by a single layer or multiple layers.

After the first gate conductive layer is formed, the plasma treatment or doping process may be performed on the formed first gate conductive layer to make an exposed region of the first semiconductor layer 130 conductive. That is, the first semiconductor layer 130 covered by the first gate conductive layer may not be conductive, and the portion of the first semiconductor layer 130 not covered by the first gate conductive layer may have the same characteristic as that of the conductive layer.

The second gate insulating film 142 may be disposed on the first gate conductive layer and the first gate insulating film 141. The second gate insulating film 142 may be an inorganic insulating film including a silicon oxide ($SiO_x$), a silicon nitride ($SiN_x$), a silicon oxynitride ($SiO_xN_y$), or the like.

In an embodiment, the second gate conductive layer including the second storage electrode Cst2 of the storage capacitor Cst may be disposed on the second gate insulating film 142. The second storage electrode Cst2 of the storage capacitor Cst overlaps the driving gate electrode 1151 of the driving transistor T1 to constitute the storage capacitor Cst. In addition, the second storage electrode Cst2 may also serve as the second hold electrode of the hold capacitor Chold. The second gate conductive layer may include a metal such as copper (Cu), molybdenum (Mo), aluminum (Al), titanium (Ti), or the like, or a metal alloy, and may include or be defined by a single layer or multiple layers.

The first interlayer insulating film 151 may be disposed above or on the second gate conductive layer. The first interlayer insulating film 151 may include an inorganic insulating film (or an inorganic insulating material) including a silicon oxide ($SiO_x$), a silicon nitride ($SiN_x$), a silicon oxynitride ($SiO_xN_y$), or the like, and in an embodiment, the inorganic insulating film may be thickly formed.

In an embodiment, the auxiliary conductive layer including the first hold electrode Chold1 of the hold capacitor Chold and the auxiliary electrode line CMTL is disposed on the first interlayer insulating film 151. The first hold electrode Chold1 of the hold capacitor Chold overlaps the second storage electrode Cst2 to constitute the hold capacitor Chold. In addition, the auxiliary electrode line CMTL is disposed below an oxide transistor Oxide TFT, and overlaps the oxide transistor Oxide TFT, and a characteristic of the oxide transistor Oxide TFT may be changed according to the voltage applied to the auxiliary electrode line CMTL. The auxiliary conductive layer may include a metal such as copper (Cu), molybdenum (Mo), aluminum (Al), titanium (Ti), or the like, or a metal alloy, and may include or be defined by a single layer or multiple layers.

The second interlayer insulating film 152 may be disposed above or on the auxiliary conductive layer. The second interlayer insulating film 152 may include an inorganic insulating film (or an inorganic insulating material) including a silicon oxide ($SiO_x$), a silicon nitride ($SiN_x$), a silicon oxynitride ($SiO_xN_y$), or the like, and in an embodiment, the inorganic insulating film may be thickly formed.

An oxide semiconductor layer including a channel, a first region, and a second region of the oxide transistor Oxide TFT, the first oxide semiconductor ChO10 of the tenth transistor T10, and the like may be disposed above or on the second interlayer insulating film 152.

The third gate insulating film 143 may be disposed above or on the oxide semiconductor layer. The third gate insulating film 143 may be disposed on entire surfaces of the oxide semiconductor layer and the second interlayer insulating film 152. The third gate insulating film 143 may include an inorganic insulating film (or an inorganic insulating material) including a silicon oxide ($SiO_x$), a silicon nitride ($SiN_x$), a silicon oxynitride ($SiO_xN_y$), or the like.

The third gate conductive layer including the (2-1)-th scan line 167 including a gate electrode of an oxide transistor may be disposed above or on the third gate insulating film 143. The gate electrode of the oxide transistor may overlap a channel of the oxide transistor. The third gate conductive layer may include a metal such as copper (Cu), molybdenum (Mo), aluminum (Al), titanium (Ti), or the like, or a metal alloy, and may include or be defined by a single layer or multiple layers.

After the third gate conductive layer is formed, a plasma treatment or doping process may be performed to make an exposed region of the oxide transistor conductive. That is, the oxide transistor covered by the third gate conductive layer may not be conductive, and a portion of the oxide transistor not covered by the third gate conductive layer may have the same characteristic as that of the conductive layer.

The third interlayer insulating film 153 may be disposed above or on the third gate conductive layer. The third interlayer insulating film 153 may have a single-layer or multi-layer structure. The third interlayer insulating film 153 may include an inorganic insulating material such as a silicon nitride ($SiO_x$), a silicon nitride ($SiN_x$), a silicon oxynitride ($SiO_xN_y$), or the like, or an organic material.

The first data conductive layer including a plurality of connection members that may be connected to first and second regions of the polycrystalline transistor LTPS TFT and the oxide transistor Oxide TFT may be disposed above or on the third interlayer insulating film 153. The connection member SD1ano among the plurality of connection members disposed at the first data conductive layer is illustrated in FIG. 28. The first data conductive layer may include a metal such as aluminum (Al), copper (Cu), molybdenum (Mo), titanium (Ti), or the like, or a metal alloy, and may include or be defined by a single layer or multiple layers.

The first organic film 181 may be disposed above or on the first data conductive layer. The first organic film 181 may be an organic insulating film including an organic material, and the organic material may include at least one material selected from polyimide, polyamide, acrylic resin, benzocyclobutene, and phenol resin.

The second data conductive layer including the anode connection member SD2ano may be disposed on the first organic film 181. The second data conductive layer may also include a data line or a driving voltage line. The second data conductive layer may include a metal such as aluminum (Al), copper (Cu), molybdenum (Mo), titanium (Ti), or the like, or a metal alloy, and may include or be defined by a single layer or multiple layers.

The second organic film 182 is disposed above or on the second data conductive layer, and an opening is formed at the second organic film 182 to electrically connect the anode connection member SD2ano and the anode Anode. The second organic film 182 may include at least one material selected from polyimide, polyamide, acrylic resin, benzocyclobutene, and phenol resin.

The anode Anode constituting the light emitting diode is disposed on the second organic film 182. The anode Anode may be formed of (or defined by) a single layer including a transparent conductive oxide film or a metal material, or multiple layers, each layer therein including the transparent conductive oxide film or the metal material. The transparent conductive oxide film may include indium tin oxide (ITO), poly-ITO, indium zinc oxide (IZO), indium gallium zinc oxide (IGZO), indium tin zinc oxide (ITZO), or the like. The metal material may include silver (Ag), molybdenum (Mo), copper (Cu), gold (Au), aluminum (Al), or the like.

A pixel defining film 380 that covers at least a portion of the anode Anode with an opening OP exposing the anode Anode may be disposed on the anode Anode. The pixel defining film 380 may be a black pixel defining film including or formed of an organic material having a black color so that light applied from the outside is not reflected back to the outside, and may include or be formed of a transparent organic material in an embodiment. A spacer (not shown) may be disposed above or on the pixel defining film 380, and the spacer may also include or be formed of the same material as the pixel defining film 380.

A functional layer FL and a cathode Cathode are sequentially formed on the anode Anode and the pixel defining film 380, and in a display area, the functional layer FL and the cathode Cathode may be disposed at an entire area. A light emitting layer (or an emission layer) EML is disposed between the functional layers FL, and the light emitting layer EML may be disposed only within the opening OP of the pixel defining film 380. Hereinafter, the functional layer FL and the light emitting layer EML may be collectively referred to as an intermediate layer. The functional layer FL may include at least one of an auxiliary layer such as an electron injection layer, an electron transfer layer, a hole transfer layer, and a hole injection layer, the hole injection layer and the hole transfer layer may be disposed at an lower portion of the light emitting layer EML, and the electron transfer layer and the electron injection layer may be disposed at an upper portion of the light emitting layer EML.

The encapsulation layer 400 is disposed on the cathode Cathode. The encapsulation layer 400 includes at least one inorganic film and at least one organic film, and may have a triple layer structure including a first inorganic encapsulation layer, an organic encapsulation layer, and a second inorganic encapsulation layer in an embodiment. The encapsulation layer 400 may protect the light emitting layer EML from moisture, oxygen, or the like that may be introduced from the outside. According to an embodiment, the encapsulation layer 400 may include a structure in which an inorganic layer and an organic layer are sequentially further stacked.

Although not shown in the drawings, according to an embodiment, a sensing insulating layer and a plurality of sensing electrodes for touch sensing may be disposed above or on the encapsulation layer 400.

In addition, a light blocking member and a color filter layer may also be disposed above or on the encapsulation layer 400. In an embodiment, a color conversion layer may also be formed instead of the color filter layer. The color conversion layer may include a quantum dot.

In the above description, an overall structure of the light emitting display device and the pixel has been described in detail.

Hereinafter, a circuit structure of one pixel of a light emitting display device according to another alternative embodiment will be described with reference to FIG. 29.

Figure 29:
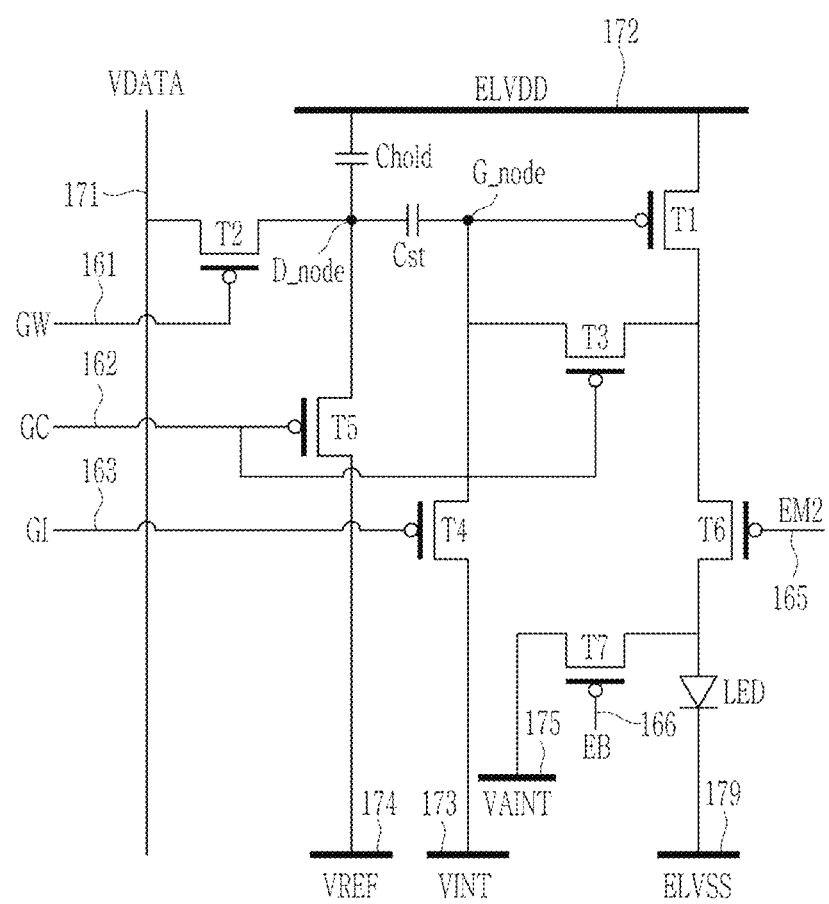
FIG. 29 is an equivalent circuit diagram of one pixel included in a light emitting display device according to another alternative embodiment.

FIG. 29 is an equivalent circuit diagram of the one pixel included in the light emitting display device according to another alternative embodiment.

Referring to FIG. 29, the one pixel includes a light emitting diode LED and a pixel circuit portion driving the LED, and the pixel circuit portion is disposed in a matrix form. The pixel circuit portion includes all elements other than the LED of FIG. 29, and the pixel circuit portion of the pixel according to the embodiment of FIG. 29 includes a driving transistor T1, a second transistor T2, a third transistor T3, a fourth transistor T4, a fifth transistor T5, a sixth transistor T6, a seventh transistor T7, a storage capacitor Cst, and a hold capacitor Chold.

In addition, a first scan line 161 to which a first scan signal GW is applied, a second scan line 162 to which a second scan signal GC is applied, a third scan line 163 to which a third scan signal GI is applied, a light emitting signal line 165 to which a light emitting signal (or an emission signal) EM2 is applied, a fourth scan line 166 to which a fourth scan signal EB is applied, and a data line 171 to which a data voltage VDATA is applied may be connected to the pixel circuit portion. In addition, the pixel may be connected to a first driving voltage line 172 to which a driving voltage (hereinafter also referred to as a first driving voltage) ELVDD is applied, a second driving voltage line 179 to which a driving low voltage (hereinafter also referred to as a second driving voltage) ELVSS is applied, a first initialization voltage line 173 to which a first initialization voltage VINT is applied, a second initialization voltage line 175 to which a second initialization voltage VAINT is applied, and a reference voltage line 174 to which a reference voltage VREF is applied.

A structure of the pixel will be described below focusing on each element (e.g., the transistor, the capacitor, or the light emitting diode) included in the pixel.

The driving transistor (hereinafter also referred to as a first transistor) T1 includes a gate electrode (hereinafter also referred to as a driving gate electrode) connected to a first electrode of the storage capacitor Cst, a first electrode (or an input side electrode) connected to the driving voltage line 172, and a second electrode (or an output side electrode) outputting an electric current in response to a voltage of the driving gate electrode.

The driving gate electrode of the driving transistor T1 is connected to a second electrode (or an output side electrode) of the third transistor T3 and the first electrode of the storage capacitor Cst. Here, a node to which the first electrode of the storage capacitor Cst, the driving gate electrode, and the second electrode of the third transistor T3 are connected is referred to as a gate node G_node. The first electrode of the driving transistor T1 receives the driving voltage ELVDD, and the second electrode of the driving transistor T1 is connected to a first electrode (an input side electrode) of the third transistor T3 and a first electrode (an input side electrode) of the sixth transistor T6. An output current (or an output electric current) of the driving transistor T1 passes through the sixth transistor T6 and is transferred to the light emitting diode LED so that the light emitting diode LED emits light. Luminance of light emitted from the light emitting diode LED is determined based on a magnitude of the output current of the driving transistor T1. In an embodiment, the driving transistor T1 may further include an overlapping electrode (see BML of FIG. 28) overlapping at least a portion (e.g., a channel) of a semiconductor (e.g., a polycrystalline semiconductor) of the driving transistor.

The second transistor (hereinafter also referred to as a data input transistor) T2 includes a gate electrode connected to the first scan line 161 to which the first scan signal GW is applied, a first electrode (an input side electrode) connected to the data line 171 to which the data voltage VDATA is applied, and a second electrode (an output side electrode) connected to a second electrode of the fifth transistor T5, a second electrode of the storage capacitor Cst, and a second electrode (an output side electrode) of the hold capacitor Chold. Here, since a node to which the second electrode of the storage capacitor Cst and the second electrode of the hold capacitor Chold are connected is a node to which the data voltage VDATA is transferred, the node is also referred to as a data node D_node hereinafter. The second transistor T2 inputs the data voltage VDATA into the pixel in response to the first scan signal GW, and stores the data voltage VDATA in the second electrode of the storage capacitor Cst that is the data node D_node.

The third transistor (hereinafter also referred to as a first compensation transistor) T3 includes a gate electrode connected to the second scan line 162 to which the second scan signal GC is applied, a first electrode (an input side electrode) connected to the second electrode of the driving transistor T1 and the first electrode of the sixth transistor T6, and a second electrode (an output side electrode) connected to the gate electrode of the driving transistor T1 and the first electrode of the storage capacitor Cst. The third transistor T3 forms a compensation path that compensates for a threshold voltage of the driving transistor T1 so that the threshold voltage of the driving transistor T1 is stored in the first electrode of the storage capacitor Cst to compensate for the threshold voltage of the driving transistor T1. As a result, even if the threshold voltage of the driving transistor T1 included in each pixel is different, the driving transistor T1 may output a constant output current corresponding to an applied data voltage VDATA.

The fourth transistor (hereinafter also referred to as a first initialization transistor) T4 includes a gate electrode connected to the third scan line 163 to which the third scan signal GI is applied, a first electrode connected to the first initialization voltage line 173 that delivers (or transfers) the first initialization voltage VINT, and a second electrode connected to the second electrode of the third transistor T3, the gate electrode of the driving transistor T1, and the first electrode of the storage capacitor Cst. The fourth transistor T4 transfers the first initialization voltage VINT within the pixel to serve to initialize each of the second electrode of the third transistor T3, the gate electrode of the driving transistor T1, and the first electrode of the storage capacitor Cst with the first initialization voltage VINT.

The fifth transistor (hereinafter also referred to as a data node initialization transistor) T5 includes a gate electrode connected to the second scan line 162 to which the second scan signal GC is applied, a first electrode connected to the reference voltage line 174 that delivers (or transfers) the reference voltage VREF, and a second electrode connected to the second electrode of the second transistor T2 that is the data node D_node, the second electrode of the storage capacitor Cst, and the second electrode of the hold capacitor Chold. The fifth transistor T5 serves to initialize the second electrode of the storage capacitor Cst and the second electrode of the hold capacitor Chold by changing a voltage of each of the second electrode of the storage capacitor Cst and the second electrode of the hold capacitor Chold to the reference voltage VREF. In an alternative embodiment, the driving voltage ELVDD may be applied to the first electrode of the fifth transistor T5 instead of the reference voltage VREF.

The sixth transistor (hereinafter also referred to as a current transfer transistor) T6 includes a gate electrode connected to the second light emitting signal line 165 to which the second light emitting signal EM2 is applied, a first electrode (an input side electrode) connected to the second electrode of the driving transistor T1 and the first electrode of the third transistor T3, and a second electrode (an output side electrode) connected to an anode of the light emitting diode LED and a second electrode of the seventh transistor T7. The sixth transistor T6 serves to transmit or block the output current of the driving transistor T1 to or from the light emitting diode LED based on the second light emitting signal EM2.

The seventh transistor (hereinafter also referred to as an anode initialization transistor) T7 includes a gate electrode connected to the fourth scan line 166 to which the fourth scan signal EB is applied, a first electrode connected to the second initialization voltage line 175 that delivers (or transfers) the second initialization voltage VAINT, and a second electrode connected to the anode of the light emitting diode LED and the second electrode of the sixth transistor T6. The seventh transistor T7 serves to initialize the anode of the light emitting diode LED with the second initialization voltage VAINT. In an embodiment, the seventh transistor T7 may be an oxide transistor including an oxide semiconductor, and may be formed as an n-type transistor to be turned on by a high level voltage and to be turned off by a low level voltage. In an alternative embodiment, the gate electrode of the seventh transistor T7 may be connected to a separate signal line instead of the fourth scan line 166.

In an embodiment, as shown in FIG. 29, all transistors may be formed as p-type transistors formed using a polycrystalline semiconductor, and the p-type transistor, which is a polycrystalline transistor, may be turned on by a low level voltage and may be turned off by a high level voltage. In an embodiment, all or some of the transistors may be formed as n-type transistors formed using an oxide semiconductor, and in an embodiment, the seventh transistor T7 may be an n-type transistor including an oxide semiconductor, and may be turned on by a high level voltage and may be turned off by a low level voltage.

The storage capacitor (hereinafter also referred to as a voltage transfer capacitor or a first capacitor) Cst includes the first electrode (hereinafter also referred to as a first storage electrode) connected to the gate electrode of the driving transistor T1 and the second electrode of the third transistor T3 that are the gate node G_node, and the second electrode (hereinafter also referred to as a second storage electrode) connected to the second electrode of the second transistor T2, the second electrode of the fifth transistor T5, and the second electrode of the hold capacitor Chold that are the data node D_node. The storage capacitor Cst receives the data voltage VDATA through the second transistor T2 or the reference voltage VREF through the fifth transistor T5 to serve to change a voltage of the gate electrode of the driving transistor T1 and to maintain the received voltage until a next voltage is transferred. In the pixel according to an embodiment, the data voltage VDATA is not directly transferred to the gate electrode of the driving transistor T1 but is transferred through the storage capacitor Cst. This is a method of indirectly transferring the data voltage VDATA to the gate electrode of the driving transistor T1 based on a fact that when a voltage of the second electrode of the storage capacitor Cst suddenly rises, a voltage of the first electrode of the storage capacitor, which is another electrode, also rises. According to this method, even if leakage of at least one transistor (e.g., the second transistor T2 or the like) included in the pixel occurs, a voltage of the gate electrode of the driving transistor T1 does not leak directly so that the leakage effect is small. In such an embodiment, the data voltage VDATA passes through the storage capacitor Cst without passing through another electrode of the driving transistor T1 and is directly transferred to the gate electrode of the driving transistor T1 so that a voltage stored in the storage capacitor Cst is determined without being affected by a difference in the driving voltage ELVDD even if there is the difference in the driving voltage ELVDD according to a position of the pixel.

The hold capacitor Chold (hereinafter also referred to as a second capacitor) includes a first electrode (hereinafter also referred to as a first hold electrode) to which the driving voltage ELVDD is applied, and the second electrode (hereinafter also referred to as a second hold electrode) connected to the second electrode of the storage capacitor Cst, the second electrode of the second transistor T2, and the second electrode of the fifth transistor T5 that are the data node D_node, and serves to keep a voltage of the second electrode of the storage capacitor Cst that is a voltage of the data node D_node constant. That is, by the hold capacitor Chold, the voltage of the second electrode of the storage capacitor Cst that is the data node D_node does not fluctuate and has a constant voltage even when a peripheral signal fluctuates.

The light emitting diode LED includes the anode connected to the second electrode of the sixth transistor T6 and the second electrode of the seventh transistor T7, and a cathode connected to the second driving voltage line 179 to which the driving low voltage ELVSS is applied. The light emitting diode LED may be disposed between the pixel circuit portion and the driving low voltage ELVSS to emit light with luminance corresponding to a current supplied from the pixel circuit portion (precisely, the driving transistor T1). The light emitting diode LED may include a light emitting layer including at least one selected from an organic light emitting material and an inorganic light emitting material. A hole and an electron are respectively injected into the light emitting layer from the anode and the cathode, and light is emitted when an exciton that is a combination of the injected holes and electrons falls from an excited state to a ground state. The light emitting diode LED may emit light of one of primary colors or white light. Examples of the primary colors include three primary colors of red, green, and blue. Other examples of primary colors include yellow, cyan, magenta, and the like. In an embodiment, a color display characteristic may be improved by further including an additional color filter or a color conversion layer.

In the pixel according to an embodiment, as shown in FIG. 29, one transistor (the second transistor T2) and the storage capacitor Cst are disposed at a path (hereinafter also referred to as a data voltage transfer path) through which the data voltage VDATA is transferred to the driving gate electrode. That is, the storage capacitor Cst is disposed between the driving gate electrode of the driving transistor T1 and the second transistor T2. In such an embodiment, the data voltage VDATA is not directly transferred to the driving gate electrode of the driving transistor T1, but is transferred to the second storage electrode of the storage capacitor Cst. When a voltage of the second storage electrode is changed while the data voltage VDATA is applied to the second storage electrode, the data voltage VDATA is indirectly transferred while a voltage of the first storage electrode and a voltage of the driving gate electrode are changed. In addition, in the pixel according to an embodiment, as shown in FIG. 29, one transistor (the third transistor T3) is formed or provided in the compensation path that compensates for the threshold voltage of the driving transistor T1.

The pixel according to an embodiment, as show in FIG. 29, further includes the hold capacitor Chold in addition to the storage capacitor Cst to keep the voltage of the data node D_node that is the data voltage VDATA input to the pixel more constant. Referring to FIGS. 30 to 42 described later, the driving gate electrode of the driving transistor T1, the storage capacitor Cst, and the hold capacitor Chold may be formed while overlapping on a plane.

In the above description, the circuit structure of the pixel of FIG. 29 has been described.

FIG. 29 illustrates an embodiment of the pixel where the driving voltage ELVDD instead of the reference voltage VREF may be applied to the first electrode of the fifth transistor T5. Hereinafter, an embodiment in which the first driving voltage line 172 to which the driving voltage ELVDD is applied instead of the reference voltage line 174 that transfers the reference voltage VREF is connected to the first electrode of the fifth transistor T5 will be mainly described. The pixel may not include the reference voltage line 174 so that the pixel may be formed at a narrower area. Thus, a high-resolution light emitting display device may be provided. Hereinafter, a planar structure of the pixel circuit portion of the pixel according to an embodiment will be described in detail through FIGS. 30 to 41, and a cross-sectional structure of the pixel circuit portion will also be described through FIG. 42 together with FIGS. 30 to 41.

First, while referring to FIG. 42, the planar structure of the pixel circuit portion is mainly described through FIGS. 30 to 41, and in FIGS. 30 to 41 described later, the light emitting diode LED is not shown, and a structure of the pixel circuit portion disposed at a lower portion of the light emitting diode LED is mainly shown.

FIGS. 30 to 41 are views illustrating in detail a structure of each layer according to a manufacturing order of a lower panel layer of the light emitting display device of FIG. 29.

Figure 30:
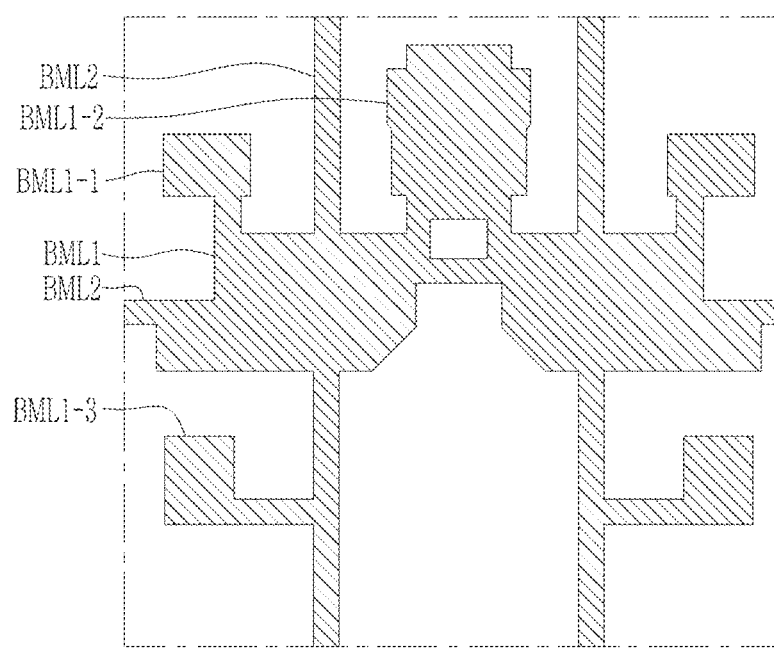
FIG. 30 to FIG. 41 are views illustrating, in detail, a structure of each layer according to a manufacturing order of a lower panel layer of the light emitting display device of FIG. 29.
Figure 30:
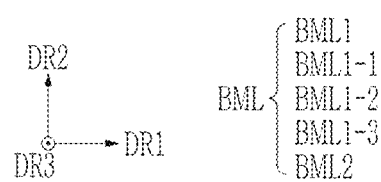
Figure 42:
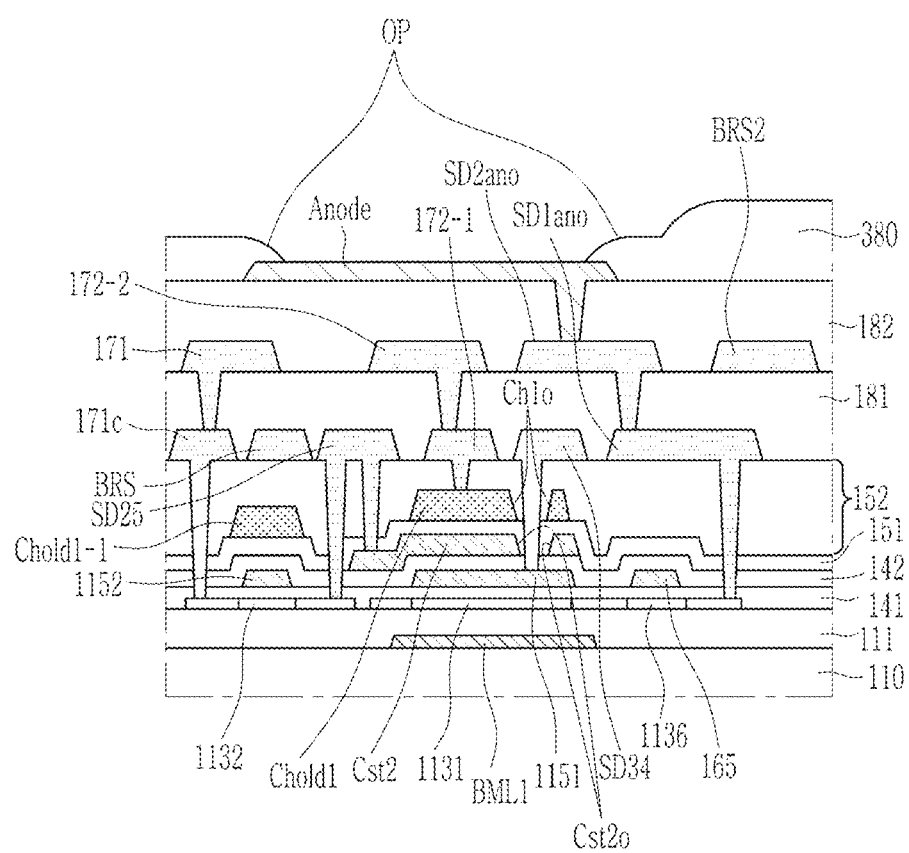
FIG. 42 is a cross-sectional view of a light emitting display device according to another alternative embodiment.

First, referring to FIG. 30, the overlapping electrode BML is disposed on a substrate 110 of FIG. 42.

The substrate 110 may include a rigid material such as glass or the like that does not bend, or may include a flexible material such as plastic or polyimide that may bend. The flexible substrate may have a structure in which a double-layered structure including polyimide and a barrier layer including or formed of an inorganic insulating material on the polyimide is formed twice.

The overlapping electrode BML includes a connection portion BML2 connecting a plurality of expansion portions BML1 to the plurality of expansion portions BML1 to each other. In addition, the overlapping electrode BML may further include protrusions BML1-1 and BML1-2 protruding from the plurality of expansion portions BML1. The expansion portions (hereinafter also referred to as a first overlapping electrode) BML1 of the overlapping electrode BML may be formed at a position overlapping the channel (see 1131 in FIG. 31) of the driving transistor T1 in a subsequent first semiconductor layer on a plane. A plurality of adjacent expansion portions BML1 are connected in the first direction DR1 and the second direction DR2 by the connection portion BML2. In addition, each of the plurality of expansion portions BML1 may have the protrusions BML1-1 and BML1-2 disposed at one corner, and may include the protruding portion BML1-1 protruding from one expansion portion BML1 and the protrusion BML1-2 connected by protruding from both adjacent extension portions BML1. The protrusion (hereinafter also referred to as a fourth overlapping electrode) BML1-1 may be formed at a position overlapping a channel (see 1135 in FIG. 31) of the fifth transistor T5 in a subsequent first semiconductor layer on a plane. In addition, the protrusion (hereinafter also referred to as a third overlapping electrode) BML1-2 may be formed at a position overlapping channels (see 1133 and 1134 in FIG. 31) of the third transistor T3 and/or the fourth transistor T4 in a subsequent first semiconductor layer on a plane. In addition, a protrusion BML1-3 of the overlapping electrode BML is formed at the connection portion BML2, and the protrusion (hereinafter also referred to as a second overlapping electrode) BML1-3 may be formed at a position overlapping a channel (see 1132 in FIG. 31) of the second transistor T2 in a subsequent first semiconductor layer on a plane.

The overlapping electrode BML is also referred to as a lower shielding layer, may include a metal such as copper (Cu), molybdenum (Mo), aluminum (Al), titanium (Ti), or the like, or a metal alloy, may additionally include an amorphous silicon, and may include or be defined by a single layer or multiple layers.

Referring to FIG. 42, the buffer layer 111 covering the substrate 110 and the overlapping electrode BML is disposed on the substrate 110 and the overlapping electrode BML. The buffer layer 111 serves to block penetration of an impurity element into the first semiconductor layer 130, and may be an inorganic insulating film including a silicon oxide ($SiO_x$), a silicon nitride ($SiN_x$), a silicon oxynitride ($SiO_xN_y$), or the like.

Figure 31:
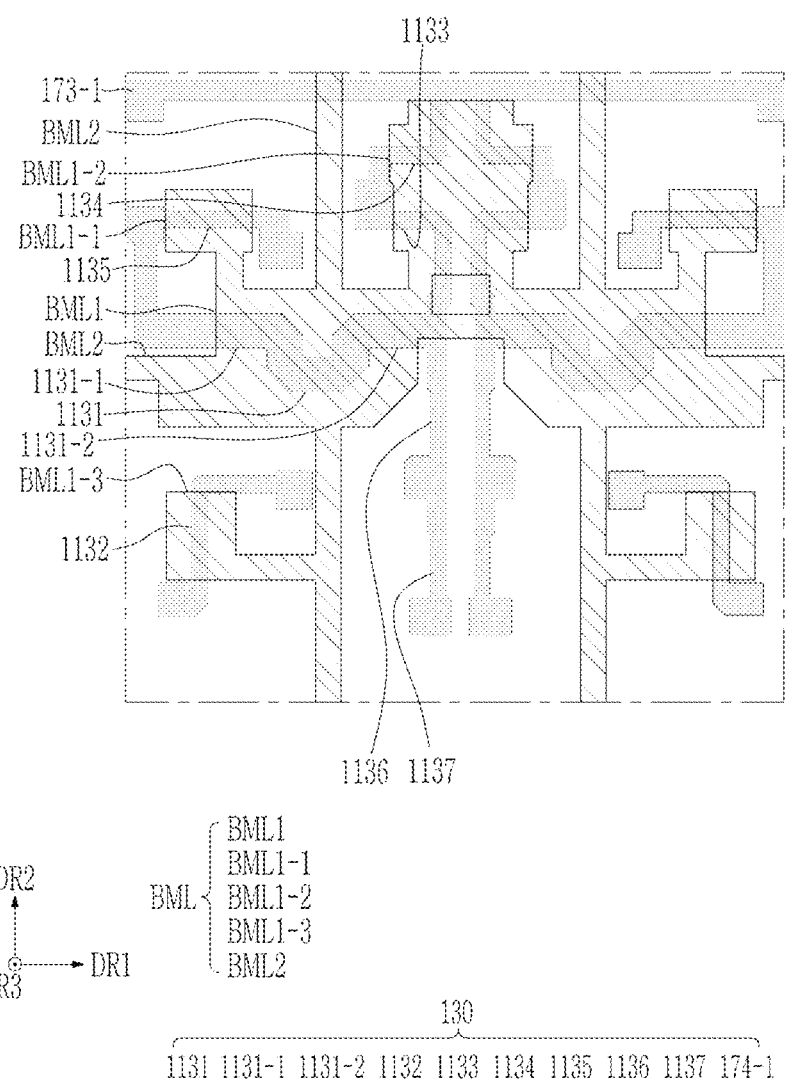

As illustrated in FIG. 31, the first semiconductor layer 130 and a first first initialization voltage line (hereinafter, will be referred to as (1-1)-th initialization voltage line) 173-1 including or formed of a silicon semiconductor (e.g., a polycrystalline semiconductor) are disposed above or on the buffer layer 111. The first semiconductor layer 130 includes a channel 1131, a first region 1131-1, and a second region 1131-2 of the driving transistor T1. In addition, the first semiconductor layer 130 includes not only the channel of the driving transistor T1 but also channels of the second transistor T2, the fifth transistor T5, the sixth transistor T6, and the seventh transistor T7, and includes portions 1132, 1133, 1134, 1135, 1136, and 1137 serving as the first and second electrodes (or regions) having a conductive layer characteristic by plasma treatment or doping at opposing sides of each channel.

The channel 1131 of the driving transistor T1 may have a shape bent in a U shape on a plane. However, a shape of the channel 1131 of the driving transistor T1 is not limited thereto, and may be variously changed. In an embodiment, for example, the channel 1131 of the driving transistor T1 may be bent in various other shapes such as an S shape and the like, or may be formed in a rod shape. The first region 1131-1 and the second region 1131-2 of the driving transistor T1 may be disposed at opposing sides of the channel 1131 of the driving transistor T1. The first region 1131-1 and the second region 1131-2 disposed at the first semiconductor layer serve as the first and second electrodes of the driving transistor T1.

The semiconductor 1135 serving as the channel and the second electrode of the fifth transistor T5 is disposed at a portion extending upward (in a second direction DR2) from the first region 1131-1 of the driving transistor T1 at the first semiconductor layer 130.

At the first semiconductor layer 130, a portion extending upward (in the second direction DR2) from the second region 1131-2 of the driving transistor T1 and a portion extending downward (in the direction opposite to the second direction DR2) from the second region 1131-2 of the driving transistor T1 are connected to each other.

At the first semiconductor layer 130, the semiconductor 1136 of the sixth transistor T6 is disposed at a portion extending downward (in the direction opposite to the second direction DR2) from the second region 1131-2 of the driving transistor T1, and the semiconductor 1137 of the seventh transistor T7 is disposed at the portion extending downward from the second region 1131-2 of the driving transistor T1.

At the first semiconductor layer 130, the semiconductor 1133 of the third transistor T3 is disposed at a portion extending upward (in the second direction DR2) from the second region 1131-2 of the driving transistor T1, and the semiconductor 1134 of the fourth transistor T4 is disposed at the portion extending upward from the second region 1131-2 of the driving transistor T1. The (1-1)-th initialization voltage line 173-1 extending in the first direction DR1 is formed past the semiconductor 1134 of the fourth transistor T4. Here, the (1-1)-th initialization voltage line 173-1 may be a portion of the first semiconductor layer 130 having the same or similar characteristic as that of a conductor by doping.

In an embodiment, the first semiconductor layer 130 further includes a separately separated semiconductor, and the separately separated semiconductor may include a channel, a first region, and a second region of the second transistor T2.

Referring to FIG. 42, a first gate insulating film 141 may be disposed above or on the first semiconductor layer 130 including the semiconductor 1131 of the driving transistor T1, the semiconductor 1132 that is a second semiconductor of the second transistor T2, the third semiconductor 1133 of the third transistor T3, and the like.

In an embodiment, the first gate insulating film 141 may be disposed on entire surfaces of the first semiconductor layer 130 and the buffer layer 111. In an alternative embodiment, the first gate insulating film 141 may not be disposed on the entire surfaces of the first semiconductor layer 130 and the buffer layer 111, but may be disposed only on a partial area of the entire surfaces of the first semiconductor layer 130 and the buffer layer 111. In such an embodiment, for example, the first gate insulating film 141 may overlap the channel of each transistor of the first semiconductor layer 130, but may have a structure that does not overlap the first region and the second region disposed at opposing sides of the channel.

The first gate insulating film 141 may be an inorganic insulating film including a silicon oxide ($SiO_x$), a silicon nitride ($SiN_x$), a silicon oxynitride ($SiO_xN_y$), or the like.

Figure 32:
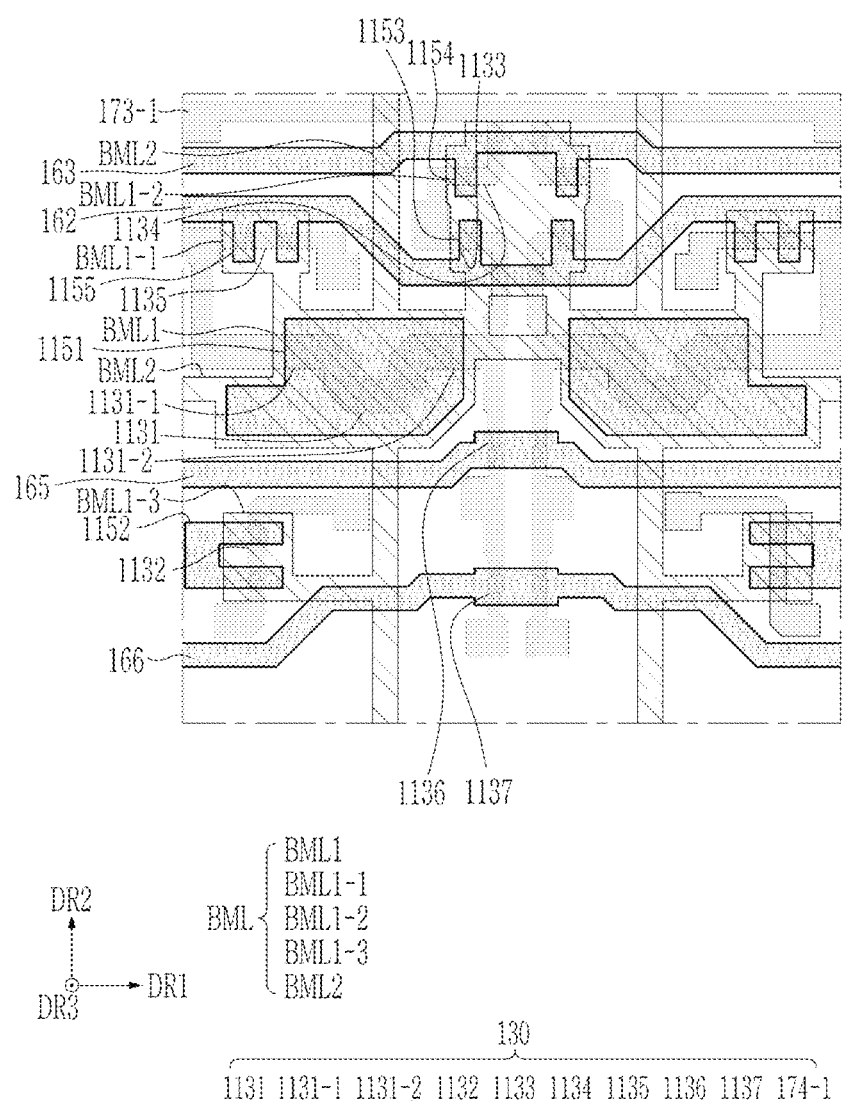

Referring to FIG. 32, a first gate conductive layer including the driving gate electrode 1151 of the driving transistor T1 may be disposed above or on the first gate insulating film 141. The first gate conductive layer may include not only the driving gate electrode 1151 of the driving transistor T1 but also the second scan line 162 to which the second scan signal GC is applied, the third scan line 163 to which the third scan signal GI is applied, the light emitting signal line 165 to which the light emitting signal EM2 is applied, the fourth scan line 166 to which the fourth scan signal EB is applied, and the gate electrode 1152 of the second transistor T2. Here, the second scan line 162 may include two protrusions, and the two protrusions of the second scan line 162 may constitute the gate electrode 1153 of the third transistor T3 and the gate electrode 1155 of the fifth transistor T5, respectively. In addition, the third scan line 163 may include a protrusion, and the protrusion of the third scan line 163 may constitute the gate electrode 1154 of the fourth transistor T4.

In addition, each of the driving gate electrode 1151 of the driving transistor T1 and the gate electrode 1152 of the second transistor T2 is formed in an island structure, and a portion of each of the driving gate electrode 1151 of the driving transistor T1 and the gate electrode 1152 of the second transistor T2 overlapping each of the semiconductors 1131 and 1132 of the first semiconductor layer 130 constitutes the gate electrode of each of the transistors T1 and T2.

In addition, a portion of each of the light emitting signal line 165 and the fourth scan line 166 extending in the first direction DR1 of the first gate conductive layer overlapping the semiconductors 1136 and 1137 the first semiconductor layer 130 constitutes the gate electrode of each of the transistors T6 and T7.

The first gate conductive layer may include a metal such as copper (Cu), molybdenum (Mo), aluminum (Al), titanium (Ti), or the like, or a metal alloy, and may include or be defined by a single layer or multiple layers.

After the first gate conductive layer is formed, a plasma treatment or doping process may be performed on the formed first gate conductive layer to make a portion of the first semiconductor layer 130 that is not covered with the first gate conductive layer conductive. That is, the first semiconductor layer 130 covered by the first gate conductive layer may not be conductive, and the portion of the first semiconductor layer 130 not covered by the first gate conductive layer may have the same characteristic as that of a conductive layer. As a result, the (1-1)-th initialization voltage line 173-1 disposed at the first semiconductor layer 130 may serve as a conductive line.

Referring to FIG. 42, a second gate insulating film 142 may be disposed on the first gate conductive layer and the first gate insulating film 141. The second gate insulating film 142 may be an inorganic insulating film including a silicon oxide ($SiO_x$), a silicon nitride ($SiN_x$), a silicon oxynitride ($SiO_xN_y$), or the like.

Figure 33:
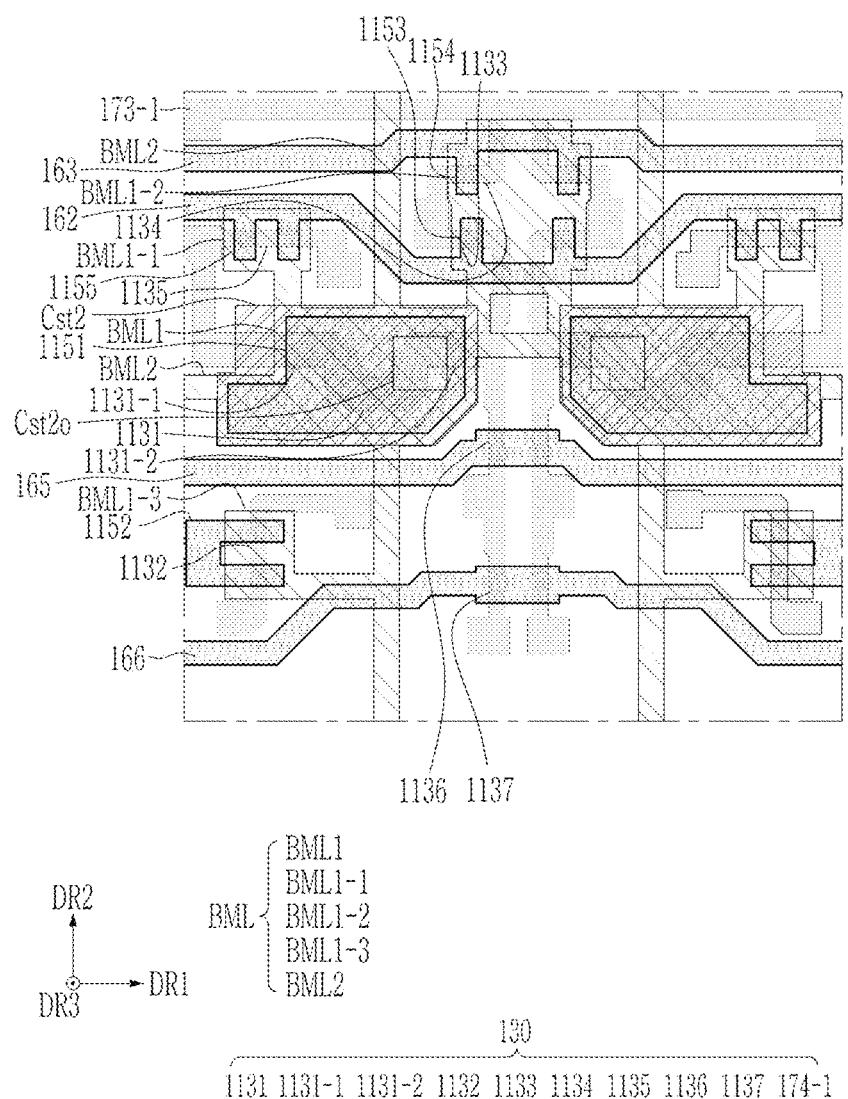

Referring to FIG. 33, a second gate conductive layer may be formed above or on the second gate insulating film 142. The second gate conductive layer includes a second storage electrode Cst2 of the storage capacitor Cst.

The second storage electrode Cst2 of the storage capacitor Cst has the same or similar shape as that of the driving gate electrode 1151 of the driving transistor T1. The second storage electrode Cst2 of the storage capacitor Cst includes an opening Cst2o overlapping a portion of the driving gate electrode 1151 of the driving transistor T1. The second gate insulating film 142 disposed between a cross-section of the second storage electrode Cst2 and a cross-section of the driving gate electrode 1151 of the driving transistor T1 is also formed to have an opening at a portion corresponding to the opening Cst2o of the second storage electrode Cst2 so that the driving gate electrode 1151 of the driving transistor T1 may be exposed upward to be connected to an upper conductive layer. Here, the opening formed at the second gate insulating film 142 may be the same as an opening OP1 shown in FIG. 35, and may be formed in a process of forming the opening OP1 shown in FIG. 35. The driving gate electrode 1151 of the driving transistor T1 overlapping the second storage electrode Cst2 and the second gate insulating film 142 disposed between the driving gate electrode 1151 and the second storage electrode Cst2 form the storage capacitor Cst, and in this case, the driving gate electrode 1151 is the gate electrode of the driving transistor T1, and is also the first storage electrode of the storage capacitor Cst.

The second gate conductive layer may include a metal such as copper (Cu), molybdenum (Mo), aluminum (Al), titanium (Ti), or the like, or a metal alloy, and may include or be defined by a single layer or multiple layers.

Referring to FIG. 42, a first interlayer insulating film 151 may be disposed above or on the second gate conductive layer. The first interlayer insulating film 151 may include an inorganic insulating film (or an inorganic insulating material) including a silicon oxide ($SiO_x$), a silicon nitride ($SiN_x$), or a silicon oxynitride ($SiO_xN_y$), or the like, and in an embodiment, the inorganic insulating film may be thickly formed. In an embodiment, the first interlayer insulating film 151 may include an organic material.

Figure 34:
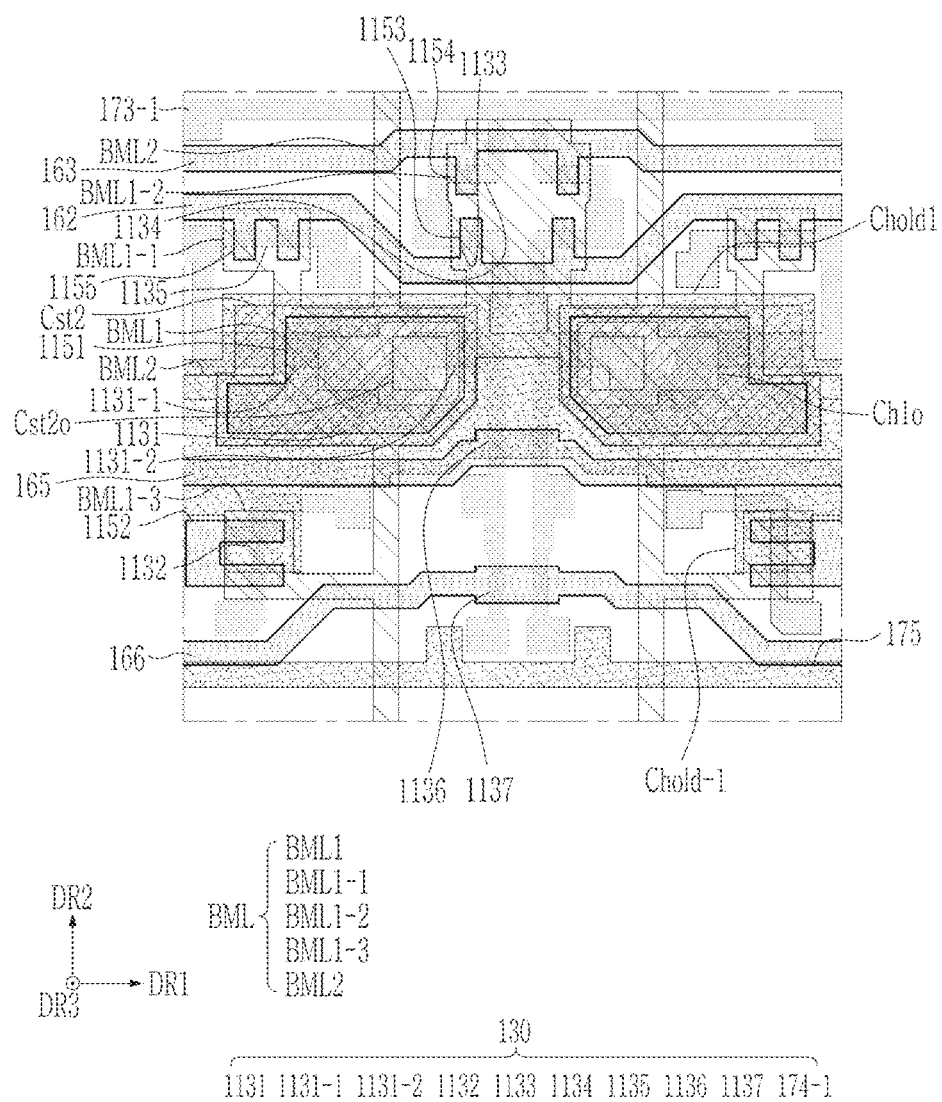

Referring to FIG. 34, an auxiliary conductive layer is formed above or on the first interlayer insulating film 151.

The auxiliary conductive layer includes a first hold electrode Chold1 of the hold capacitor Chold and the second initialization voltage line 175.

The first hold electrode Chold1 of the hold capacitor Chold overlaps the driving gate electrode 1151 of the driving transistor T1 and the second storage electrode Cst2 on a plane. In addition, the first hold electrode Chold1 may have the same or similar shape as that of the driving gate electrode 1151 of the driving transistor T1 and that of the second storage electrode Cst2, and extends in the first direction DR1. In addition, the hold capacitor Chold further includes a protrusion Chold1-1, and the protrusion may overlap at least a portion of the second transistor T2 on a plane.

In addition, the first hold electrode Chold1 is provided with one large opening Ch1$o$.

The opening Ch1$o$ may be largely divided into two portions, one portion of the opening Ch1$o$ is a portion that overlaps and exposes the second storage electrode Cst2, and the other portion of the opening Ch1$o$ is a portion that overlaps the opening Cst2$o$ of the second storage electrode Cst2 to expose a portion of the driving gate electrode 1151. A width of the second direction DR2 of a portion of the opening Ch1$o$ overlapping the opening Cst2$o$ of the second storage electrode Cst2 may be greater than a width of the second direction DR2 of a portion exposing the second storage electrode Cst2.

In such an embodiment, the portion of the opening Ch1$o$ overlaps a portion of the second storage electrode Cst2 to expose the second storage electrode Cst2. The first interlayer insulating film 151 disposed between a cross-section of the first hold electrode Chold1 and a cross-section of the second storage electrode Cst2 is also formed to have an opening at a portion corresponding to the first opening Ch1$o$1 of the first hold electrode Chold1 so that the second storage electrode Cst2 is exposed upward to be connected to an upper conductive layer. Here, the opening formed at the first interlayer insulating film 151 may be the same as an opening OP2 shown in FIG. 35, and may be formed in the process of forming the opening OP2 shown in FIG. 35.

Another portion of the opening Ch1$o$ overlaps a portion of the driving gate electrode 1151 of the driving transistor T1 and the opening Cst2$o$ of the second storage electrode Cst2. The first interlayer insulating film 151 disposed between a cross-section of the first hold electrode Chold1 and a cross-section of the second storage electrode Cst2 also has an opening at a portion corresponding to the second opening Ch1$o$2 of the first hold electrode Chold1 so that along with the opening Cst2$o$ of the second storage electrode Cst2 and the opening formed at the second gate insulating film 142, the driving gate electrode 1151 of the driving transistor T1 is exposed upward to be connected to an upper conductive layer. Here, the opening formed at the second gate insulating film 142 and the opening formed at the first interlayer insulating film 151 may be the same as the opening OP1 shown in FIG. 35, and may be formed in the process of forming the opening OP1 shown in FIG. 35.

The second storage electrode Cst2 overlapping the first hold electrode Chold1 and the first interlayer insulating film 151 disposed between the second storage electrode Cst2 and the first hold electrode Chold1 form the hold capacitor Chold, and in this case, the second storage electrode Cst2 is the second electrode of the storage capacitor Cst, and is also the second hold electrode of the hold capacitor Chold.

In an embodiment, the second initialization voltage line 175 extends in the first direction DR1, and transfers the second initialization voltage VAINT.

The auxiliary conductive layer may include a metal such as copper (Cu), molybdenum (Mo), aluminum (Al), titanium (Ti), or the like, or a metal alloy, and may include or be defined by a single layer or multiple layers.

Referring to FIG. 42, a second interlayer insulating film 152 may be disposed above or on the auxiliary conductive layer. The second interlayer insulating film 152 may include an inorganic insulating film (or an inorganic insulating material) including a silicon oxide ($SiO_x$), a silicon nitride ($SiN_x$), a silicon oxynitride ($SiO_xN_y$), or the like, and in an embodiment, the inorganic insulating film may be thickly formed. In an embodiment, the second interlayer insulating film 152 may include an organic material.

Figure 35:
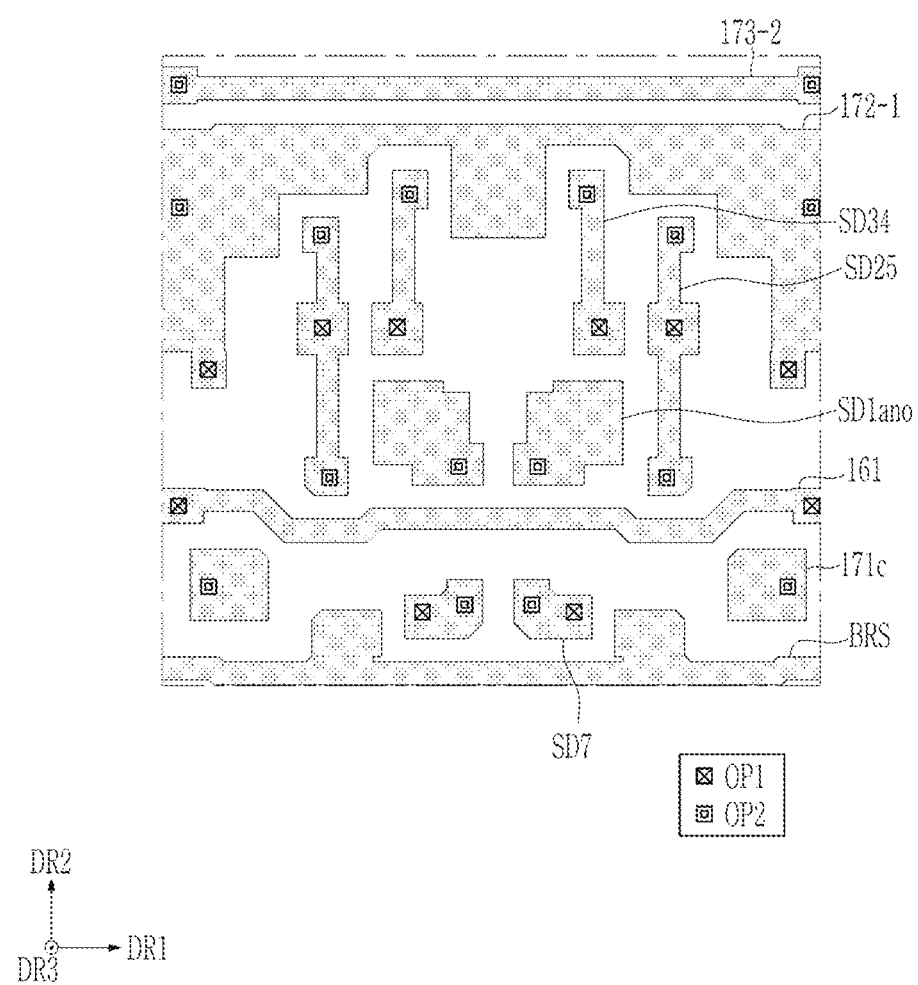
Figure 36:
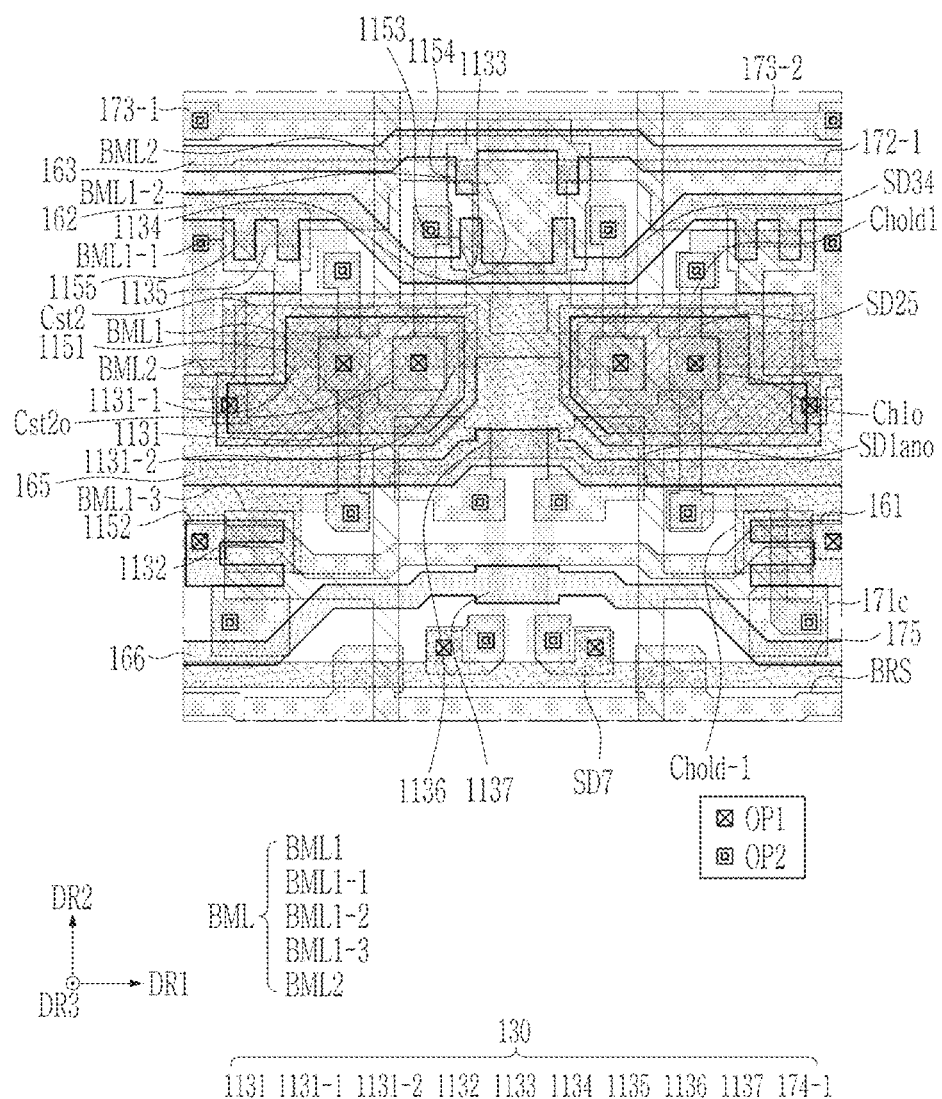

Referring to FIG. 35, after the second interlayer insulating film 152 is stacked, a process of forming a plurality of openings is performed. The openings OP1 and OP2 formed at the second interlayer insulating film 152 and an insulating film below the second interlayer insulating film 152 and a first data conductive layer stacked after the formed openings OP1 and OP2 are shown in FIG. 35. In FIG. 36, in addition to FIG. 34, the openings OP1 and OP2 and the first data conductive layer of FIG. 35 are shown together. That is, FIG. 35 is a plan view illustrating only the first data conductive layer and the openings OP1 and OP2 extracted from FIG. 36 because it may be difficult to easily recognize the first data conductive layer, and FIG. 36 is a plan view illustrating all layers below the first data conductive layer.

The plurality of OP1 and OP2 are formed at the second Interlayer insulating film 152 and the insulating films (i.e., the first gate insulating film 141, the second gate insulating film 142, and the first interlayer insulating film 151) disposed below the second interlayer insulating film 152. Here, the plurality of openings OP1 and OP2 may be formed using different masks.

The opening OP1 may be formed at the second interlayer insulating film 152, the first interlayer insulating film 151, the second gate insulating film 142, and the first gate insulating film 141 so that the first semiconductor layer 130 is exposed. According to an embodiment, the opening OP1 may also be formed at the buffer layer 111 to expose a portion of the overlapping electrode BML.

The opening OP2 may be formed at at least one insulating film among the second interlayer insulating film 152, the first interlayer insulating film 151, and the second gate insulating film 142 so that the first gate conductive layer, the second gate conductive layer, or the auxiliary conductive layer is exposed.

The first data conductive layer is formed above or on the second interlayer insulating film 152 at which the plurality of openings OP1 and OP2 are formed.

Referring to FIGS. 35 and 36, the first data conductive layer may include a voltage line to which a constant voltage is applied, a signal line to which a signal (e.g., the scan signal or the light emitting signal) that changes every frame may be input, and a connection member.

In an embodiment, as shown in FIGS. 35 and 36, the voltage line of the first data conductive layer to which the constant voltage is applied includes a first driving voltage line 172-1 and a second first initialization voltage line (hereinafter, will be referred to as (1-2)-th initialization voltage line) 173-2.

In an embodiment, as shown in FIGS. 35 and 36, the signal line of the first data conductive layer to which the scan signal may be input for each frame may include the first scan line 161 to which the first scan signal GW is applied.

In an embodiment, as shown in FIGS. 35 and 36, the connection member of the first data conductive layer of may include various connection members 171$c$, SD25, SD36, SD34, and SD1$ano$.

In addition, the first data conductive layer may transfer the data voltage VDATA like the data line 171, and may include a first auxiliary data line BRS that is one of wires serving to transfer the data voltage VDATA to the data line 171 adjacent to the first auxiliary data line BRS.

The first auxiliary data line BRS extends approximately in a horizontal direction (the first direction DR1), and has a portion having a partially expanded width. The first auxiliary data line BRS transfers the data voltage VDATA like the data line 171, and is electrically connected to another auxiliary data line (see BRS2 in FIG. 38) and the adjacent data line 171 through the portion having the partially expanded width to allow the data voltage VDATA to be transferred to a corresponding data line 171. The auxiliary data lines BRS and BRS2 may reduce a width of a fan-out portion (i.e., a portion where the data line 171 and a driving portion are connected) by half, and as a result, an area of the fan-out portion is also reduced by half. Thus, the auxiliary data lines BRS and BRS2 may allow a non-display area to be reduced. FIGS. 35 to 42 illustrate an embodiment where an opening is not formed at the auxiliary data lines BRS and BRS2, but alternatively, an opening may be formed only at a portion requiring connection of the auxiliary data lines BRS and BRS2 to electrically connect the auxiliary data lines BRS and BRS2.

First, the voltage line of the first data conductive layer will be described.

The first driving voltage line 172-1 extends in the first direction DR1, and transfers the driving voltage ELVDD in the first direction. The first driving voltage line 172-1 includes a protrusion protruding in the second direction DR2. Here, the protrusion is connected between the first region 1131-1 of the driving transistor T1 and the semiconductor 1135 of the fifth transistor T5 in the first semiconductor layer 130 through the opening OP1. In addition, the protrusion is connected to the first hold electrode Chold1 of the hold capacitor Chold of the auxiliary conductive layer through the opening OP2. As a result, the driving voltage ELVDD is transferred to the driving transistor T1, the fifth transistor T5, and the first hold electrode Chold1 of the hold capacitor Chold.

The (1-2)-th initialization voltage line 173-2 extends in the first direction DR1, is connected to the (1-1)-th initialization voltage line 173-1 through the opening OP1, and transfers the first initialization voltage VINT to the fourth transistor T4 through the (1-1)-th initialization voltage line 173-1.

Hereinafter, the signal line of the first data conductive layer will be described below.

The first scan line 161 to which the first scan signal GW is applied extends in the first direction DR1, and is connected to the gate electrode 1152 of the second transistor T2 that is a second gate electrode through the opening OP2 to transfer the first scan signal GW to the gate electrode of the second transistor T2.

Hereinafter, the connection member of the first data conductive layer is described.

The connection member 171*c* is connected to the semiconductor 1132 of the first semiconductor layer 130 through the opening OP1.

The connection member (hereinafter also referred to as a first connection member) SD25 is connected to the semiconductor 1132 of the second transistor T2 and the semiconductor 1135 of the fifth transistor T5 in the first semiconductor layer 130 through the opening OP1, and is connected to the second storage electrode Cst2 of the second gate conductive layer through the opening OP2. As a result, the second transistor T2 and the fifth transistor T5 are connected to the second storage electrode Cst2 of the storage capacitor Cst.

The connection member (hereinafter also referred to as a second connection member) SD34 connects the semiconductor 1133 of the third transistor T3 and the semiconductor 1134 of the fourth transistor of the first semiconductor layer 130 to the driving gate electrode 1151 of the driving transistor T1 of the first gate conductive layer, and in this case, the connection member SD34 is connected to the driving gate electrode 1151 through the opening Ch1*o* of the first hold electrode Chold1 and the opening Cst2*o* of the second storage electrode Cst2. As a result, the third transistor T3 and the fourth transistor T4 are connected to the gate electrode of the driving transistor T1.

The connection member SD1*ano* is connected to the semiconductor 1136 of the first semiconductor layer 130 through the opening OP1. An output current of the driving transistor T1 transferred through the sixth transistor T6 is applied to the connection member SD1*ano*.

The first data conductive layer may include a metal such as aluminum (Al), copper (Cu), molybdenum (Mo), titanium (Ti), or the like, or a metal alloy, and may include or be defined by a single layer or multiple layers.

Referring to FIG. 42, a first organic film 181 is disposed above or on the first data conductive layer. The first organic film 181 may be an organic insulating film including an organic material, and the organic material may include at least one material selected from polyimide, polyamide, acrylic resin, benzocyclobutene, and phenol resin.

Figure 37:
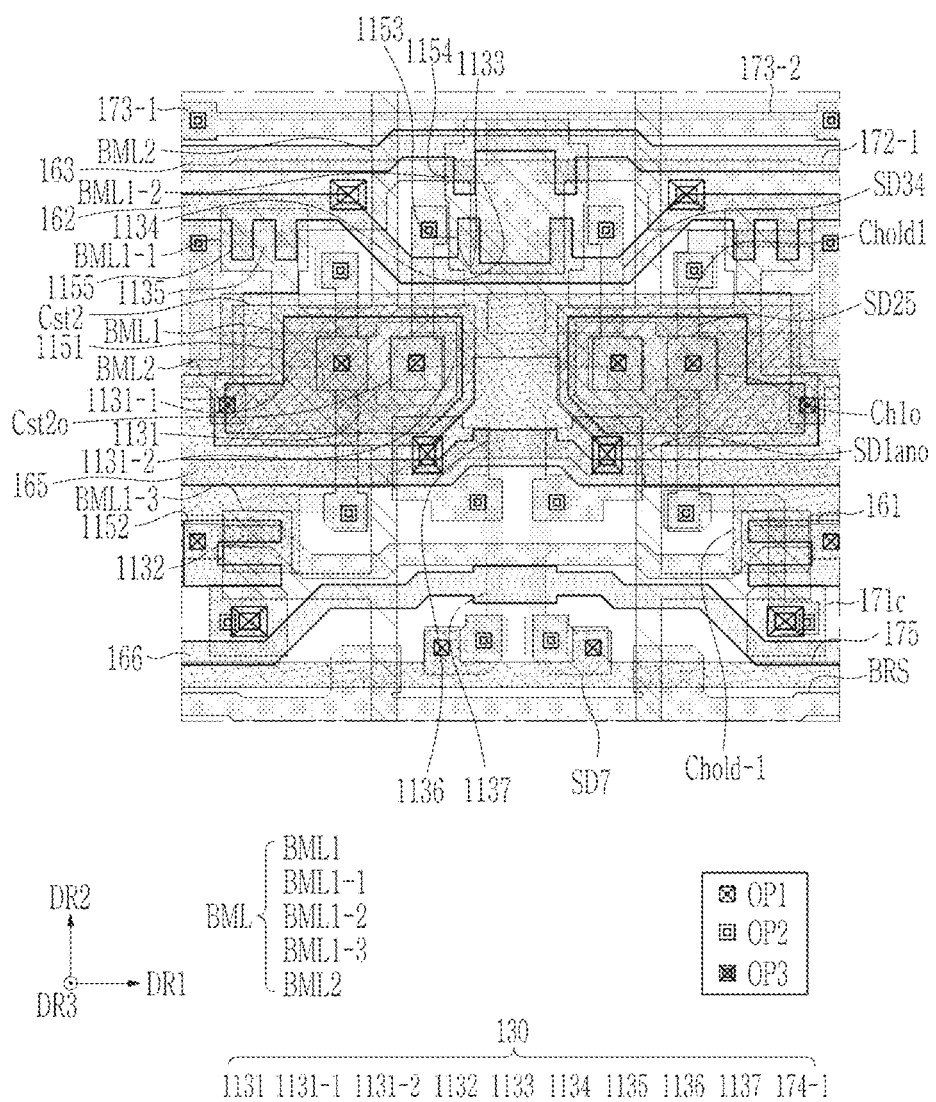

Referring to FIG. 37, an opening OP3 is defined or formed at the first organic film 181. The opening OP3 exposes the first data conductive layer, and allows the exposed first data conductive layer to be connected to a second data conductive layer.

Figure 38:
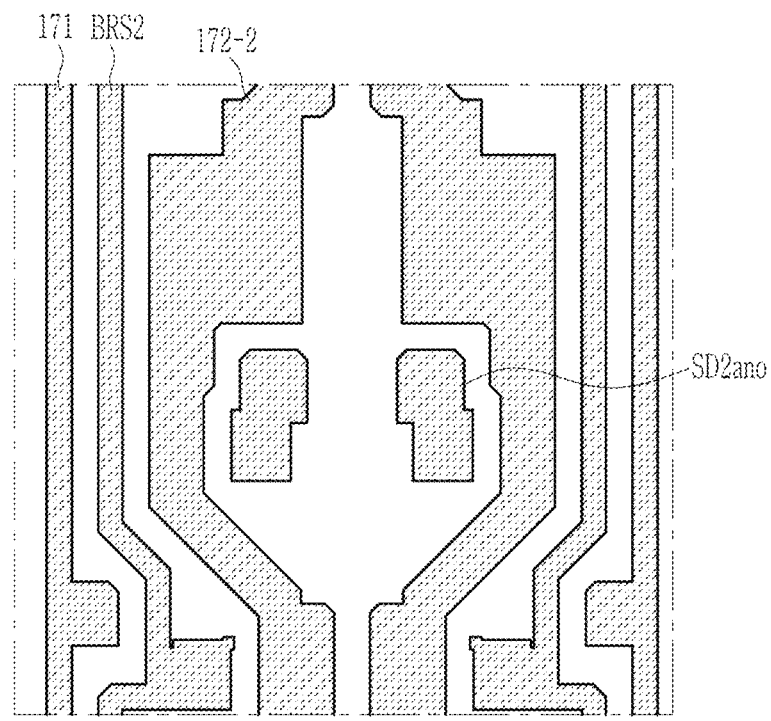
Figure 39:
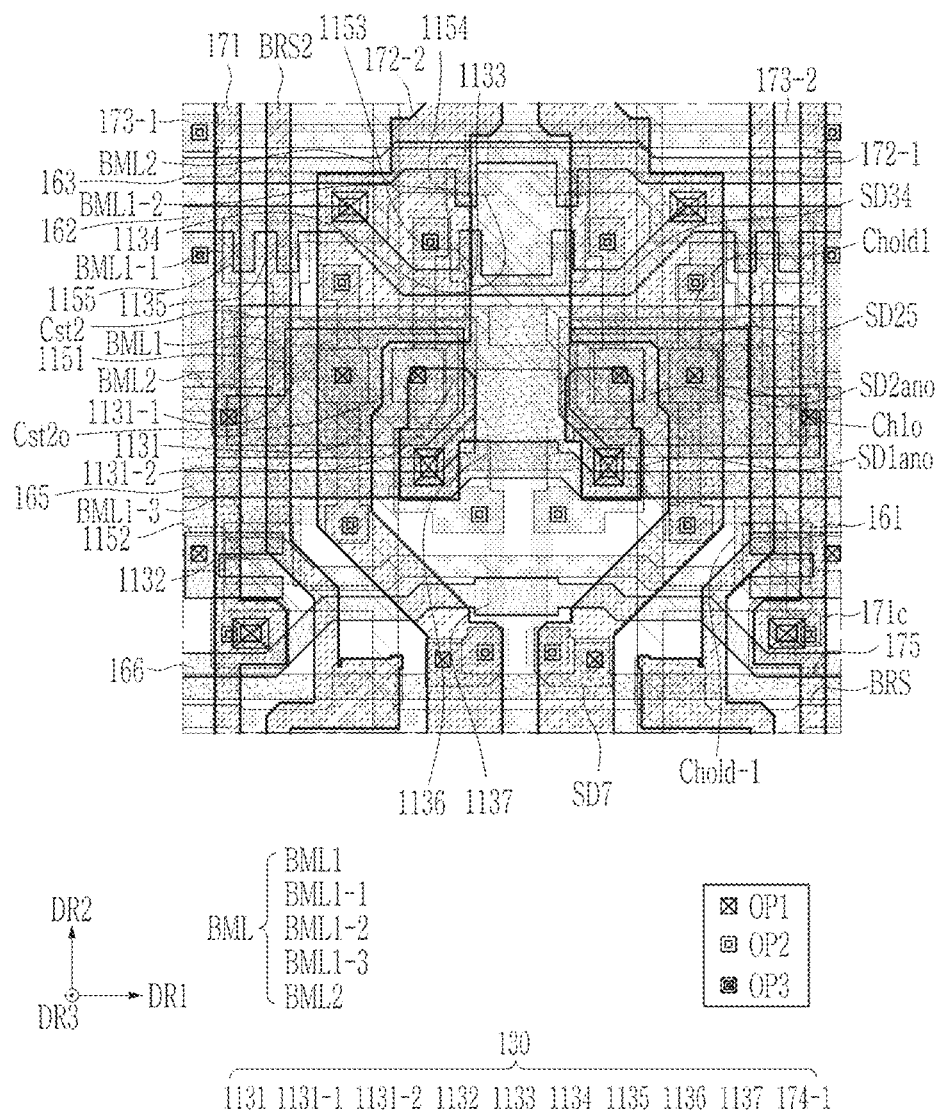

Referring to FIGS. 38 and 39, the second data conductive layer is disposed above or on the first organic film 181.

In FIG. 38, only the second data conductive layer stacked above or on the first organic film 181 is illustrated, and FIG. 38 shows only the second data conductive layer because it may be difficult to easily recognize the second data conductive layer in FIG. 39. FIG. 39 shows all layers below the second data conductive layer.

The second data conductive layer may include the data line 171 to which the data voltage VDATA is applied, an additional driving voltage line 172-2 to which the driving voltage ELVDD is transferred, a second auxiliary data line BRS2, and an anode connection member SD2*ano*.

Since the data line 171 extends in the second direction DR2, and is connected to the connection member 171*c* through the opening OP3 and the connection member 171*c* is connected to the semiconductor 1132 of the first semiconductor layer 130 through the opening OP1, the data voltage VDATA is transferred to a first electrode of the second transistor T2 through the connection member 171*c*.

Since the additional driving voltage line 172-2 extends in the second direction DR2, and is connected to the first driving voltage line 172-1 through the opening OP3, the driving voltage ELVDD is also transferred in the first direction DR1 through the first driving voltage line 172-1 while the driving voltage ELVDD is transferred in the second direction DR2 through the additional driving voltage line 172-2. Due to the driving voltage line 172 having such a mesh structure, the driving voltage ELVDD may have a constant voltage value throughout the light emitting display device. In addition, the driving voltage ELVDD is transferred to the driving transistor T1, the fifth transistor T5, and the first hold electrode Chold1 of the hold capacitor Chold through the openings OP1 and OP2.

The second auxiliary data line BRS2 extends approximately in a vertical direction (the second direction DR2), and extends in a direction parallel to the data line 171, and is connected to the first auxiliary data line BRS disposed at the first data conductive layer to serve to transfer the data voltage VDATA to the data line 171 adjacent to the second auxiliary data line BRS2. The first auxiliary data line BRS may include an extension direction crossing extension directions of the data line 171 and the second auxiliary data line BRS2 so that a data voltage applied through the second auxiliary data line BRS2 is applied to the adjacent data line 171. The width and area of the fan-out portion may be reduced by the auxiliary data lines BRS and BRS2, and thus, the non-display area may be reduced. The two auxiliary data lines BRS and BRS2 may be connected to each other through an opening disposed at the first organic film 181, and may be connected to the data line 171 requiring connection to transfer the data voltage VDATA.

The anode connection member SD2*ano* is connected to the connection member SD1*ano* through the opening OP3, and is connected to the semiconductor 1136 of the first semiconductor layer 130 through the opening OP1. As a result, an output current of the driving transistor T1 transferred through the sixth transistor T6 is transferred to the anode of the light emitting diode LED through the connection member SD1*ano* and the anode connection member SD2*ano*.

The second data conductive layer may include a metal such as aluminum (Al), copper (Cu), molybdenum (Mo), titanium (Ti), or the like, or a metal alloy, and may include or be defined by a single layer or multiple layers.

Referring to FIG. 42, a second organic film 182 is disposed above or on the second data conductive layer. The second organic film 182 may be an organic insulating film including an organic material, and the organic material may include at least one material selected from polyimide, polyamide, acrylic resin, benzocyclobutene, and phenol resin.

Figure 40:
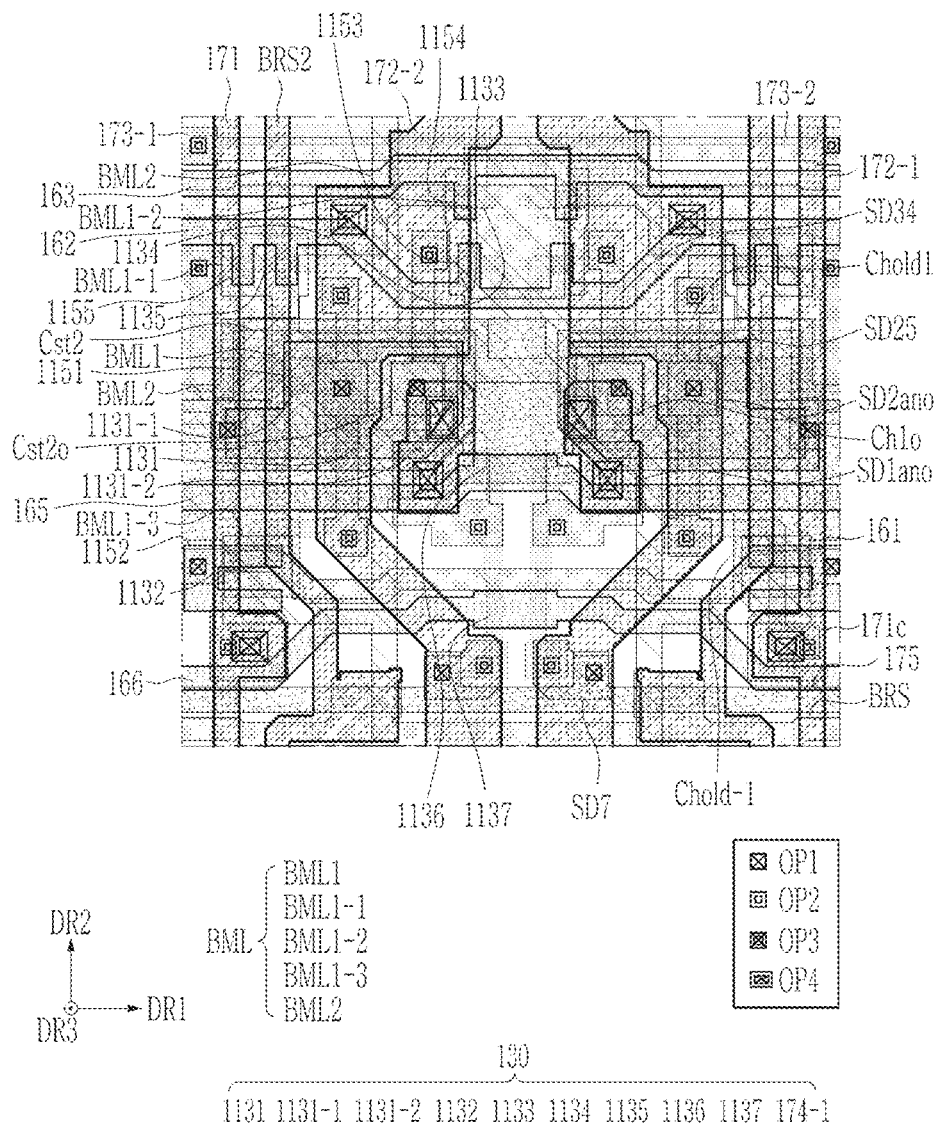

Referring to FIG. 40, an opening OP4 is formed at the second organic film 182 to expose the anode connection member SD2*ano*. As a result, the anode may be connected to the anode connection member SD2*ano*.

Figure 41:
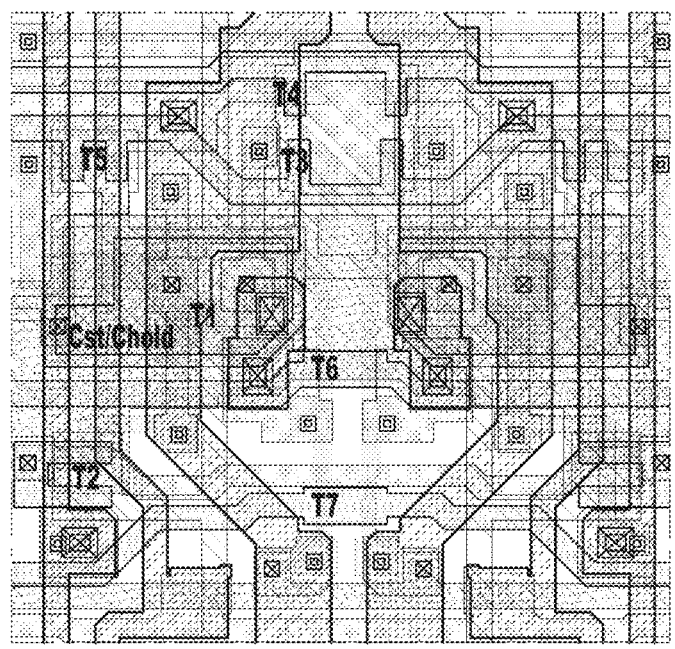
Figure 41:
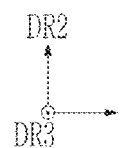

In FIG. 41, to more clearly identify a portion where each element (e.g., the transistor or the capacitor) is disposed in the pixel, each element is shown in a bold letter.

A detailed stacked structure of an upper portion of the second organic film 182 will be described in detail with reference to FIG. 42.

FIG. 42 is a cross-sectional view of the light emitting display device according to another alternative embodiment.

Referring to FIG. 42, the overlapping electrode BML is disposed on the substrate 110.

The substrate 110 may include a rigid material such as glass or the like that does not bend, or may include a flexible material such as plastic or polyimide that may bend. The flexible substrate may have a structure in which a double-layered structure including polyimide and a barrier layer including or formed of an inorganic insulating material on the polyimide is formed twice.

The overlapping electrode BML may be formed at a position overlapping the channel of the driving transistor T1 of a subsequent first semiconductor layer 130 on a plane, and is also referred to as the lower shielding layer. The overlapping electrode BML may also overlap another portion of the first semiconductor layer 130. The overlapping electrode BML may include a metal such as copper (Cu), molybdenum (Mo), aluminum (Al), titanium (Ti), or the like, or a metal alloy.

The buffer layer 111 covering the substrate 110 and the overlapping electrode BML is disposed on the substrate 110 and the overlapping electrode BML. The buffer layer 111 serves to block penetration of an impurity element into the first semiconductor layer 130, and may be an inorganic insulating film including a silicon oxide ($SiO_x$), a silicon nitride ($SiN_x$), a silicon oxynitride ($SiO_xN_y$), or the like.

The first semiconductor layer 130 including or formed of a silicon semiconductor (e.g., a polycrystalline semiconductor) is disposed on the buffer layer 111. The first semiconductor layer 130 includes the semiconductor 1131 that is a first semiconductor including a channel of a polycrystalline transistor LTPS TFT including the driving transistor T1 and a first region and a second region disposed at both sides of the channel. In addition, in FIG. 42, the second semiconductor 1132 of the second transistor T2 and the semiconductor 1136 that is a sixth semiconductor of the sixth transistor T6 are shown as well as the semiconductor of the driving transistor T1. In addition, the polycrystalline transistor LTPS TFT may include regions having a conductive layer characteristic by plasma treatment or doping at both sides of each channel that serve as the first and second electrodes of the transistor.

The first gate insulating film 141 may be disposed on the first semiconductor layer 130. The first gate insulating film 141 may be an inorganic insulating film including a silicon oxide ($SiO_x$), a silicon nitride ($SiN_x$), a silicon oxynitride ($SiO_xN_y$), or the like.

In an embodiment, the first gate conductive layer including a gate electrode of the polycrystalline transistor LTPS TFT may be disposed above or on the first gate insulating film 141. The first gate conductive layer may include the driving gate electrode 1151 of the driving transistor T1, a second gate electrode 1152 of the second transistor T2, and a sixth gate electrode 1156 of the sixth transistor T6. Here, the driving gate electrode 1151 may also serve as the first storage electrode of the storage capacitor Cst. The first gate conductive layer may include a metal such as copper (Cu), molybdenum (Mo), aluminum (Al), titanium (Ti), or the like, or a metal alloy, and may include or be defined by a single layer or multiple layers.

After the first gate conductive layer is formed, the plasma treatment or doping process may be performed on the formed first gate conductive layer to make an exposed region of the first semiconductor layer 130 conductive. That is, the first semiconductor layer 130 covered by the first gate conductive layer may not be conductive, and the portion of the first semiconductor layer 130 not covered by the first gate conductive layer may have the same characteristic as that of the conductive layer.

The second gate insulating film 142 may be disposed on the first gate conductive layer and the first gate insulating film 141. The second gate insulating film 142 may be an inorganic insulating film including a silicon oxide ($SiO_x$), a silicon nitride ($SiN_x$), a silicon oxynitride ($SiO_xN_y$), or the like.

In an embodiment, the second gate conductive layer including the second storage electrode Cst2 of the storage capacitor Cst may be disposed on the second gate insulating film 142. The second storage electrode Cst2 of the storage capacitor Cst overlaps the driving gate electrode 1151 of the driving transistor T1 to constitute the storage capacitor Cst. The second storage electrode Cst2 has the opening Cst2*o*, and may expose the driving gate electrode 1151 below the second storage electrode Cst2 using the opening Cst2*o*. In addition, the second storage electrode Cst2 may also serve as the second hold electrode of the hold capacitor Chold. The second gate conductive layer may include a metal such as copper (Cu), molybdenum (Mo), aluminum (Al), titanium (Ti), or the like, or a metal alloy, and may include or be defined by a single layer or multiple layers.

The first interlayer insulating film 151 may be disposed above or on the second gate conductive layer. The first interlayer insulating film 151 may include an inorganic insulating film (or an inorganic insulating material) including a silicon oxide ($SiO_x$), a silicon nitride ($SiN_x$), a silicon oxynitride ($SiO_xN_y$), or the like, and in an embodiment, the inorganic insulating film may be thickly formed.

In an embodiment, the auxiliary conductive layer including the first hold electrode Chold1 of the hold capacitor Chold is disposed on the first interlayer insulating film 151. The first hold electrode Chold1 of the hold capacitor Chold overlaps the second storage electrode Cst2 to form the hold capacitor Chold. The first hold electrode Chold1 further includes the opening Ch1o, and may expose the driving gate electrode 1151 through the opening Ch10 of the first hold electrode Chold1 and the opening Cst2o of the second storage electrode Cst2.

In addition, the first hold electrode Chold1 further includes the protrusion Chold1-1, and the protrusion Chold1-1 may overlap the second gate electrode 1152 of the second transistor T2. The auxiliary conductive layer may include a metal such as copper (Cu), molybdenum (Mo), aluminum (Al), titanium (Ti), or the like, or a metal alloy, and may include or be defined by a single layer or multiple layers.

The second interlayer insulating film 152 may be disposed above or on the auxiliary conductive layer. The second interlayer insulating film 152 may include an inorganic insulating film (or an inorganic insulating material) including a silicon oxide ($SiO_x$), a silicon nitride ($SiN_x$), a silicon oxynitride ($SiO_xN_y$), or the like, and in an embodiment, the inorganic insulating film may be thickly formed.

The first data conductive layer including the plurality of connection members may be disposed above or on the second interlayer insulating film 152.

The connection members 171c, SD25, SD34, and SD1ano, the first driving voltage line 172-1, and the first auxiliary data line BRS among the plurality of connection members disposed at the first data conductive layer are illustrated in FIG. 42.

The connection member 171c is connected to one end of the second semiconductor 1132 of the second transistor T2, and the connection member SD25 is connected to the other end of the second semiconductor 1132 of the second transistor T2 and the second storage electrode Cst2. The first driving voltage line 172-1 is connected to the first hold electrode Chold1 of the hold capacitor Chold, and the connection member SD34 is connected to the driving gate electrode 1151 through the opening Ch10 of the first hold electrode Chold1 and the opening Cst2o of the second storage electrode Cst2.

The connection member SD1ano is connected to one end of the sixth semiconductor 1136 of the sixth transistor T6.

The first data conductive layer may include a metal such as aluminum (Al), copper (Cu), molybdenum (Mo), titanium (Ti), or the like, or a metal alloy, and may include or be defined by a single layer or multiple layers.

The first organic film 181 may be disposed above or on the first data conductive layer. The first organic film 181 may be an organic insulating film including an organic material, and the organic material may include at least one material selected from polyimide, polyamide, acrylic resin, benzocyclobutene, and phenol resin.

The second data conductive layer including the data line 171, the additional driving voltage line 172-2, the second auxiliary data line BRS2, and the anode connection member SD2ano may be disposed on the first organic layer 181.

The data line 171 is connected to one end of the second semiconductor 1132 of the second transistor T2 through the connection member 171c, and the additional driving voltage line 172-2 is connected to the first driving voltage line 172-1. In addition, the anode connection member SD2ano is connected to one end of the sixth semiconductor 1136 of the sixth transistor T6 through the connection member SD1ano.

The second auxiliary data line BRS2 may include a portion overlapping the first auxiliary data line BRS on a plane, and may be connected to the first auxiliary data line BRS through an opening disposed at the first organic film 181. The first auxiliary data line BRS may be electrically connected to the data line 171 adjacent to the first auxiliary data line BRS to transfer the data voltage VDATA.

The second data conductive layer may include a metal such as aluminum (Al), copper (Cu), molybdenum (Mo), titanium (Ti), or the like, or a metal alloy, and may include or be defined by a single layer or multiple layers.

The second organic film 182 is disposed above or on the second data conductive layer, and an opening is formed at the second organic film 182 to electrically connect the anode connection member SD2ano and the anode Anode. The second organic film 182 may include at least one material selected from polyimide, polyamide, acrylic resin, benzocyclobutene, and phenol resin.

The anode Anode constituting the light emitting diode is disposed on the second organic film 182. The anode Anode may be formed of a single layer including a transparent conductive oxide film or a metal material, or multiple layers including the same. The transparent conductive oxide film may include indium tin oxide (ITO), poly-ITO, indium zinc oxide (IZO), indium gallium zinc oxide (IGZO), indium tin zinc oxide (ITZO), or the like. The metal material may include silver (Ag), molybdenum (Mo), copper (Cu), gold (Au), aluminum (Al), or the like.

A pixel defining film 380 that covers at least a portion of the anode Anode while an opening OP exposing the anode Anode may be disposed on the anode Anode. The pixel defining film 380 may be a black pixel defining film including or formed of an organic material having a black color so that light applied from the outside is not reflected back to the outside, and may include or be formed of a transparent organic material in an embodiment. A spacer (not shown) may be disposed above or on the pixel defining film 380, and the spacer may also include or be formed of the same material as the pixel defining film 380.

Although not shown in FIG. 42, a light emitting layer and a cathode may be disposed above or on the anode Anode and the pixel defining film 380, and an encapsulation layer may be disposed on the cathode.

In addition, a sensing insulating layer and a plurality of sensing electrodes for touch sensing may be disposed above or on the encapsulation layer, and a light blocking member and a color filter layer may also be disposed above or on the encapsulation layer. In an embodiment, a color conversion layer may also be formed instead of the color filter layer. The color conversion layer may include a quantum dot.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A light emitting display device, comprising:
   a light emitting diode including an anode;
   a driving transistor including a driving gate electrode, a first electrode, and a second electrode;
   a storage capacitor including a first storage electrode and a second storage electrode, wherein the first storage electrode is connected to the driving gate electrode;
   a second transistor including a gate electrode, a first electrode connected to a data line, and a second electrode connected to the second storage electrode;
   a third transistor including a gate electrode, a first electrode connected to the second electrode of the driving transistor, and a second electrode connected to the driving gate electrode;
   a hold capacitor including a first hold electrode connected to a first driving voltage line and a second hold electrode connected to the second storage electrode; and
   a ninth transistor including a gate electrode, a first electrode connected to the first driving voltage line, and a second electrode connected to the first electrode of the driving transistor,
   wherein the second storage electrode and the second hold electrode are integrally formed as a single unitary and indivisible part,
   the driving gate electrode and the first storage electrode are integrally formed as a single unitary and indivisible part, and
   the driving gate electrode, the second storage electrode, and the first hold electrode overlap each other on a plane.

2. The light emitting display device of claim 1, wherein an opening overlapping the driving gate electrode on the plane is defined in the second storage electrode, and
   a first opening overlapping the second storage electrode on the plane and a second opening overlapping the opening of the second storage electrode on the plane are defined in the first hold electrode.

3. The light emitting display device of claim 2, further comprising:
   a fourth transistor including a gate electrode, a first electrode connected to a first initialization voltage line, and a second electrode connected to the driving gate electrode.

4. The light emitting display device of claim 3, further comprising:
   a fifth transistor including a gate electrode, a first electrode connected to a reference voltage line, and a second electrode connected to the second storage electrode.

5. The light emitting display device of claim 4, further comprising:
   a first connection member connected to the second storage electrode, the second electrode of the second transistor, and the second electrode of the fifth transistor through the first opening of the first hold electrode; and
   a second connection member connected to the driving gate electrode, the second electrode of the third transistor, and the second electrode of the fourth transistor through the second opening of the first hold electrode and the opening of the second storage electrode.

6. The light emitting display device of claim 4, further comprising:
   a tenth transistor including a gate electrode, a first electrode connected to the second electrode of the second transistor and the second electrode of the fifth transistor, and a second electrode connected to the second storage electrode; and
   an eleventh transistor including a gate electrode, a first electrode connected to the second electrode of the third transistor and the second electrode of the fourth transistor, and a second electrode connected to the driving gate electrode.

7. The light emitting display device of claim 6, wherein each of the driving transistor, the second transistor, the third transistor, the fourth transistor, the fifth transistor, and the ninth transistor is a p-type transistor, and
   each of the tenth transistor and the eleventh transistor is an n-type transistor.

8. The light emitting display device of claim 7, further comprising:
   an overlapping electrode overlapping the driving transistor on the plane;
   a first auxiliary electrode overlapping the tenth transistor on the plane; and
   a second auxiliary electrode overlapping the eleventh transistor on the plane.

9. The light emitting display device of claim 6, wherein the gate electrode of the tenth transistor and the gate electrode of the eleventh transistor are electrically connected to each other.

10. The light emitting display device of claim 4, further comprising:
    an eighth transistor including a gate electrode, a first electrode connected to a bias voltage line, and a second electrode connected to the first electrode of the driving transistor.

11. The light emitting display device of claim 4, further comprising:
    a sixth transistor including a gate electrode, a first electrode connected to the second electrode of the driving transistor, and a second electrode connected to the anode.

12. The light emitting display device of claim 4, further comprising:
    a seventh transistor including a gate electrode, a first electrode connected to the first initialization voltage line or a second initialization voltage line, and a second electrode connected to the anode.

13. A light emitting display device, comprising:
    a light emitting diode including an anode;
    a driving transistor including a driving gate electrode, a first electrode, and a second electrode;
    a storage capacitor including a first storage electrode and a second storage electrode, wherein the first storage electrode is connected to the driving gate electrode;
    a second transistor including a gate electrode, a first electrode connected to a data line, and a second electrode connected to the second storage electrode;
    a third transistor including a gate electrode, a first electrode connected to the second electrode of the driving transistor, and a second electrode connected to the driving gate electrode;
    a hold capacitor including a first hold electrode connected to a first driving voltage line and a second hold electrode connected to the second storage electrode; and a fifth transistor including a gate electrode, a first electrode connected to the first driving voltage line, and a second electrode connected to the second storage electrode, wherein the second storage electrode and the second hold electrode are integrally formed as a single unitary and indivisible part, the driving gate electrode and the first storage electrode are integrally formed as a single unitary and indivisible part, and the driving gate electrode, the second storage electrode, and the first hold electrode overlap each other on a plane.

14. The light emitting display device of claim 13, wherein an opening overlapping the driving gate electrode on the plane is defined the second storage electrode, an opening having a larger area than the opening of the second storage electrode is defined in the first hold electrode includes, and the opening of the first hold electrode includes a portion overlapping the second storage electrode and a portion overlapping the opening of the second storage electrode.

15. The light emitting display device of claim 14, further comprising:

a fourth transistor including a gate electrode, a first electrode connected to a first initialization voltage line, and a second electrode connected to the driving gate electrode.

16. The light emitting display device of claim 15, further comprising:

a first connection member connected to the second storage electrode, the second electrode of the second transistor, and the second electrode of the fifth transistor through the opening of the first hold electrode; and a second connection member connected to the driving gate electrode, the second electrode of the third transistor, and the second electrode of the fourth transistor through the opening of the first hold electrode and the opening of the second storage electrode.

17. The light emitting display device of claim 15, further comprising:

a sixth transistor including a gate electrode, a first electrode connected to the second electrode of the driving transistor, and a second electrode connected to the anode.

18. The light emitting display device of claim 15, further comprising:

a seventh transistor including a gate electrode, a first electrode connected to the first initialization voltage line or a second initialization voltage line, and a second electrode connected to the anode.

19. The light emitting display device of claim 15, further comprising:

a first overlapping electrode overlapping the driving transistor on the plane;

a second overlapping electrode overlapping the second transistor on the plane;

a third overlapping electrode overlapping the third transistor or the fourth transistor on the plane; and a fourth overlapping electrode overlapping the fifth transistor on the plane.

20. The light emitting display device of claim 19, wherein the first overlapping electrode, the second overlapping electrode, the third overlapping electrode, and the fourth overlapping electrode are connected to each other.

* * * * *